United States Patent
Berman et al.

(10) Patent No.: US 12,525,996 B2
(45) Date of Patent: Jan. 13, 2026

(54) TWO-DIMENSIONAL GENERALIZED CONCATENATED CODES WITH SUB-FIELDS

(71) Applicant: SAMSUNG ELECTRONICS CO., LTD., Suwon-si (KR)

(72) Inventors: Amit Berman, Binyamina (IL); Ariel Doubchak, Herzliya (IL); Tal Philosof, Kfar Saba (IL); Avner Dor, Giv'atayim (IL); Yaron Shany, Kfar Saba (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 18/757,065

(22) Filed: Jun. 27, 2024

(65) Prior Publication Data
US 2026/0005709 A1 Jan. 1, 2026

(51) Int. Cl.
*H03M 13/00* (2006.01)
*H03M 13/29* (2006.01)

(52) U.S. Cl.
CPC .............................. *H03M 13/2927* (2013.01)

(58) Field of Classification Search
CPC ..................... H03M 13/2927; H03M 13/3746
See application file for complete search history.

(56) References Cited

U.S. PATENT DOCUMENTS

| | | | | |
|---|---|---|---|---|
| 8,019,023 B2* | 9/2011 | Song | ................... | H04L 25/0204 375/340 |
| 8,667,378 B2* | 3/2014 | Zhang | ............... | H03M 13/2906 714/790 |
| 9,461,863 B2* | 10/2016 | Vojcic | ................... | H04L 1/0057 |
| 9,887,805 B2* | 2/2018 | Litsyn | ................... | H03M 13/13 |
| 10,230,403 B2* | 3/2019 | Freudenberger | .. | H03M 13/3944 |
| 10,484,020 B2* | 11/2019 | Bhatia | ............... | H03M 13/3977 |
| 10,498,366 B2* | 12/2019 | Lin | ................... | H03M 13/3707 |
| 10,547,332 B2* | 1/2020 | Litsyn | ............... | H03M 13/2948 |
| 10,707,899 B2* | 7/2020 | Bhatia | .................... | G11C 29/42 |
| 11,038,530 B2* | 6/2021 | Lin | ................... | H03M 13/1515 |
| 11,165,447 B2* | 11/2021 | Meller | ................. | H03M 13/13 |

* cited by examiner

*Primary Examiner* — Esaw T Abraham
(74) *Attorney, Agent, or Firm* — Sughrue Mion, PLLC

(57) ABSTRACT

Devices, systems, and methods for managing a storage device configured to store a plurality of codewords, including: obtaining a two-dimensional (2D) generalized concatenated code (GCC) codeword from the storage device; providing the codeword to a sequential decoder; based on detecting a first failure by the sequential decoder, updating the codeword and transposing the updated codeword to obtain a transposed codeword; providing the transposed codeword to the sequential decoder; and obtaining information bits corresponding to the codeword based on a result obtained by the sequential decoder.

20 Claims, 28 Drawing Sheets

FIG. 11B

Algorithm 1
Input:
Code parameters: $GCC\left(R, M, C, \{F_j\}_{j=1}^{M}, B\right)$
GCC noisy code word: $\{y_r\}_{r=1}^{R}$ where $y_r$ is a vector of LLRs of length $C$

Initiation:
$\{u_r\}_{r=1}^{R} = False$      # BCH code word decoder status initiated as not corrected
$\{v_j\}_{j=1}^{M} = False$      # RS code word decoder status initiated as not corrected
$\{s_{i,j}\}_{i=1..R, j=1..M} = E$      # transform space initiated as Erased

Algorithm:
for j = 0:M
    if $j \neq 0$ and $v_j = False$
        $[v_j, \{s_{r,j}\}_{r=1}^{R}, \{u_i\}_{r=1}^{R}] = Decoder_{RS}(\{s_{r,j}\}_{r=1}^{R}, \{u_i\}_{r=1}^{R}, F_j)$    # Decode RS code word
        if $v_j = False$
            return $u_{GCC} = False, \{x_r\}_{r=1}^{R}$
    if $j = M$ or $j = 0$ or $F_{j+1} \neq F_j$
        for r=1:R
            if $u_r = False$
                #Decoder BCH code word (with coset for j>0)
                $[u, x] = Decoder_{BCH}(y_r, \{s_{r,q}\}_{q=1}^{j})$
                if u = True # BCH code word decoded successfully
                    # update decoder state and output
                    $u_r = 1, x_r = x$
                    # update transform space with transform
                    $\{s_{r,q}\}_{q=1}^{M} = B \cdot x$ if all $\{u_r\}_{r=1}^{R} = True$
   return $u_{GCC} = True, \{x_r\}_{r=1}^{R}$
else
   return $u_{GCC} = False, \{x_r\}_{r=1}^{R}$

Output
Decoder status $u_{GCC}$
GCC code word $w = \{x_r\}_{r=1}^{R}$ (in case of successful decoding)

FIG. 13B

Algorithm 2

Input:
Code parameters: $GCC\left(R, M, C, \{F_j\}_{j=1}^M, B, GRS(\alpha, v)\right)$
GCC noisy code word: $\{y_r\}_{r=1}^R$ where $y_r$ is a vector of LLRs of length $n$
$\{s_{r,j}\}_{r=1..R, j=1..C}$  # Transform space
$\{x_r\}_{r=1}^R$ # current decoded words
$\{u_r\}_{r=1}^R$     # BCH code word decoder status
$\{v_j\}_{j=1}^M$ # RS code word decoder status Algorithm:
is_first_time = True
for j = 0:M
    if $j \neq 0$ and $v_j = False$
        $[v_j, \{s_{r,j}\}_{r=1}^R, \{u_r\}_{r=1}^R] = Decoder_{RS}(\{s_{r,j}\}_{r=1}^R, \{u_r\}_{r=1}^R, F_j)$ # Decode RS code word
        if $v_j = False$ and not(is_first_time)
            return $u_{GCC}$ = False
    if $j = M$ or $j = 0$ or $F_{j+1} \neq F_j$ or is_first_time
        for r=1:R
            if $u_r = False$
                is_first_time = False
                # Decoder BCH code word (with coset for t>0)
                $l_{r,n} = y_{r,n}$    $\forall n \in [C]$
                if $x_{r,n}$ is not NAN
                      $l_{r,n} = sign(c_{r,n}) \cdot MAX$ # Maximal Likelihood
                $[u, x, l] = Decoder_{BCH}(l_r, \{s_{r,q}\}_{q=1}^j)$
                if u = True # BCH code word decoded successfully
                    # update decoder state and output
                    $u_r = 1, x_r = x, l_r^{out} = l$
                    # update transform space with transform
                    $\{s_{r,q}\}_{q=1}^M = B \cdot x$
if all $\{u_r\}_{r=1}^R = True$
    return $u_{GCC}$ = True
else
    return $u_{GCC}$ = False Output
Decoder status $u_{GCC}$
$\{u_r\}_{r=1}^R$   , $\{v_j\}_{j=1}^M$, $\{x_r\}_{r=1}^R$, $\{l_r^{out}\}_{r=1}^R$, $\{s_{r,j}\}_{r=1..R, j=1..M}$

TWO-DIMENSIONAL GENERALIZED CONCATENATED CODES WITH SUB-FIELDS

BACKGROUND

1. Field

Apparatuses and methods consistent with embodiments relate to managing a storage device, more particularly error correction coding using two-dimensional generalized concatenated codes.

2. Description of Related Art

In general, a flash memory device may have a structure which includes blocks of word lines (WLs), where each WL includes bit lines (BLs). A memory cell may be formed at the intersection of a WL and a BL. To allow fast access, each WL may be broken up into random access units (RAUs). To allow high reliability access, each RAU may be protected with an Error Correction Code (ECC).

One family of ECCs which may be used in flash memory devices is known as generalized concatenated codes (GCCs). Some GCCs, for example GCCs which involve general concatenation of Bose-Chaudhuri-Hocquenghem (BCH) codes and Reed-Solomon (RS) codes, may be implemented using a relatively simple encoder scheme, and a decoder scheme including a sequential multi-stage decoder. However, there may not be a simple scheme for performing iterative decoding of these codes.

SUMMARY

In accordance with an aspect of the disclosure, a storage system includes a storage device configured to store a plurality of codewords; a sequential decoder; and at least one processor configured to: obtain a two-dimensional (2D) generalized concatenated code (GCC) codeword from the storage device, provide the codeword to the sequential decoder, based on detecting a first failure by the sequential decoder, update the codeword and transpose the updated codeword to obtain a transposed codeword, provide the transposed codeword to the sequential decoder, and obtain information bits corresponding to the codeword based on a result obtained by the sequential decoder.

In accordance with an aspect of the disclosure, a device for managing data stored in a storage device may include a memory interface configured to communicate with the storage device; and at least one processor configured to: obtain a codeword from among a plurality of codewords stored in the storage device, wherein the codeword includes a plurality of rows and a plurality of columns, generate a first transformed codeword by transforming each row of the plurality of rows, wherein the first transformed codeword includes a plurality of first transformed rows and a plurality of first transformed columns, generate a second transformed codeword by transforming each column of the plurality of columns, wherein the second transformed codeword includes a plurality of second transformed rows and a plurality of second transformed columns, and decode the codeword to obtain information bits corresponding to the codeword, by performing iterative decoding based on the first transformed codeword and the second transformed codeword, wherein after the codeword is decoded, a first plurality of syndromes calculated based on the plurality of first transformed columns is equal to a second plurality of syndromes calculated based on the plurality of second transformed rows.

In accordance with an aspect of the disclosure, a method of managing data stored in a storage device may include obtaining a two-dimensional (2D) generalized concatenated code (GCC) codeword from the storage device; providing the codeword to a sequential decoder; based on detecting a first failure by the sequential decoder, updating the code word and transposing the updated codeword to obtain a transposed codeword; providing the transposed codeword to the sequential decoder; and obtaining information bits corresponding to the codeword based on a result obtained by the sequential decoder.

In accordance with an aspect of the disclosure, a method of controlling a storage system may include obtaining a codeword from among a plurality of codewords stored in a storage device included in the storage system, wherein the codeword includes a plurality of rows and a plurality of columns; generating a first transformed codeword by transforming each row of the plurality of rows, wherein the first transformed codeword includes a plurality of first transformed rows and a plurality of first transformed columns; generating a second transformed codeword by transforming each column of the plurality of columns, wherein the second transformed codeword includes a plurality of second transformed rows and a plurality of second transformed columns; and decoding the codeword to obtain information bits corresponding to the codeword, by performing iterative decoding on the first transformed codeword and the second transformed codeword, wherein after the codeword is decoded, a first plurality of syndromes calculated based on the plurality of first transformed columns is equal to a second plurality of syndromes calculated based on the plurality of second transformed rows.

BRIEF DESCRIPTION OF DRAWINGS

The above and other aspects, features, and advantages of certain embodiments of the present disclosure will be more apparent from the following description taken in conjunction with the accompanying drawings, in which:

FIG. 11B illustrates an example of a sequential decoding algorithm which may be used to perform GCC decoding, according to embodiments;

FIG. 13B illustrates an example of a sequential decoding algorithm which may be used to perform GCC decoding in an iterative 2D-GCC decoder, according to embodiments;

DETAILED DESCRIPTION

Figure 1:
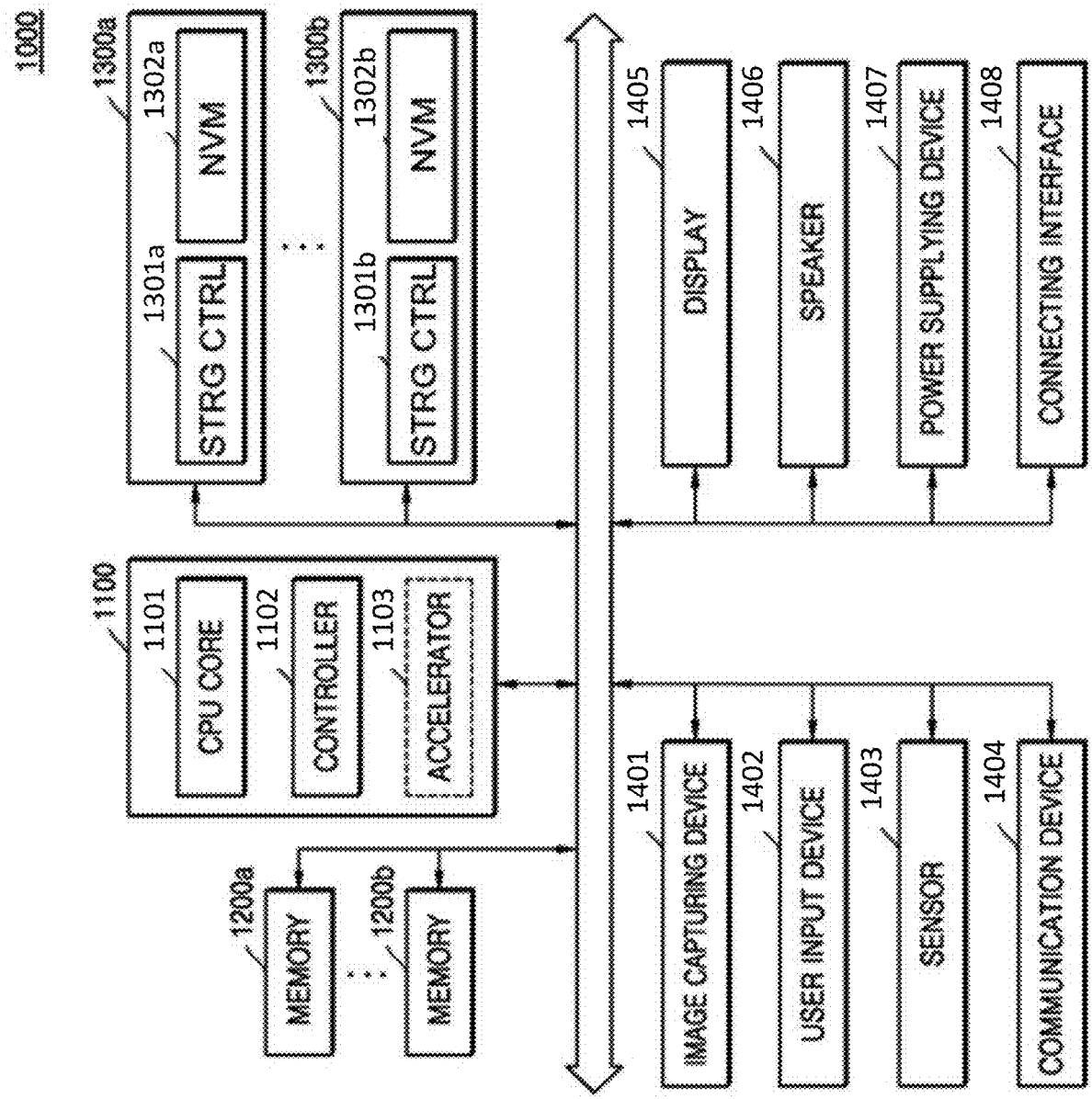
FIG. 1 is a block diagram of a computer system, according to embodiments.

In flash memory devices, data may be stored and read at a granularity of Random Access Unit (RAU). An error correction code (ECC) may be applied on the RAU data to provide fast read with high reliability.

One family of ECCs which may be used in flash memory devices is known as generalized concatenated codes (GCCs). An example of this family of codes involves general concatenation of Bose-Chaudhuri-Hocquenghem (BCH) codes and Reed-Solomon (RS) codes, and may be referred to as a GCC S-BCH code. This family of codes may allow low complexity decoding based on algebraic codes decoders, while achieving relatively good results, especially in channels with low quantization, such as HD (Hard Decision) channels, and for high rate codes which may be used in flash memory controllers.

The GCC S-BCH code may be implemented using a relatively simple encoder scheme, and a decoder scheme including a sequential multi-stage decoder. One desirable property in coding is the ability to use message passing algorithms and iterative decoding, but there currently exists no simple scheme for performing iterative decoding of GCC S-BCH codes. For example, some constructions of GCC codes including a generalized concatenation of RS codes with RS codes, for RS defined over the Galois Field GF($2^m$)), may have the transpose property which allows iterative message passing in the field. However, there is no such solution for a binary field, or for a combination of binary subfield GF(2) and an extension field GF($2^m$) as is the case for GCC S-BCH code.

Accordingly, embodiments may relate to a construction of a GCC code including a concatenation of BCH codes and specially-designed generalized RS(GRS) codes. This construction may be implemented using a simple encoder scheme, similar to the regular GCC scheme, and may allow the use of a GCC sequential decoder, as well as various versions of iterative decoders. As a result, embodiments may outperform the standard GCC S-BCH code and decoder performance, and may be suitable for use in flash memory controllers, as well as other ECC applications.

According to embodiments, a 2D-GCC S-BCH code may be represented as a binary matrix having a dimension RX C, as discussed in greater detail below. The binary matrix may represent a GCC with concatenation of BCH and GRS codes, and the transpose of the matrix may also represent a GCC code including a concatenation of BCH and GRS codes, according to the generalized transpose theorem discussed in greater detail below with reference to FIGS. 12A-12C. The selection of the parameters of GRS codes with dmin=F-1 may allow a 2D-GCC codeword to be decoded using a BCH decoder with error correction capability of t=F errors, while usually RS codes applied on sub-fields have correction capability of t= [F/2]. As an example, a 2D-GCC SBCH encoder according to embodiments may correspond to standard GCC encoding, and a 2D-GCC S-BCH decoder according to embodiments may be an improvement to a standard GCC sequential decoder. For example, a 2D-GCC decoder may use multi-stage iterative decoding applied with soft-in hard-out (SIHO) GCC decoders. As another example a 2D-GCC decoder according to embodiments may use turbo decoding applied with soft-in soft-out (SISO) GCC decoders.

FIG. 1 is a diagram of a system 1000 to which embodiments may be applied. The system 1000 of FIG. 1 may be, for example, a mobile system, such as a portable communication terminal (e.g., a mobile phone), a smartphone, a tablet personal computer (PC), a wearable device, a healthcare device, or an Internet of things (IoT) device. However, the system 1000 of FIG. 1 is not necessarily limited to the mobile system and may be a PC, a laptop computer, a server, a media player, or an automotive device (e.g., a navigation device).

Referring to FIG. 1, the system 1000 may include a main processor 1100, memories (e.g., 1200a and 1200b), and storage devices (e.g., 1300a and 1300b). In addition, the system 1000 may include at least one of an image capturing device 1401, a user input device 1402, a sensor 1403, a communication device 1404, a display 1405, a speaker 1406, a power supplying device 1407, and a connecting interface 1408.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1101 and further include a controller 1102 configured to control the memories 1200a and 1200b and/or the storage devices 1300a and 1300b. In some embodiments, the main processor 1100 may further include an accelerator 1103, which is a dedicated circuit for a high-speed data operation, such as an artificial intelligence (AI) data operation. The accelerator 1103 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200*b* may include non-volatile memory, such as a flash memory, phase-change RAM (PRAM) and/or resistive RAM (RRAM). The memories 1200*a* and 1200*b* may be implemented in the same package as the main processor 1100.

The storage devices 1300*a* and 1300*b* may serve as non-volatile storage devices configured to store data regardless of whether power is supplied thereto, and have larger storage capacity than the memories 1200*a* and 1200*b*. The storage devices 1300*a* and 1300*b* may respectively include storage controllers (STRG CTRL) 1301*a* and 1301*b* and Non-Volatile Memories (NVMs) 1302*a* and 1302*b* configured to store data via the control of the storage controllers 1301*a* and 1301*b*. Although the NVMs 1320*a* and 1320*b* may include flash memories having a two-dimensional (2D) structure or a three-dimensional (3D) V-NAND structure, embodiments are not limited thereto, and the NVMs 1320*a* and 1320*b* may include other types of NVMs, such as PRAM and/or RRAM.

The storage devices 1300*a* and 1300*b* may be physically separated from the main processor 1100 and included in the system 1000 or implemented in the same package as the main processor 1100. In addition, the storage devices 1300*a* and 1300*b* may have types of SSDs or memory cards, and may be removably combined with other components of the system 1000 through an interface, such as the connecting interface 1408 described below. The storage devices 1300*a* and 1300*b* may be devices to which a standard protocol, such as a universal flash storage (UFS), an embedded multi-media card (eMMC), or a non-volatile memory express (NVMe), is applied, without being limited thereto.

The image capturing device 1401 may capture still images or moving images. The image capturing device 1401 may include a camera, a camcorder, and/or a webcam.

The user input device 1402 may receive various types of data input by a user of the system 1000 and include a touch pad, a keypad, a keyboard, a mouse, and/or a microphone.

The sensor 1403 may detect various types of physical quantities, which may be obtained from the outside of the system 1000, and convert the detected physical quantities into electric signals. The sensor 1403 may include a temperature sensor, a pressure sensor, an illuminance sensor, a position sensor, an acceleration sensor, a biosensor, and/or a gyroscope sensor.

The communication device 1404 may transmit and receive signals between other devices outside the system 1000 according to various communication protocols. The communication device 1404 may include an antenna, a transceiver, and/or a modem.

The display 1405 and the speaker 1406 may serve as output devices configured to respectively output visual information and auditory information to the user of the system 1000.

The power supplying device 1407 may appropriately convert power supplied from a battery embedded in the system 1000 and/or an external power source, and supply the converted power to each of components of the system 1000.

The connecting interface 1408 may provide connection between the system 1000 and an external device, which is connected to the system 1000 and capable of transmitting and receiving data to and from the system 1000. The connecting interface 1408 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2A:
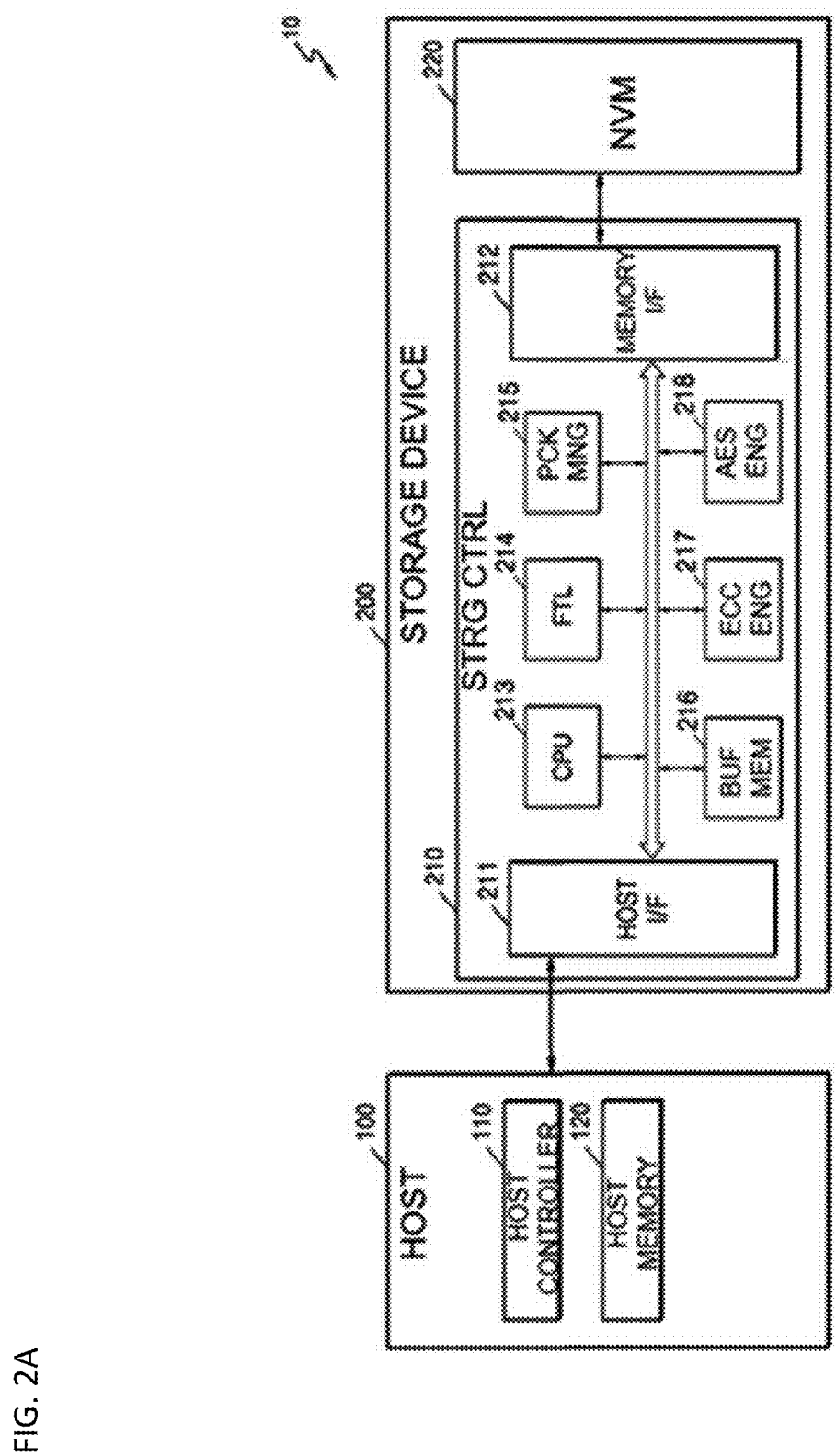
FIG. 2A is a block diagram of a host storage system, according to embodiments.

FIG. 2A is a block diagram of a host storage system 10 according to an example embodiment.

The host storage system 10 may include a host 100 and a storage device 200. Further, the storage device 200 may include a storage controller 210 and an NVM 220. According to an example embodiment, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controller 210 may further include a flash translation layer (FTL) 214, a packet manager 215, a buffer memory 216, an ECC engine 217, and an advanced encryption standard (AES) engine 218. The storage controller 210 may further include a working memory in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controller 210, the buffer memory 216 may be outside the storage controller 210.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controller 210 by using a symmetric-key algorithm.

Figure 2B:
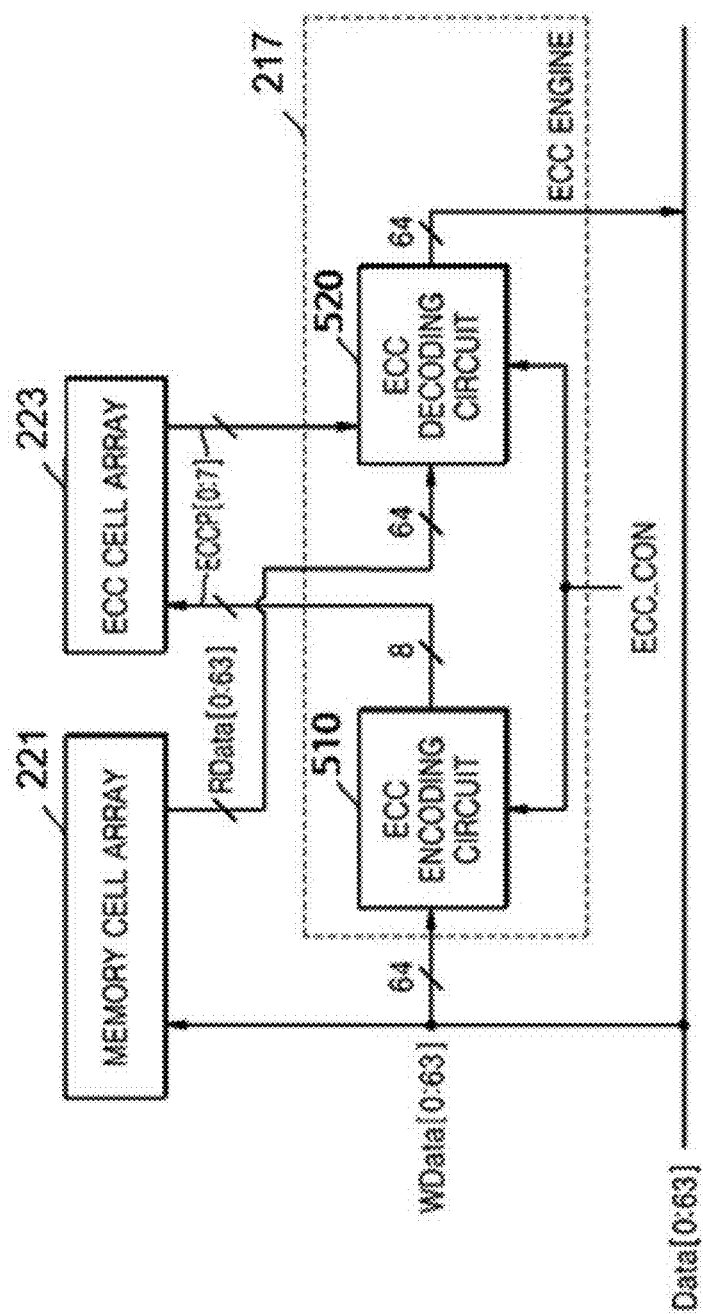
FIG. 2B is a block diagram of an ECC engine, according to embodiments.

FIG. 2B is a detailed diagram of the ECC engine 217 of FIG. 2A. Referring to FIG. 2B, the ECC engine 217 may include an ECC encoding circuit 510 and an ECC decoding circuit 520. In response to an ECC control signal ECC_CON, the ECC encoding circuit 510 may generate parity bits ECCP [0:7] for write data WData [0:63] to be written to memory cells of a memory cell array 221. The parity bits ECCP [0:7] may be stored in an ECC cell array 223. According to embodiments, in response to the ECC control signal ECC_CON, the ECC encoding circuit 510 may generate parity bits ECCP [0:7] for write data WData [0:63] to be written to memory cells including a defective cell of the memory cell array 221.

In response to the ECC control signal ECC_CON, the ECC decoding circuit 520 may correct error bit data by using read data RData [0:63] read from the memory cells of the memory cell array 221 and parity bits ECCP [0:7] read from the ECC cell array 223 and output error-corrected data Data [0:63]. According to embodiments, in response to the ECC control signal ECC_CON, the ECC decoding circuit 520 may correct error bit data by using read data RData [0:63] read from memory cells including a defective cell of the memory cell array 221 and parity bits ECCP [0:7] read from the ECC cell array 223, and output error-corrected data Data [0:63].

Figure 2C:
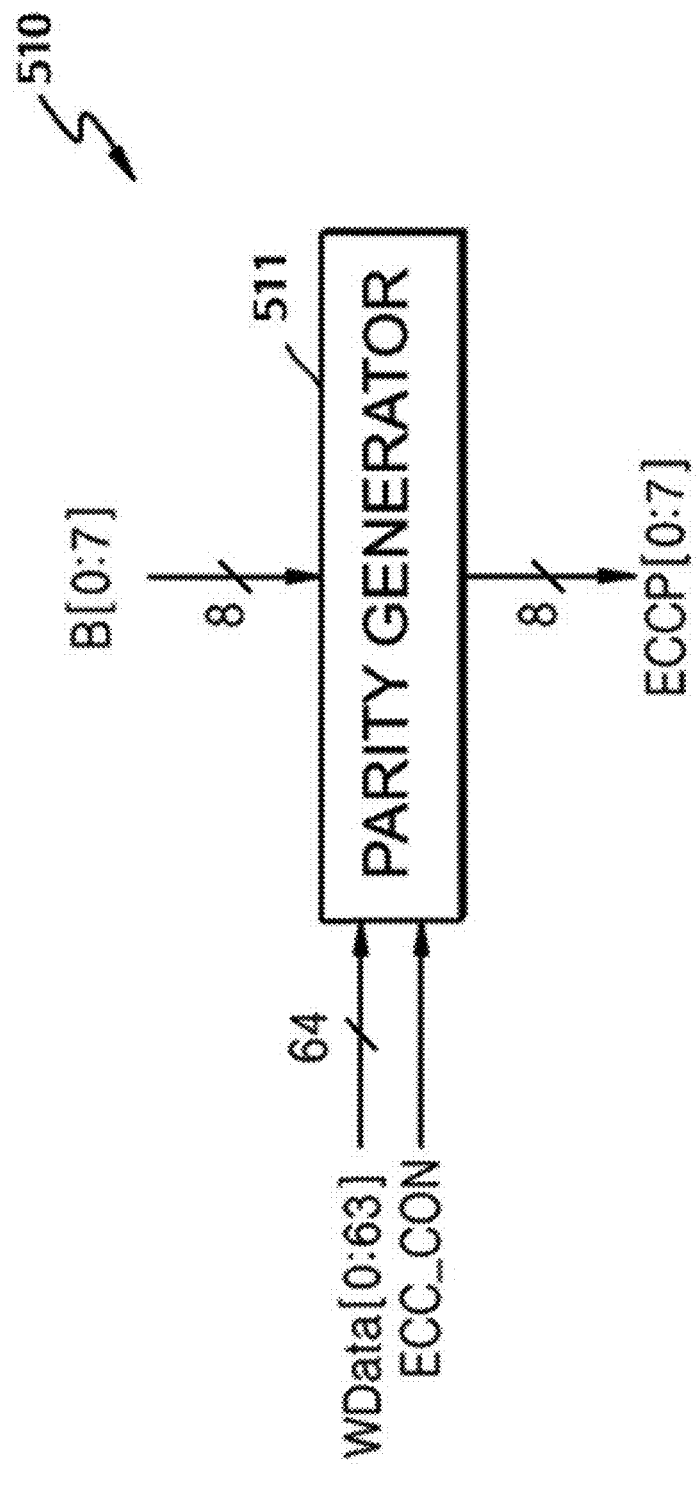
FIG. 2C is a block diagram of an ECC encoding circuit, according to embodiments.

FIG. 2C is a diagram of the ECC encoding circuit 510 of FIG. 2B.

Referring to FIG. 2C, the ECC encoding circuit 510 may include a parity generator 511, which receives 64-bit write data WData [0:63] and basis bits B [0:7] in response to an ECC control signal ECC_CON and generates parity bits ECCP [0:7] by using an XOR array operation. The basis bits B [0:7] may be bits for generating parity bits ECCP [0:7] for 64-bit write data WData [0:63], for example, b'00000000 bits. The basis bits B [0:7] may use other specific bits instead of b'00000000 bits.

Figure 3:
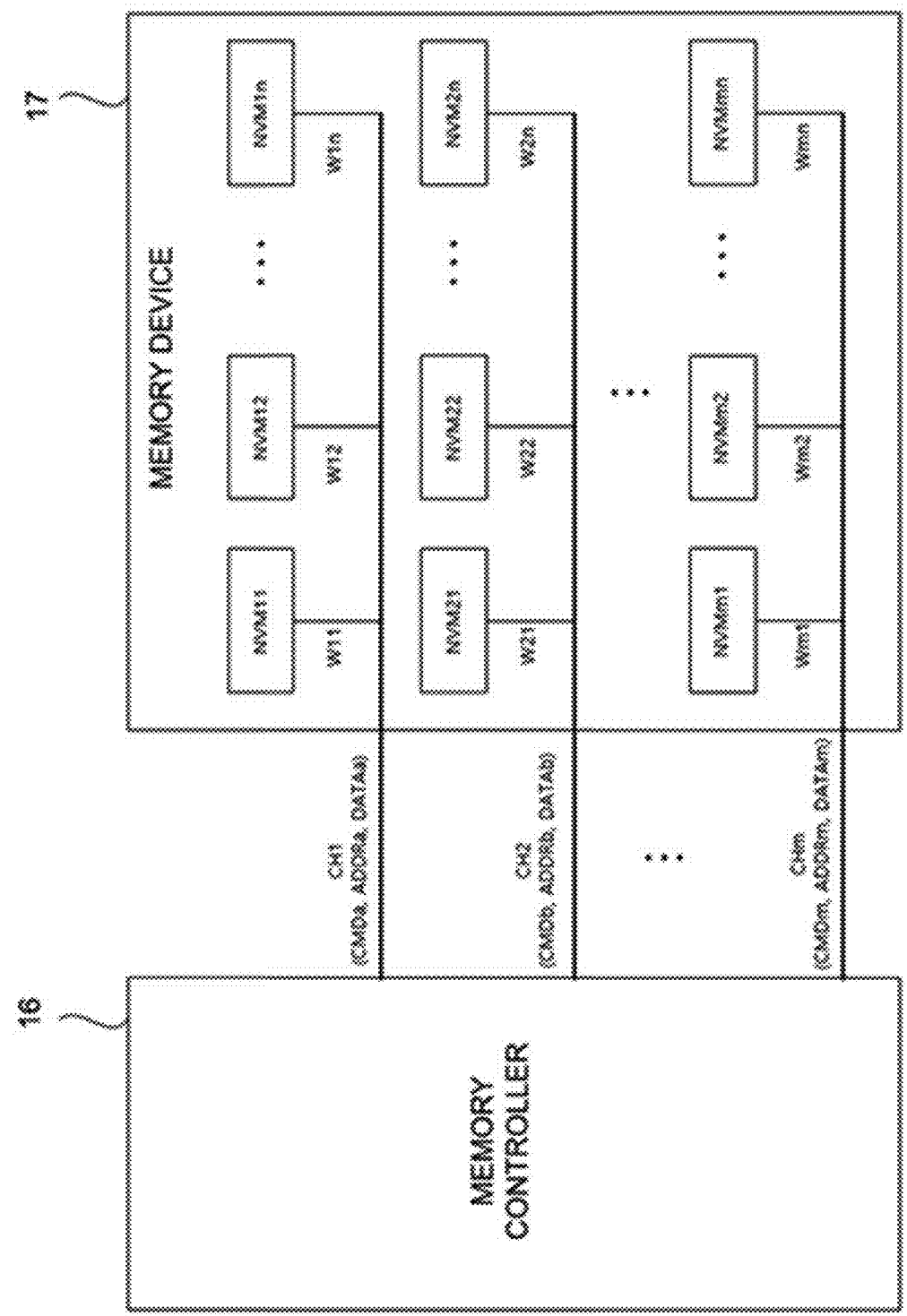
FIG. 3 is a block diagram of a memory system, according to embodiments.

FIG. 3 is a block diagram of a memory system 15 according embodiments. Referring to FIG. 3, the memory system 15 may include a memory device 17 and a memory controller 16. The memory system 15 may support a plurality of channels CH1 to CHm, and the memory device 17 may be connected to the memory controller 16 through the plurality of channels CH1 to CHm. For example, the memory system 15 may be implemented as a storage device, such as an SSD.

The memory device 17 may include a plurality of NVM devices NVM11 to NVMmn. Each of the NVM devices NVM11 to NVMmn may be connected to one of the plurality of channels CH1 to CHm through a way corresponding thereto. For instance, the NVM devices NVM11 to NVM1$n$ may be connected to a first channel CH1 through ways W11 to W1$n$, and the NVM devices NVM21 to NVM2$n$ may be connected to a second channel CH2 through ways W21 to W2$n$. In an example embodiment, each of the NVM devices NVM11 to NVMmn may be implemented as an arbitrary memory unit that may operate according to an individual command from the memory controller 16. For example, each of the NVM devices NVM11 to NVMmn may be implemented as a chip or a die, but the embodiments of the disclosure are not limited thereto.

The memory controller 16 may transmit and receive signals to and from the memory device 17 through the plurality of channels CH1 to CHm. For example, the memory controller 16 may transmit commands CMDa to CMDm, addresses ADDRa to ADDRm, and data DATAa to DATAm to the memory device 17 through the channels CH1 to CHm or receive the data DATAa to DATAm from the memory device 17.

The memory controller 16 may select one of the NVM devices NVM11 to NVMmn, which is connected to each of the channels CH1 to CHm, by using a corresponding one of the channels CH1 to CHm, and transmit and receive signals to and from the selected NVM device. For example, the memory controller 16 may select the NVM device NVM11 from the NVM devices NVM11 to NVM1n connected to the first channel CH1. The memory controller 16 may transmit the command CMDa, the address ADDRa, and the data DATAa to the selected NVM device NVM11 through the first channel CH1 or receive the data DATAa from the selected NVM device NVM11.

The memory controller 16 may transmit and receive signals to and from the memory device 17 in parallel through different channels. For example, the memory controller 16 may transmit a command CMDb to the memory device 17 through the second channel CH2 while transmitting a command CMDa to the memory device 17 through the first channel CH1. For example, the memory controller 16 may receive data DATAb from the memory device 17 through the second channel CH2 while receiving data DATAa from the memory device 17 through the first channel CH1.

The memory controller 16 may control all operations of the memory device 17. The memory controller 16 may transmit a signal to the channels CH1 to CHm and control each of the NVM devices NVM11 to NVMmn connected to the channels CH1 to CHm. For instance, the memory controller 16 may transmit the command CMDa and the address ADDRa to the first channel CH1 and control one selected from the NVM devices NVM11 to NVMln.

Each of the NVM devices NVM11 to NVMmn may operate via the control of the memory controller 16. For example, the NVM device NVM11 may program the data DATAa based on the command CMDa, the address ADDRa, and the data DATAa provided to the first channel CH1. For example, the NVM device NVM21 may read the data DATAb based on the command CMDb and the address ADDb provided to the second channel CH2 and transmit the read data DATAb to the memory controller 16.

Although FIG. 3 illustrates an example in which the memory device 17 communicates with the memory controller 16 through m channels and includes n NVM devices corresponding to each of the channels, the number of channels and the number of NVM devices connected to one channel may be variously changed.

Figure 4:
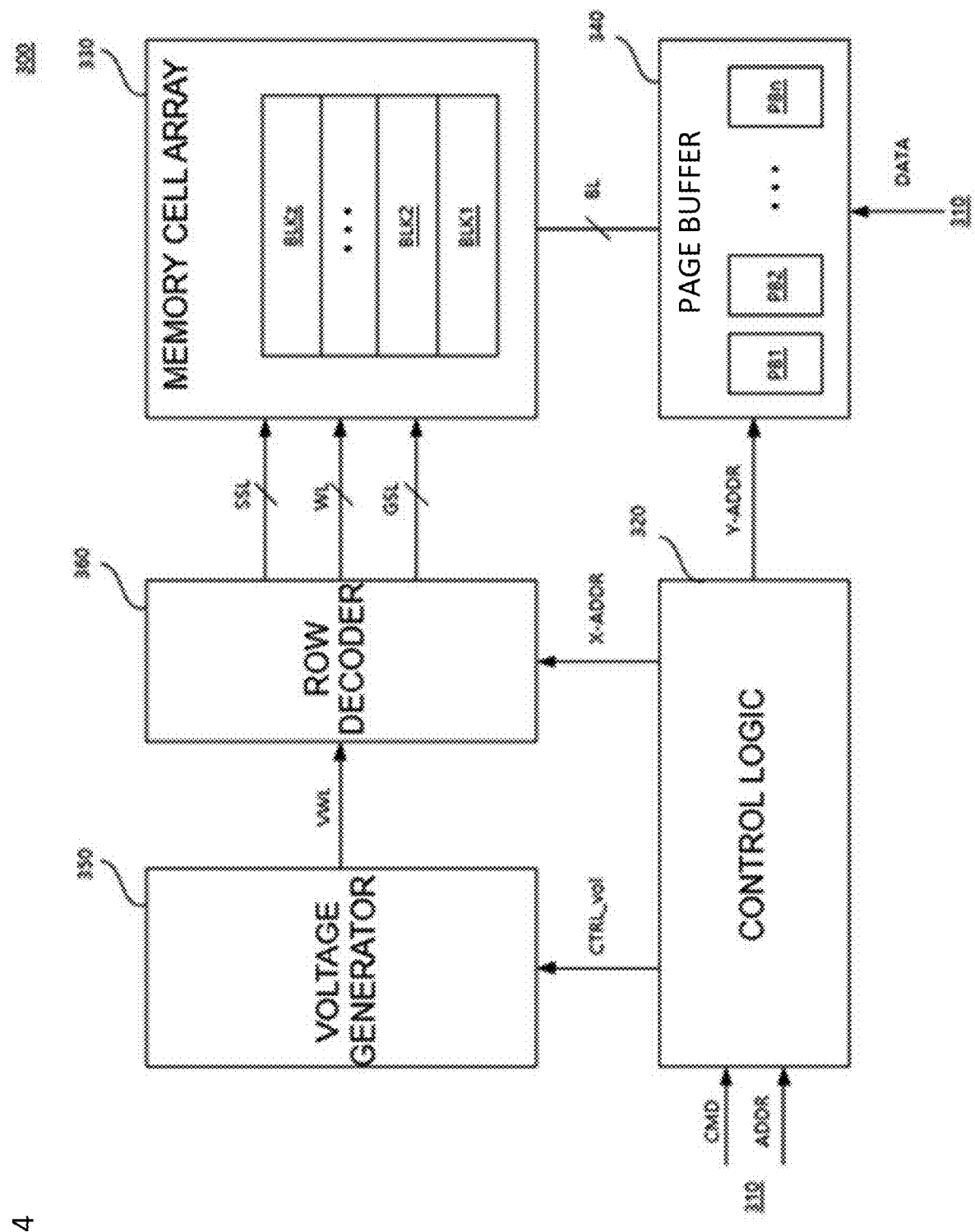
FIG. 4 is a block diagram of a memory device, according to embodiments.

FIG. 4 is a block diagram of a memory device 300 according to an example embodiment. Referring to FIG. 4, the memory device 300 may include a control logic circuitry 320, a memory cell array 330, a page buffer 340, a voltage generator 350, and a row decoder 360. The memory device 300 may further include a memory interface circuitry 310 shown in FIG. 6. In addition, the memory device 300 may further include a column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

Figure 5:
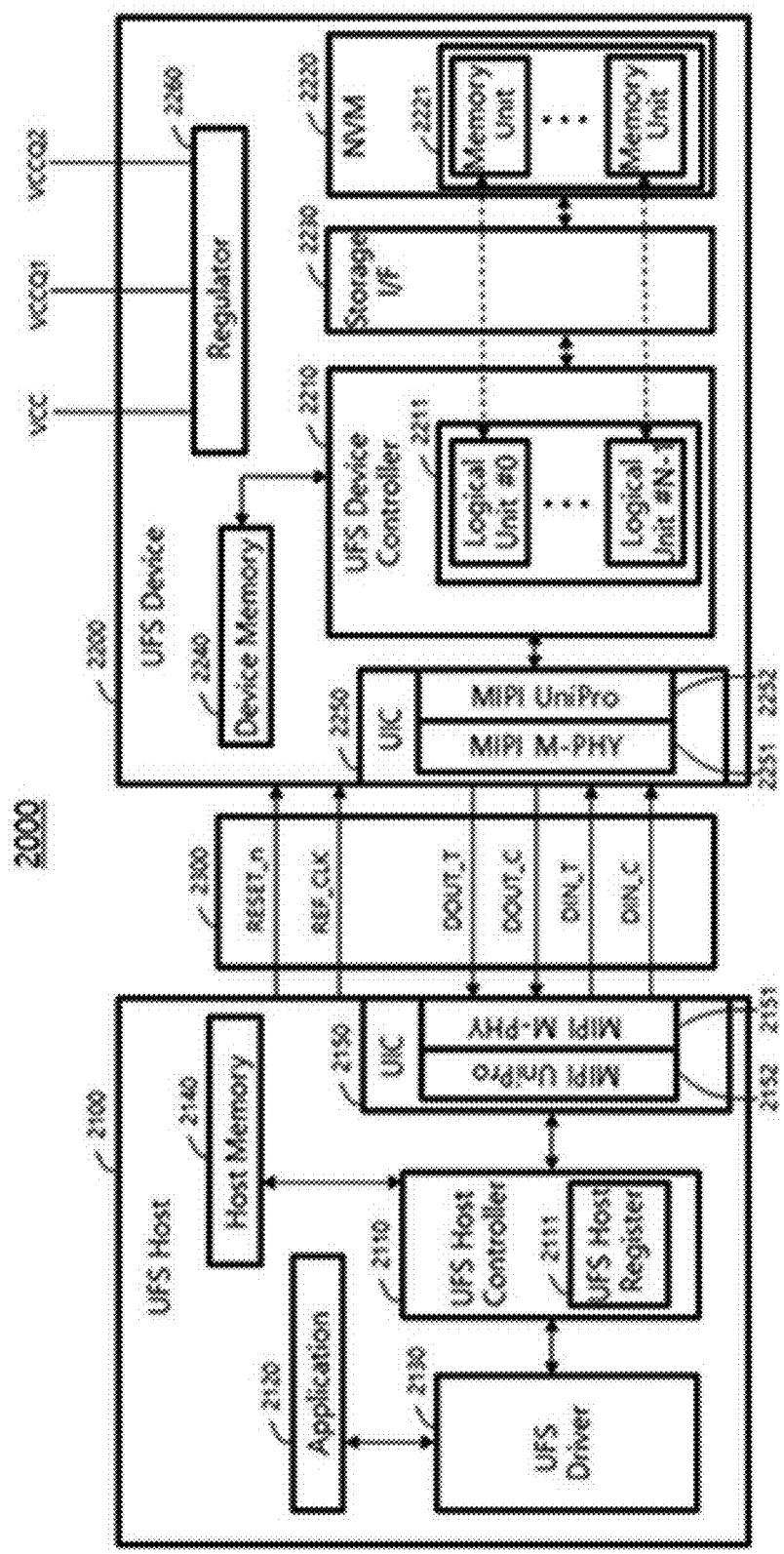
FIG. 5 is a block diagram of a UFS system, according to embodiments.

FIG. 5 is a diagram of a UFS system 2000 according to embodiments. The UFS system 2000 may be a system conforming to a UFS standard announced by Joint∈lectron Device Engineering Council (JEDEC) and include a UFS host 2100, a UFS device 2200, and a UFS interface 2300. The above description of the system 1000 of FIG. 1 may also be applied to the UFS system 2000 of FIG. 5 within a range that does not conflict with the following description of FIG. 5.

Referring to FIG. 5, the UFS host 2100 may be connected to the UFS device 2200 through the UFS interface 2300. When the main processor 1100 of FIG. 1 is an AP, the UFS host 2100 may be implemented as a portion of the AP. The UFS host controller 2110 and the host memory 2140 may respectively correspond to the controller 1120 of the main processor 1100 and the memories 1200a and 1200b of FIG. 1. The UFS device 2200 may correspond to the storage device 1300a and 1300b of FIG. 1, and a UFS device controller 2210 and an NVM 2220 may respectively correspond to the storage controllers 1301a and 1301b and the NVMs 1302a and 1302b of FIG. 1.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the NVM 2220, a storage interface 2230, a device memory 2240, a UIC layer 2250, and a regulator 2260. The NVM 2220 may include a plurality of memory units 2221. Although each of the memory units 2221 may include a V-NAND flash memory having a 2D structure or a 3D structure, each of the memory units 2221 may include another kind of NVM, such as PRAM and/or RRAM. The UFS device controller 2210 may be connected to the NVM 2220 through the storage interface 2230. The storage interface 2230 may be configured to comply with a standard protocol, such as Toggle or ONFI.

The application 2120 may refer to a program that wants to communicate with the UFS device 2200 to use functions of the UFS device 2200. The application 2120 may transmit input-output requests (IORs) to the UFS driver 2130 for input/output (I/O) operations on the UFS device 2200. The IORs may refer to a data read request, a data storage (or write) request, and/or a data erase (or discard) request, without being limited thereto.

The UFS driver 2130 may manage the UFS host controller 2110 through a UFS-host controller interface (UFS-HCI). The UFS driver 2130 may convert the IOR generated by the application 2120 into a UFS command defined by the UFS standard and transmit the UFS command to the UFS host controller 2110. One IOR may be converted into a plurality of UFS commands. Although the UFS command may basically be defined by an SCSI standard, the UFS command may be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. During the transmission of the UFS command, a UFS host register 2111 of the UFS host controller 2110 may serve as a command queue (CQ).

The UIC layer 2150 on the side of the UFS host 2100 may include a mobile industry processor interface (MIPI) M-PHY 2151 and an MIPI UniPro 2152, and the UIC layer 2250 on the side of the UFS device 2200 may also include an MIPI M-PHY 2251 and an MIPI UniPro 2252.

The UFS interface 2300 may include a line configured to transmit a reference clock signal REF_CLK, a line configured to transmit a hardware reset signal RESET_n for the UFS device 2200, a pair of lines configured to transmit a pair of differential input signals DIN_t and DIN_c, and a pair of lines configured to transmit a pair of differential output signals DOUT_t and DOUT_c.

A frequency of a reference clock signal REF_CLK provided from the UFS host 2100 to the UFS device 2200 may be one of 19.2 MHz, 26 MHz, 38.4 MHz, and 52 MHz, without being limited thereto. The UFS host 2100 may change the frequency of the reference clock signal REF_CLK during an operation, that is, during data transmission/receiving operations between the UFS host 2100 and the UFS device 2200. The UFS device 2200 may generate cock signals having various frequencies from the reference clock signal REF_CLK provided from the UFS host 2100, by using a phase-locked loop (PLL). Also, the UFS host 2100 may set a data rate between the UFS host 2100 and the UFS device 2200 by using the frequency of the reference clock signal REF_CLK. That is, the data rate may be determined depending on the frequency of the reference clock signal REF_CLK.

The UFS interface 2300 may support a plurality of lanes, each of which may be implemented as a pair of differential lines. For example, the UFS interface 2300 may include at least one receiving lane and at least one transmission lane. In FIG. 5, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 5, the number of transmission lanes and the number of receiving lanes may be changed.

The receiving lane and the transmission lane may transmit data based on a serial communication scheme. Full-duplex communications between the UFS host 2100 and the UFS device 2200 may be enabled due to a structure in which the receiving lane is separated from the transmission lane. That is, while receiving data from the UFS host 2100 through the receiving lane, the UFS device 2200 may transmit data to the UFS host 2100 through the transmission lane. In addition, control data (e.g., a command) from the UFS host 2100 to the UFS device 2200 and user data to be stored in or read from the NVM 2220 of the UFS device 2200 by the UFS host 2100 may be transmitted through the same lane. Accordingly, between the UFS host 2100 and the UFS device 2200, there may be no need to further provide a separate lane for data transmission in addition to a pair of receiving lanes and a pair of transmission lanes.

The UFS device controller 2210 of the UFS device 2200 may control all operations of the UFS device 2200. The UFS device controller 2210 may manage the NVM 2220 by using a logical unit (LU) 2211, which is a logical data storage unit. The number of LUs 2211 may be 8, without being limited thereto. The UFS device controller 2210 may include an FTL and convert a logical data address (e.g., a logical block address (LBA)) received from the UFS host 2100 into a physical data address (e.g., a physical block address (PBA)) by using address mapping information of the FTL. A logical block configured to store user data in the UFS system 2000 may have a size in a predetermined range. For example, a minimum size of the logical block may be set to 4 Kbyte.

When a command from the UFS host 2100 is applied through the UIC layer 2250 to the UFS device 2200, the UFS device controller 2210 may perform an operation in response to the command and transmit a completion response to the UFS host 2100 when the operation is completed.

As an example, when the UFS host 2100 intends to store user data in the UFS device 2200, the UFS host 2100 may transmit a data storage command to the UFS device 2200. When a response (a 'ready-to-transfer' response) indicating that the UFS host 2100 is ready to receive user data (ready-to-transfer) is received from the UFS device 2200, the UFS host 2100 may transmit user data to the UFS device 2200. The UFS device controller 2210 may temporarily store the received user data in the device memory 2240 and store the user data, which is temporarily stored in the device memory 2240, at a selected position of the NVM 2220 based on the address mapping information of the FTL.

As another example, when the UFS host 2100 intends to read the user data stored in the UFS device 2200, the UFS host 2100 may transmit a data read command to the UFS device 2200. The UFS device controller 2210, which has received the command, may read the user data from the NVM 2220 based on the data read command and temporarily store the read user data in the device memory 2240. During the read operation, the UFS device controller 2210 may detect and correct an error in the read user data by using an ECC engine embedded therein. More specifically, the ECC engine may generate parity bits for write data to be written to the NVM 2220, and the generated parity bits may be stored in the NVM 2220 along with the write data. During the reading of data from the NVM 2220, the ECC engine may correct an error in read data by using the parity bits read from the NVM 2220 along with the read data, and output error-corrected read data.

In addition, the UFS device controller 2210 may transmit user data, which is temporarily stored in the device memory 2240, to the UFS host 2100. In addition, the UFS device controller 2210 may further include an AES engine. The AES engine may perform at least of an encryption operation and a decryption operation on data transmitted to the UFS device controller 2210 by using a symmetric-key algorithm.

The UFS host 2100 may sequentially store commands, which are to be transmitted to the UFS device 2200, in the UFS host register 2111, which may serve as a common queue, and sequentially transmit the commands to the UFS device 2200. In this case, even while a previously transmitted command is still being processed by the UFS device 2200, that is, even before receiving a notification that the previously transmitted command has been processed by the UFS device 2200, the UFS host 2100 may transmit a next command, which is on standby in the CQ, to the UFS device 2200. Thus, the UFS device 2200 may also receive a next command from the UFS host 2100 during the processing of the previously transmitted command. A maximum number (or queue depth) of commands that may be stored in the CQ may be, for example, 32. Also, the CQ may be implemented as a circular queue in which a start and an end of a command line stored in a queue are indicated by a head pointer and a tail pointer.

Each of the plurality of memory units 2221 may include a memory cell array and a control circuit configured to control an operation of the memory cell array. The memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ, and VCCQ2 may be applied as power supply voltages to the UFS device 2200. The voltage VCC may be a main power supply voltage for the UFS device 2200 and be in a range of 2.4 V to 3.6 V. The voltage VCCQ may be a power supply voltage for supplying a low voltage mainly to the UFS device controller 2210 and be in a range of 1.14 V to 1.26 V. The voltage VCCQ2 may be a power supply voltage for supplying a voltage, which is lower than the voltage VCC and higher than the voltage VCCQ, mainly to an I/O interface, such as the MIPI M-PHY 2251, and be in a range of 1.7 V to 1.95 V. The power supply voltages may be supplied through the regulator 2260 to respective components of the UFS device 2200. The regulator 2260 may be implemented as a set of unit regulators respectively connected to different ones of the power supply voltages described above.

Figure 6:
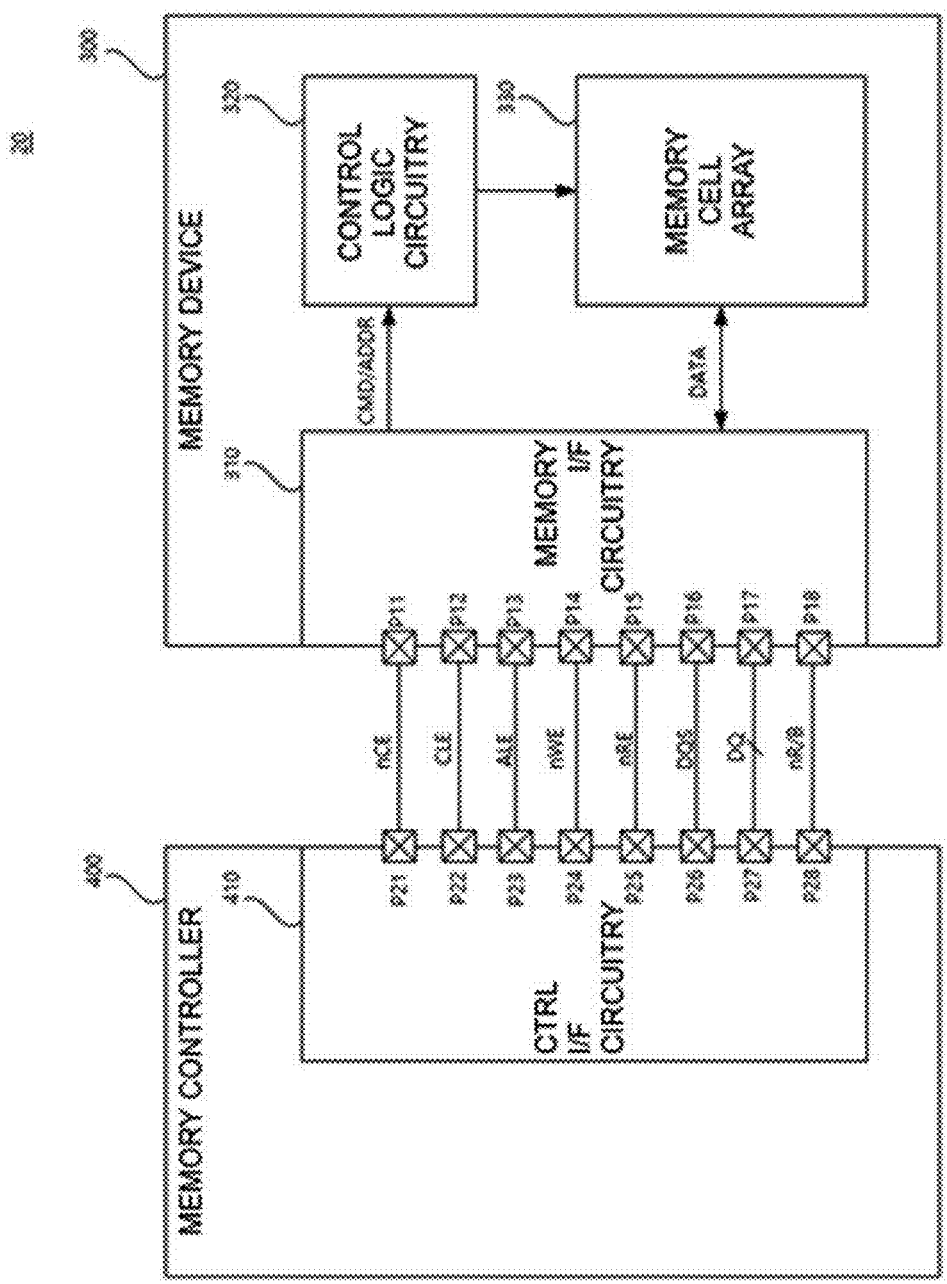
FIG. 6 is a block diagram of a memory system according to embodiments.

FIG. 6 is a block diagram of a memory system 20 according to an embodiment.

Referring to FIG. 6, the memory system 20 may include a memory device 300 and a memory controller 400. The memory device 300 may correspond to one of NVM devices NVM11 to NVMmn, which communicate with a memory controller 400 based on one of the plurality of channels CH1 to CHm of FIG. 3. The memory controller 400 may correspond to the storage controller 210 of FIG. 2A.

The memory device 300 may include first to eighth pins P11 to P18, a memory interface circuitry 310, a control logic circuitry 320, and a memory cell array 330.

The memory interface circuitry 310 may receive a chip enable signal nCE from the memory controller 400 through the first pin P11. The memory interface circuitry 310 may transmit and receive signals to and from the memory controller 400 through the second to eighth pins P12 to P18 in response to the chip enable signal nCE. For example, when the chip enable signal nCE is in an enable state (e.g., a low level), the memory interface circuitry 310 may transmit and receive signals to and from the memory controller 400 through the second to eighth pins P12 to P18.

The memory interface circuitry 310 may receive a command latch enable signal CLE, an address latch enable signal ALE, and a write enable signal nWE from the memory controller 400 through the second to fourth pins P12 to P14. The memory interface circuitry 310 may receive a data signal DQ from the memory controller 400 through the seventh pin P17 or transmit the data signal DQ to the memory controller 400. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 310 may obtain the command CMD from the data signal DQ, which is received in an enable section (e.g., a high-level state) of the command latch enable signal CLE based on toggle time points of the write enable signal nWE. The memory interface circuitry 310 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 310 may obtain the command CMD or the address ADDR based on toggle time points of the write enable signal nWE.

The memory interface circuitry 310 may receive a read enable signal nRE from the memory controller 400 through the fifth pin P15. The memory interface circuitry 310 may receive a data strobe signal DQS from the memory controller 400 through the sixth pin P16 or transmit the data strobe signal DQS to the memory controller 400.

In a data (DATA) output operation of the memory device 300, the memory interface circuitry 310 may receive the read enable signal nRE, which toggles through the fifth pin P15, before outputting the data DATA. The memory interface circuitry 310 may generate the data strobe signal DQS, which toggles based on the toggling of the read enable signal nRE. For example, the memory interface circuitry 310 may generate a data strobe signal DQS, which starts toggling after a predetermined delay (e.g., tDQSRE), based on a toggling start time of the read enable signal nRE. The memory interface circuitry 310 may transmit the data signal DQ including the data DATA based on a toggle time point of the data strobe signal DQS. Thus, the data DATA may be aligned with the toggle time point of the data strobe signal DQS and transmitted to the memory controller 400.

In a data (DATA) input operation of the memory device 300, when the data signal DQ including the data DATA is received from the memory controller 400, the memory interface circuitry 310 may receive the data strobe signal DQS, which toggles, along with the data DATA from the memory controller 400. The memory interface circuitry 310 may obtain the data DATA from the data signal DQ based on toggle time points of the data strobe signal DQS. For example, the memory interface circuitry 310 may sample the data signal DQ at rising and falling edges of the data strobe signal DQS and obtain the data DATA.

The memory interface circuitry 310 may transmit a ready/busy output signal nR/B to the memory controller 400 through the eighth pin P18. The memory interface circuitry 310 may transmit state information of the memory device 300 through the ready/busy output signal nR/B to the memory controller 400. When the memory device 300 is in a busy state (i.e., when operations are being performed in the memory device 300), the memory interface circuitry 310 may transmit a ready/busy output signal nR/B indicating the busy state to the memory controller 400. When the memory device 300 is in a ready state (i.e., when operations are not performed or completed in the memory device 300), the memory interface circuitry 310 may transmit a ready/busy output signal nR/B indicating the ready state to the memory controller 400. For example, while the memory device 300 is reading data DATA from the memory cell array 330 in response to a page read command, the memory interface circuitry 310 may transmit a ready/busy output signal nR/B indicating a busy state (e.g., a low level) to the memory controller 400. For example, while the memory device 300 is programming data DATA to the memory cell array 330 in response to a program command, the memory interface circuitry 310 may transmit a ready/busy output signal nR/B indicating the busy state to the memory controller 400.

The control logic circuitry 320 may control all operations of the memory device 300. The control logic circuitry 320 may receive the command/address CMD/ADDR obtained from the memory interface circuitry 310. The control logic circuitry 320 may generate control signals for controlling other components of the memory device 300 in response to the received command/address CMD/ADDR. For example, the control logic circuitry 320 may generate various control signals for programming data DATA to the memory cell array 330 or reading the data DATA from the memory cell array 330.

The memory cell array 330 may store the data DATA obtained from the memory interface circuitry 310, via the control of the control logic circuitry 320. The memory cell array 330 may output the stored data DATA to the memory interface circuitry 310 via the control of the control logic circuitry 320.

The memory cell array 330 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 400 may include first to eighth pins P21 to P28 and a controller interface circuitry 410. The first to eighth pins P21 to P28 may respectively correspond to the first to eighth pins P11 to P18 of the memory device 300.

The controller interface circuitry 410 may transmit a chip enable signal nCE to the memory device 300 through the first pin P21. The controller interface circuitry 410 may transmit and receive signals to and from the memory device 300, which is selected by the chip enable signal nCE, through the second to eighth pins P22 to P28.

The controller interface circuitry 410 may transmit the command latch enable signal CLE, the address latch enable signal ALE, and the write enable signal nWE to the memory device 300 through the second to fourth pins P22 to P24. The controller interface circuitry 410 may transmit or receive the data signal DQ to and from the memory device 300 through the seventh pin P27.

The controller interface circuitry 410 may transmit the data signal DQ including the command CMD or the address ADDR to the memory device 300 along with the write enable signal nWE, which toggles. The controller interface circuitry 410 may transmit the data signal DQ including the command CMD to the memory device 300 by transmitting a command latch enable signal CLE having an enable state. Also, the controller interface circuitry 410 may transmit the data signal DQ including the address ADDR to the memory device 300 by transmitting an address latch enable signal ALE having an enable state.

The controller interface circuitry 410 may transmit the read enable signal nRE to the memory device 300 through the fifth pin P25. The controller interface circuitry 410 may receive or transmit the data strobe signal DQS from or to the memory device 300 through the sixth pin P26.

In a data (DATA) output operation of the memory device 300, the controller interface circuitry 410 may generate a read enable signal nRE, which toggles, and transmit the read enable signal nRE to the memory device 300. For example, before outputting data DATA, the controller interface circuitry 410 may generate a read enable signal nRE, which is changed from a static state (e.g., a high level or a low level) to a toggling state. Thus, the memory device 300 may generate a data strobe signal DQS, which toggles, based on the read enable signal nRE. The controller interface circuitry 410 may receive the data signal DQ including the data DATA along with the data strobe signal DQS, which toggles, from the memory device 300. The controller interface circuitry 410 may obtain the data DATA from the data signal DQ based on a toggle time point of the data strobe signal DQS.

In a data (DATA) input operation of the memory device 300, the controller interface circuitry 410 may generate a data strobe signal DQS, which toggles. For example, before transmitting data DATA, the controller interface circuitry 410 may generate a data strobe signal DQS, which is changed from a static state (e.g., a high level or a low level) to a toggling state. The controller interface circuitry 410 may transmit the data signal DQ including the data DATA to the memory device 300 based on toggle time points of the data strobe signal DQS.

The controller interface circuitry 410 may receive a ready/busy output signal nR/B from the memory device 300 through the eighth pin P28. The controller interface circuitry 410 may determine state information of the memory device 300 based on the ready/busy output signal nR/B.

Figure 7:
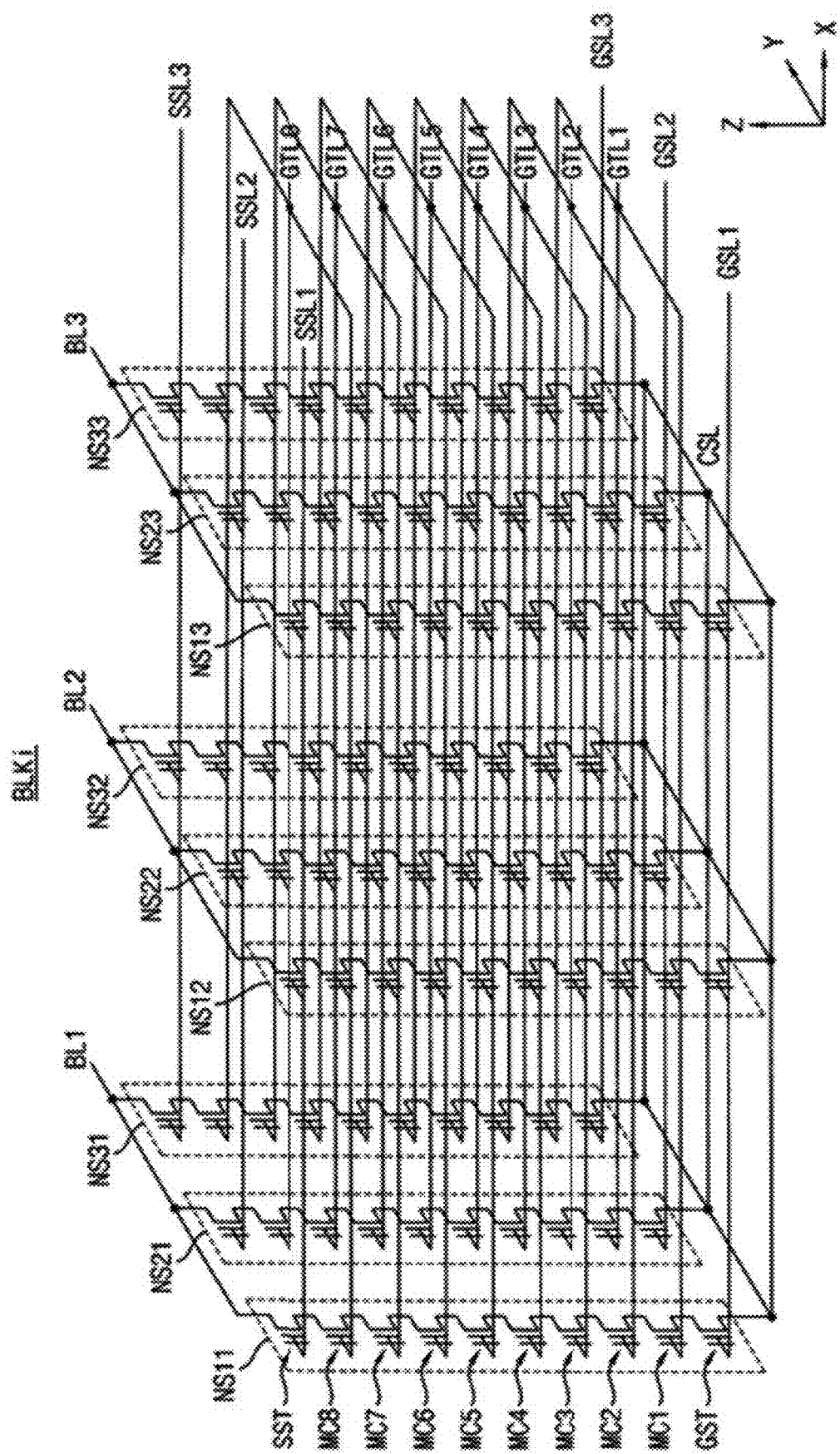
FIG. 7 is a diagram of a 3D V-NAND structure applicable to a UFS device according to embodiments.

FIG. 7 is a diagram of a 3D V-NAND structure applicable to a UFS device according to an embodiment. When a storage module of the UFS device is implemented as a 3D V-NAND flash memory, each of a plurality of memory blocks included in the storage module may be represented by an equivalent circuit shown in FIG. 7.

A memory block BLKi shown in FIG. 7 may refer to a 3D memory block having a 3D structure formed on a substrate. For example, a plurality of memory NAND strings included in the memory block BLKi may be formed in a vertical direction to the substrate.

Referring to FIG. 7, the memory block BLKi may include a plurality of memory NAND strings (e.g., NS11 to NS33), which are connected between bit lines BL1, BL2, and BL3 and a common source line CSL. Each of the memory NAND strings NS11 to NS33 may include a string selection transistor SST, a plurality of memory cells (e.g., MC1, MC2, . . . , and MC8), and a ground selection transistor GST. Each of the memory NAND strings NS11 to NS33 is illustrated as including eight memory cells MC1, MC2, . . . , and MC8 in FIG. 7, without being limited thereto.

The string selection transistor SST may be connected to string selection lines SSL1, SSL2, and SSL3 corresponding thereto. Each of the memory cells MC1, MC2, . . . , and MC8 may be connected to a corresponding one of gate lines GTL1, GTL2, . . . , and GTL8. The gate lines GTL1, GTL2, . . . , and GTL8 may respectively correspond to word lines, and some of the gate lines GTL1, GTL2, . . . , and GTL8 may correspond to dummy word lines. The ground selection transistor GST may be connected to ground selection lines GSL1, GSL2, and GSL3 corresponding thereto. The string selection transistor SST may be connected to the bit lines BL1, BL2, and BL3 corresponding thereto, and the ground selection transistor GST may be connected to the common source line CSL.

Word lines (e.g., WL1) at the same level may be connected in common, and the ground selection lines GSL1, GSL2, and GSL3 and the string selection lines SSL1, SSL2, and SSL3 may be separated from each other. FIG. 7 illustrates a case in which a memory block BLK is connected to eight gate lines GTL1, GTL2, . . . , and GTL8 and three bit lines BL1, BL2, and BL3, without being limited thereto.

Figure 8:
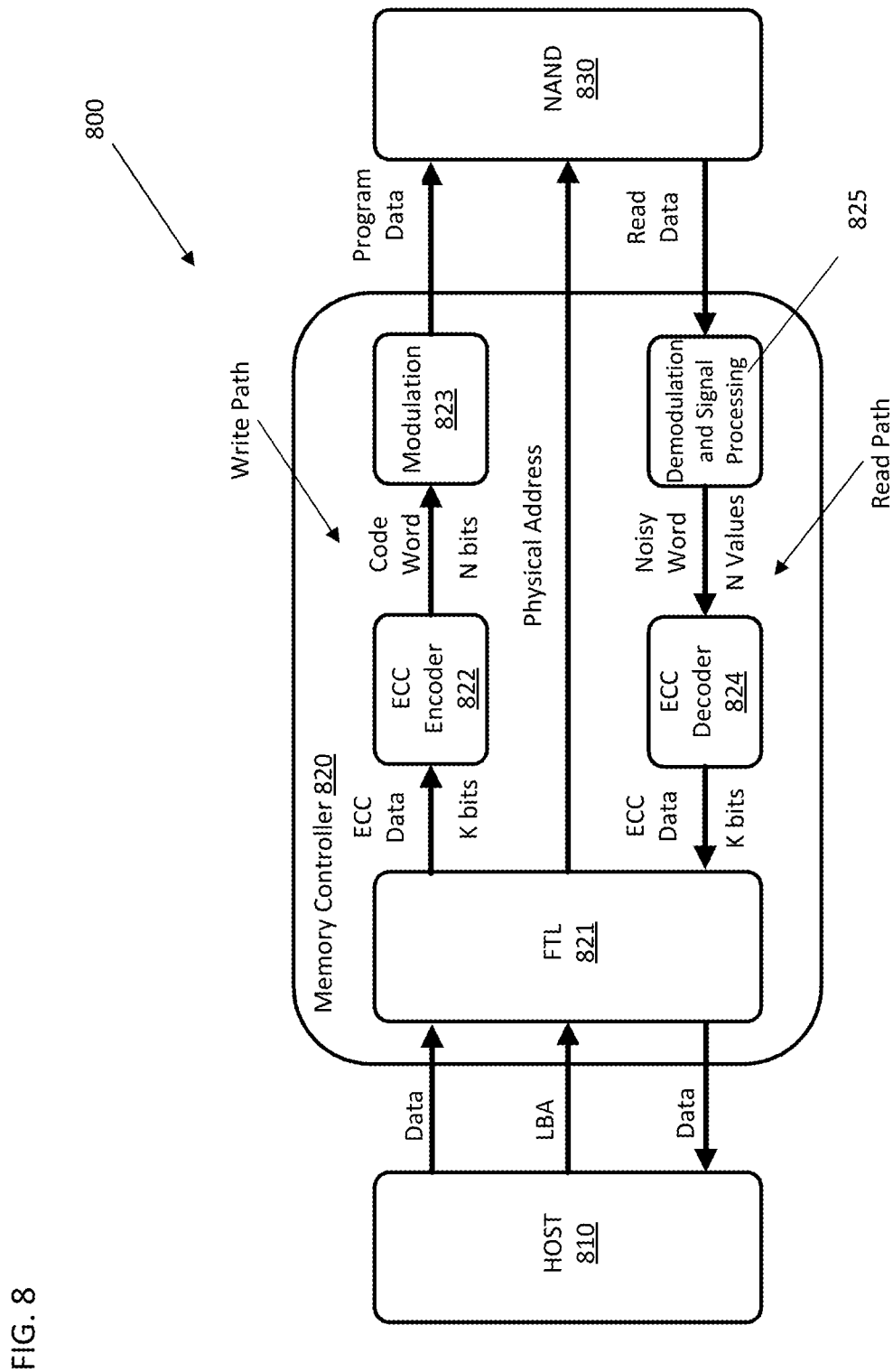
FIG. 8 is a block diagram of a memory system according to embodiments.

FIG. 8 is a block diagram of a memory system according to embodiments. As shown in FIG. 8, the memory system 800 may include a host 810, a memory controller 820, and a NAND device 830. The memory controller 820 may include a flash-translation layer (FTL) 821, an ECC encoder module 822, a modulation module 823, a demodulation and signal processing module 825, and an ECC decoder module 824. In embodiments, the ECC encoder module 822 and the modulation module 823 may be referred to as a write path, and the demodulation and signal processing module 825 and the ECC decoder module 824 may be referred to as a read path. In embodiments, the memory system 800 may correspond to one or more elements discussed above, for example the host storage system 10, but embodiments are not limited thereto.

In order to write data to the NAND device 830, the host 810 may pass to the memory controller 820 a logical address, for example a logic block address (LBA), and may transfer the data corresponding to the LBA to the memory controller 820. Using the FTL 821, the memory controller 820 may break the data into ECC data words, and may set corresponding physical addresses for the NAND device 830.

An ECC data word may have a length K. In some embodiments, the length K may have a value of four kilobits (kb), however embodiments are not limited thereto. The ECC encoder module 822 may receive K bits of ECC data, and may add redundancy bits to generate ECC codewords of length N. The ECC code rate may be represented as R=K/N. In some embodiments, the value of R may be for example 0.9, however embodiments are not limited thereto.

In embodiments, N-bit codewords may be merged together and programmed or written to the NAND device 830 by the modulation module, 823, which may use modulations such as a single-level cell (SLC) modulation, a multi-level cell (MLC) modulation, a triple-level cell (TLC) modulation, and a quad-level cell (QLC) modulation, however embodiments are not limited thereto.

In order to read the data from the NAND device 830, the host 810 may request to read the LBA from the memory controller 820, which in turn is translated by the FTL 821 to physical addresses. The NAND device 830 may transfer the corresponding read data, which may be demodulated and processed by the demodulation and signal processing module 825 to generate ECC noisy words having length N. In embodiments, an ECC noisy word may refer to the ECC codeword with some errors.

The basic mode of operation may be a fast read from the NAND device 830, in which the memory controller 820 may receive N bits from the NAND, the ECC decoder module 824 may decode the N bits with errors and reconstruct or generate the stored K bits of ECC data. This mode may be referred to as hard decision (HD) mode.

In case of failure, it may be possible to receive additional measurements from the NAND device 830. For example, ECC decoder module 824 may receive a vector of N "soft" values representing the ECC codeword, and may perform deciding with higher quality. This mode may be referred to as soft decision (SD) mode, and may be associated with higher latency than HD mode because of the read time from the NAND and also because different signal processing or ECC mode of operations may be performed with higher complexity.

Figure 9:
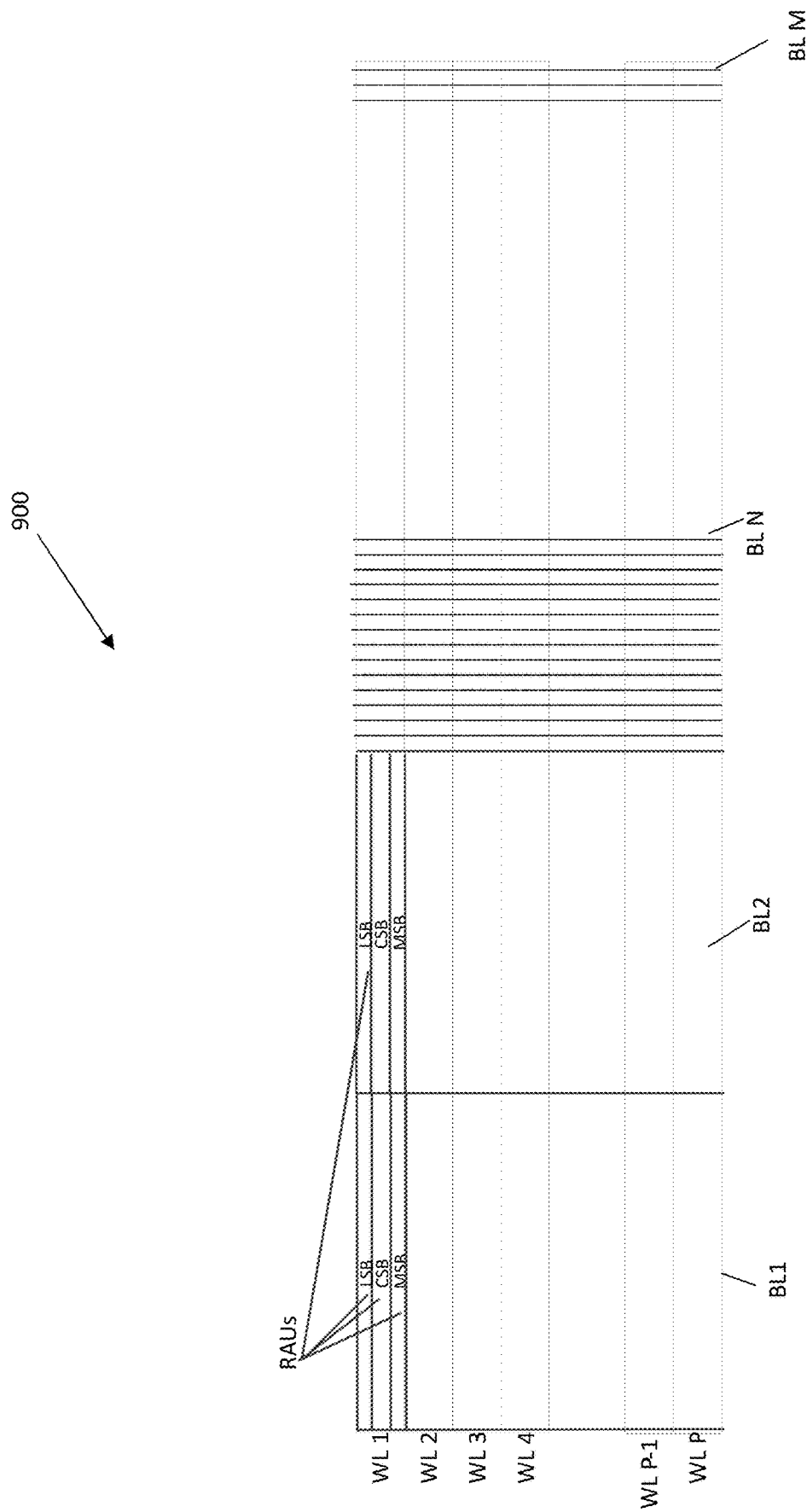
FIG. 9 illustrates an example of a NAND memory block, according to embodiments.

FIG. 9 illustrates an example of a NAND memory block, according to embodiments. In general, a NAND cell may store T bits, where T depends on the particular type of NAND memory cell. For example, a flash memory device which stores one bit per cell (BPC) may be referred to as a single-level cell (SLC), a flash memory device which stores two BPC may be referred to as a multi-level cell (MLC), a flash memory device which stores three BPC may be referred to as a triple-level cell (TLC), a flash memory device which stores four BPC may be referred to as a quadruple-level cell (QLC), and a flash memory device which stores five BPC may be referred to as a penta-level cell (PLC). For example, memory block 900 may be a TLC NAND memory block. As discussed above, a NAND chip may have a structure which includes Z blocks of P word lines (WLs), where each WL includes M bit lines (BLs).

To allow fast NAND access, each WL of a NAND memory device may be divided into random access units (RAUs). Generally, if the number of bits to be stored in an RAU is N, the WL may be divided to M/N sectors, where each sector will includes T RAUs, of N BLs, representing one bit out of T, which may be for for example as a least significant bit (LSB), a center significant bit (CSB), or a most significant bit (MSB). Accordingly, the number of RAUs in such a block will be P*T*M/N. To allow high reliability access, each RAU may be protected with an ECC. For example, the ECC code length for an RAU may be of length N and may accommodate K<N information bits.

According to embodiments, the notation shown in Equation 1 and Equation 2 below may be used herein:

$$[n] \triangleq [1,2, \ldots n] \quad \text{(Equation 1)}$$

$$[n]^* = [0,1,2, \ldots n] \quad \text{(Equation 2)}$$

Vectors may be represented as lower-case bold letters (for example v) and matrices may be represented as upper-case bold letters (for example A).

According to embodiments, a may denote a Galois Field primitive element, BCH(n,k,t) may denote a BCH code of length n, dimension k, and error correction capability t. In addition, $B_t$ may denote a BCH transform corresponding to stage t.

According to embodiments, RS(n, F) may denote an RS code of length n (symbols), where $F=d_{min}-1$. In addition, $R_t$ may denote an RS transform corresponding to stage t.

According to embodiments, GRS(n, F, $\{\alpha_i\}_{i=1}^n$ $\{1, \{v_i\}_{i=1}^n$ may denote an RS code of length n (symbols), where $F=d_{min}-1$, and which also includes parameters $\{\alpha_i\}_{i=1}^n \cdot \{v_i\}_{i=1}^n$.

According to embodiments, nested codes may be used as constituent codes. Nested codes may refer to codes from the same family $\mathbb{Q}_M \subset \mathbb{Q}_{M-1} \subset \ldots \subset \mathbb{Q}_1$ of length n and dimension $k_j$, where $k_{j1} \geq k_{j2}$ for $j_1 \leq j_2$ and $j_1, j_2 \in [M]$.

A codeword x may be included in $\mathbb{Q}_{j1}(x \in \mathbb{Q}_{j1})$ and may correspond to a coset $s_{12} \in \{0,1\}^{k_{j1}-k_{j2}} (j_1 \leq j_2)$. The nested codes may have the property that the codewords x in $\mathbb{Q}_{j2}(x \in \mathbb{Q}_{j2})$ are the codewords in $\mathbb{Q}_{j1}$, which meet the linear constraint $T_{12} \cdot x = s$, where $T_{12} \in \{0,1\}(k_{j1}-k_{j2})xn$ denotes the coset operator. In embodiments, the relation between the number of codewords in $\mathbb{Q}_{j2}$ and $\mathbb{Q}_{j1}$, may be expressed according to Equation 3 below:

$$|\mathbb{Q}_{j2}| = |\mathbb{Q}_{j1}|/2^{k_{j1}-k_{j2}} \quad \text{Equation 3}$$

A transform T may refer to a linear operation applied on a constituent codeword $x \in \{0,1\}^n$ and returning the codeword coset, $s \in \{0,1\}^{k0-kM}$ which may be referred to as the transform space, and may be represented according to Equation 4 and Equation 5 below:

$$s = T \cdot x \quad \text{Equation 4}$$

$$T \triangleq \begin{bmatrix} T_{12} \\ T_{23} \\ \vdots \\ \vdots \\ T_{M-1,M} \end{bmatrix} \quad \text{Equation 5}$$

According to embodiments, a code BCH(n, k, t) may be a BCH code of length n, dimension k, and error correction capability t. The parity check matrix of such a BCH code may be defined using the primitive element a as shown in Equation 6 below:

$$H_t^{BCH} \triangleq \quad \text{(Equation 6)}$$

$$\begin{bmatrix} 1 & \alpha & \alpha^2 & \alpha^3 & \ldots & \alpha^{n-1} \\ 1 & \alpha^3 & \alpha^6 & \alpha^9 & \ldots & \alpha^{3 \cdot (n-1)} \\ 1 & \alpha^5 & \alpha^{10} & \alpha^{15} & \ldots & \alpha^{5 \cdot (n-1)} \\ \ldots & \ldots & \ldots & \ldots & \ldots & \ldots \\ 1 & \alpha^{2t-3} & \alpha^{4t-6} & \alpha^{6t-9} & \ldots & \alpha^{(2t-3)(n-1)} \\ 1 & \alpha^{2t-1} & \alpha^{4t-2} & \alpha^{6t-3} & \ldots & \alpha^{(2t-1)(n-1)} \end{bmatrix} \triangleq \begin{bmatrix} H_1^{BCH} \\ H_2^{BCH} \\ \vdots \\ \vdots \\ H_{t-1}^{BCH} \\ H_t^{BCH} \end{bmatrix}$$

The BCH syndrome, corresponding to t on code word $x=\{x_i\}_{i=1}^n$, $x_i \in GF(2)$, may be expressed according to Equation 7 below:

$$s_t = H_t^{BCH} \cdot x = \sum_{i=1}^{n} x_i \cdot \alpha^{(2t-1)(i-1)} \quad \text{(Equation 7)}$$

To use the BCH code as a constituent code, the BCH nested codes and their transform may be defined as follows. For a set of error corrections parameters $t_j \geq 0$, $j \in [M]^*$ such that $t_j \leq t_r \nabla \forall j < r$, with the corresponding dimension $k_j$, a family of BCH nested codes may be denoted BCH(n, $k_{0 \to M}$, $t_{0 \to M}$), and may be represented according to Equation 14 below:

$$BCH(n, k_M, t_M) \subset BCH(n, k_{M-1}, t_{M-1}) \subset \ldots \subset BCH(n, k_0, t_0) \quad \text{(Equation 14)}$$

For some j, the BCH code $t_{j-1} \to t_j$ coset may be denoted $H_{t_{j-1} \to t_j}$, which may be defined according to Equation 8 below:

$$H_{t_{j-1} \to t_j} \triangleq \quad \text{(Equation 8)}$$

$$\begin{bmatrix} 1 & \alpha^{2t_{j-1}+1} & \alpha^{2(2t_{j-1}+1)} & \alpha^{3 \cdot (2t_{j-1}+1)} & \ldots & \alpha^{(n-1)(2t_{j-1}+1)} \\ 1 & \alpha^{2t_{j-1}+3} & \alpha^{2(2t_{j-1}+3)} & \alpha^{3 \cdot (2t_{j-1}+3)} & \ldots & \alpha^{(n-1)(2t_{j-1}+3)} \\ \ldots & \ldots & \ldots & \ldots & \ldots & \ldots \\ 1 & \alpha^{2t_j-1} & \alpha^{2(2t_j-1)} & \alpha^{3 \cdot (2t_j-1)} & \ldots & \alpha^{(n-1)(2t_j-1)} \end{bmatrix}$$

The BCH transform may then be defined according to Equation 9, with the corresponding transform space symbol represented according to Equation 10, and the transform space defined according to Equation 11 below:

$$B_j \triangleq H_{t_{j-1} \to t_j}, j \in [M] \quad \text{(Equation 9)}$$

$$s_j = B_j \cdot x \quad \text{(Equation 10)}$$

$$s = \begin{bmatrix} s_1 \\ s_2 \\ \vdots \\ s_M \end{bmatrix} \triangleq \begin{bmatrix} B_1 \\ B_2 \\ \vdots \\ B_M \end{bmatrix} \cdot x \triangleq B \cdot x \quad \text{(Equation 11)}$$

According to embodiments, a code RS(n, F) may be an RS code of length n and minimum distance $d_{min} \triangleq F+1$.

The parity check matrix of such an RS code may be represented using the primitive element a as shown in Equation 12 below:

$$H_F = \begin{bmatrix} 1 & 1 & 1 & 1 & \ldots & 1 \\ 1 & \alpha & \alpha^2 & \alpha^3 & \ldots & \alpha^{(n-1)} \\ 1 & \alpha^2 & \alpha^4 & \alpha^6 & \ldots & \alpha^{2 \cdot (n-1)} \\ \ldots & \ldots & \ldots & \ldots & \ldots & \ldots \\ 1 & \alpha^{F-2} & \alpha^{2 \cdot (F-2)} & \alpha^{3 \cdot (F-2)} & \ldots & \alpha^{(F-2)(n-1)} \\ 1 & \alpha^{F-1} & \alpha^{2 \cdot (F-1)} & \alpha^{3 \cdot (F-1)} & \ldots & \alpha^{(F-1)(n-1)} \end{bmatrix} \quad \text{(Equation 12)}$$

The RS syndrome corresponding to $j \in [F]$ on code word $x=\{x_i\}=1$ and $x_i \in GF(2^m)$, may be denoted $s_j$, and may be expressed according to Equation 13 below:

$$s_j = H_j \cdot x = \sum_{i=1}^{n} x_i \cdot \alpha^{(j-1)(i-1)} \quad \text{(Equation 13)}$$

To use the RS code as a constituent code, the RS nested codes and their transform may be defined as follows. A set of error correction parameters may be denoted $F_t \geq 0$, $t \in [M]^*$, and $F_r$ such that $F_t \leq F_r \forall_t < r$. The family of RS nested codes may be denoted RS(n, $F_{0 \to M}$), and may be expressed according to Equation 14 below:

$$RS(n, F_M) \subset RS(n, F_{M-1}) \subset \ldots \subset RS(n, F_0) \quad \text{(Equation 14)}$$

The RS code $F_t \to F_r$ coset ($F_t \leq F_r$) may be denoted $H_{F_t \to F_r}$, and may be expressed according to Equation 15 below:

$$H_{F_t \to F_r} = \quad \text{(Equation 15)}$$

$$\begin{bmatrix} 1 & \alpha^{(F_t+1)} & \alpha^{(F_t+1)} & \alpha^{(F_t+1)} & \ldots & \alpha^{(F_t+1)(n-1)} \\ \ldots & \ldots & \ldots & \ldots & \ldots & \ldots \\ 1 & \alpha^{F_r-1} & \alpha^{2 \cdot (F_r-1)} & \alpha^{3 \cdot (F_r-1)} & \ldots & \alpha^{(F_r-1)(n-1)} \\ 1 & \alpha^{F_r} & \alpha^{2 \cdot F_r} & \alpha^{3 \cdot F_r} & \ldots & \alpha^{F_r \cdot (n-1)} \end{bmatrix}$$

The RS transform may then be defined according to Equation 16, with the corresponding transform space symbol represented according to Equation 17, and the transform space defined according to Equation 18 below:

$$R_t \triangleq H_{F_{t-1} \to F_t}, t \in [M] \quad \text{(Equation 16)}$$

$$s_t = R_t \cdot x \quad \text{(Equation 17)}$$

$$s \triangleq \begin{bmatrix} R_1 \\ R_2 \\ \vdots \\ R_M \end{bmatrix} \cdot x \triangleq R \cdot x \quad \text{(Equation 18)}$$

According to embodiments, a code GRS(n, $F_M$, α, v) may be a GRS code which is a generalization of the RS codes presented above, having a parity check matrix defined with the parameters $\{\alpha_i\}_{i=1}^n (\alpha_i \in GF(2^m))$ and $\{v_i \in (v_i \in GF(2^m)$ and $v_i \neq 0)$.

The parity check matrix of such a GRS code may be represented as shown in Equation 19 below:

$$H_F^{GRS} = \begin{bmatrix} 1 & 1 & 1 & 1 & \ldots & 1 \\ \alpha_1 & \alpha_2 & \alpha_3 & \alpha_4 & \ldots & \alpha_n \\ \alpha_1^2 & \alpha_2^2 & \alpha_3^2 & \alpha_4^2 & \ldots & \alpha_n^2 \\ \ldots & \ldots & \ldots & \ldots & \ldots & \ldots \\ \alpha_1^{F-2} & \alpha_2^{F-2} & \alpha_3^{F-2} & \alpha_4^{F-2} & \ldots & \alpha_n^{F-2} \\ \alpha_1^{F-1} & \alpha_2^{F-1} & \alpha_3^{F-1} & \alpha_4^{F-1} & \ldots & \alpha_n^{F-1} \end{bmatrix}$$ (Equation 19)

$$\begin{bmatrix} v_1 & 0 & 0 & \ldots & 0 \\ 0 & v_2 & 0 & \ldots & 0 \\ 0 & 0 & \ddots & 0 & \vdots \\ \vdots & \vdots & 0 & v_{n-1} & 0 \\ 0 & 0 & \ldots & 0 & v_n \end{bmatrix} \begin{bmatrix} H_1^{GRS} \\ H_2^{GRS} \\ H_3^{GRS} \\ \vdots \\ H_F^{GRS} \end{bmatrix}$$

As discussed in greater detail below, a 2D-GCC code may be constructed by specially selecting the parameters a and v of a GRS code, and therefore specially constructing the parity check matrix $H_F^{GRS}$ of a GRS code, so that the transposition operations described below work correctly for 2D-GCC decoding.

The GRS syndrome corresponding to $j \in [F]$ on code word $x = \{x_i\}_{i=1}^n$ and $x_i \in GF(2^m)$ may be denoted $s_j$, and may be expressed according to Equation 20 below:

$$s_j = H_j^{GRS} \cdot x = \sum_{i=1}^n x_i \cdot \alpha_i^j \cdot v_i$$ (Equation 20)

To use the GRS code as a constituent code, the GRS nested codes and their transform may be defined as follows. A set of error correction parameters may be denoted $F_t$, $t \in [M]^*$, and $F_r$ such that such that $F_t \leq F$ $\forall t < r$. The family of GRS nested codes may be denoted as GRS(n, $F_{0 \to M}$, α, v), and may be expressed according to Equation 21 below:

GRS(n, $F_M$, α, v) ⊂ GRS(n, $F_{M-1}$, α, v) ⊂ ... ⊂ GRS (n, $F_0$, a, v) (Equation 21)

The GRS code $F_t \to F_r$ coset ($F_t \leq F_r$) may be denoted $H_{Ft \to Fr}^{GRS}$, and may be expressed according to Equation 22 below:

$$H_{F_t \to F_r}^{GRS} = \begin{bmatrix} \alpha_1^{F_t+1} & \alpha_1^{F_t+1} & \alpha_1^{F_t+1} & \ldots & \ldots & \alpha_n^{(F_t+1)} \\ \ldots & \ldots & \ldots & \ldots & \ldots & \ldots \\ \alpha_1^{F_r-1} & \alpha_2^{F_r-1} & \alpha_3^{F_r-1} & \ldots & \ldots & \alpha_n^{F_r-1} \\ \alpha_1^{F_r} & \alpha_2^{F_r} & \alpha_3^{F_r} & \ldots & \ldots & \alpha_n^{F_r} \end{bmatrix}$$ (Equation 22)

$$\begin{bmatrix} v_1 & 0 & 0 & \ldots & 0 \\ 0 & v_2 & 0 & \ldots & 0 \\ 0 & 0 & \ddots & 0 & \vdots \\ \vdots & \vdots & 0 & v_{n-1} & 0 \\ 0 & 0 & \ldots & 0 & v_n \end{bmatrix} \triangleq \begin{bmatrix} H_{F_t}^{GRS} \\ \vdots \\ H_{F_r-2}^{GRS} \\ H_{F_r-1}^{GRS} \end{bmatrix}$$

The GRS transform may then be defined according to Equation 23, with the corresponding transform space symbol represented according to Equation 24, and the transform space defined according to Equation 25 below:

$$R_t^{GRS} \triangleq H_{F_{t-1} \to F_t}^{GRS}, t \in [M]$$ (Equation 23)

$$s_t = R_t^{GRS} \cdot x$$ (Equation 24)

$$s = \begin{bmatrix} s_1 \\ s_2 \\ \ldots \\ s_M \end{bmatrix} \triangleq \begin{bmatrix} R_1^{GRS} \\ R_2^{GRS} \\ \ldots \\ R_M^{GRS} \end{bmatrix} \cdot c \triangleq R^{GRS} \cdot x$$ (Equation 25)

According to embodiments, a GCC may be a code which includes several constituent codes belonging to a nested codes family, a transform to a transform space, and a list of codes in the transform space, with a mapping between the codewords and the transform symbols.

Figure 10:
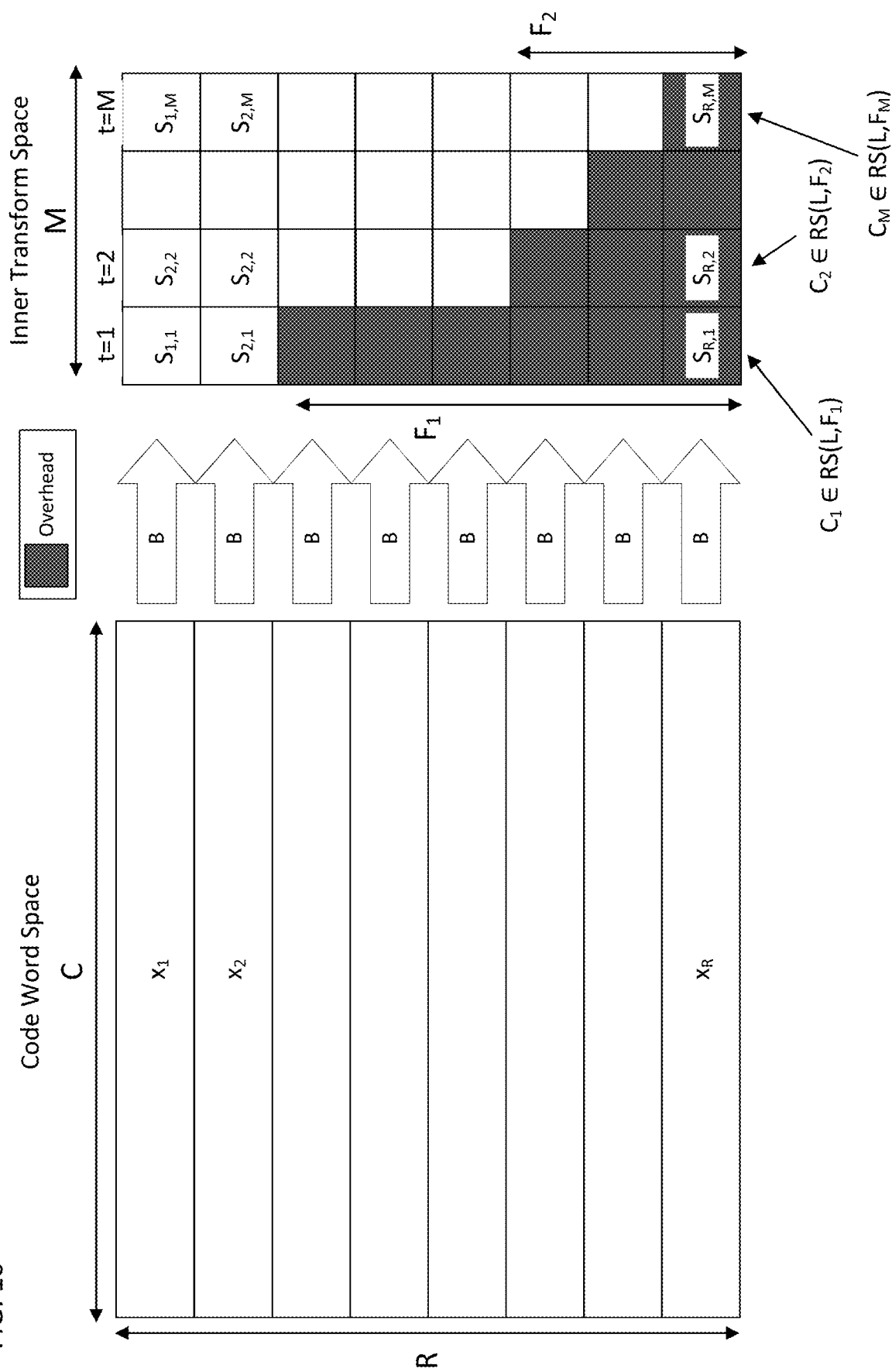
FIG. 10 shows an example code structure of a generalized concatenated code (GCC) code, according to embodiments.

FIG. 10 shows an example code structure of a GCC S-BCH code, according to embodiments. As shown in FIG. 10, a GCC S-BCH code may refer to a concatenation of BCH codes with RS codes. For example, a GCC S-BCH code may relate to a set of nested BCH codes as shown in Equation 14 above, with $t_j = j$.

For R codewords, $x_r$, $r \in [R]$, of length C, the corresponding transform space symbols may be denoted $s_{r,j} = B_j \cdot x_r$ for $\forall j \in [M]$ and $\forall j \in [R]$, where B is defined in Equation 9 above. In embodiments $s_{r,j} \in GF(2^m)$ may be expressed according to Equation 26 below:

$$s_{r,j} = \sum_{c=1}^C x_{rc} \cdot \alpha^{(c-1) \cdot (2 \cdot j - 1)}$$ (Equation 26)

For all $j \in [M]$, the vector of symbols $[s_{r=1,j}, s_{r=2,j}, \ldots s_{r=R,j}]$ may be defined as an RS code word $C_j \in RS(R \; F_j)$ of length R and dimension $K_j$, where $R \leq K_1 \leq K_2 \ldots \leq K_M \leq 0$, or equivalently with $R \geq F_1 \geq F_2 \ldots \geq F_M \geq 0$, ($F_j = R - K_j \forall j \in [M]$), as shown in FIG. 10. The corresponding RS syndrome may be denoted $p_{j,i}$, and may be expressed according to Equation 27 below:

$$p_{j,i} = \sum_{r=1}^R s_{r,j} \cdot \alpha^{(r-1) \cdot i} = \sum_{r=1}^R \sum_{c=1}^C x_{rc} \cdot \alpha^{(c-1) \cdot (2 \cdot j - 1)} \cdot \alpha^{(r-1) \cdot i}, j \in [M], i \in [F_j]$$ (Equation 27)

The (binary) vector x may be expressed according to Equation 28 below, the ($GF(2^m)$) vector p may be expressed according to Equation 29 below:

x=[$x_{11}, x_{12}, \ldots, x_{1c}, x_{21}, \ldots x_{2c}, \ldots, x_{R1}, \ldots X_{RC}$] (Equation 28)

p=[$p_{11}, p_{12}, \ldots, p_{1F1}, p_{21}, \ldots, p_{2F2}, \ldots, p_{M1}, \ldots p_{MF_M}$] (Equation 29)

Accordingly, the GCC parity matrix H GCC may be defined according to Equation 27 above and expressed according to Equation 30 below:

p=$H_{GCC} \cdot x$=0 (Equation 30)

The total number of equations in $GF(2^m)$ in $H_{GCC}$ may be F=>j=1 may represent m. F binary constraints which define the [m·F]×[R·C] binary parity check matrix H GCC, applied on the binary vector x. Some of the rows in H GCC may be dependent, thus the code overhead may have an upper bound of m. F bits. The GCC S-BCH code may be denoted as GCC(R, M, C, $\{F_j\}_{j=1}^M$, B).

In embodiments, a GCC S-BCH encoder may be defined using the parity check matrix. For example, Gaussian elimination may be applied on $H_{GCC}$ with consecutive row operations generating a matrix Q such that $Q \cdot H_{GCC}=[D\ \tilde{A}]$, where D denotes a diagonal matrix with 0 and 1 on the diagonal. The zero rows may be omitted to obtain a P×[R·C] matrix $[I_p\ A]$ where Ip denotes a unity matrix of size P≤m·F. The codeword vector x may be split into information bits i and parity bits p according to Equation 31 below, which may be used to obtain Equation 32.

$$x=[\begin{smallmatrix}i\\p\end{smallmatrix}] \quad \text{(Equation 31)}$$

$$p=A \cdot i \quad \text{(Equation 32)}$$

In embodiments, the GCC S-BCH encoder may be defined according to Equation 32 above.

FIGS. 11A-11D relate to examples of GCC decoding processes for GCC codes such as the GCC S-BCH code discussed above. According to embodiments, the GCC decoding processes may be performed using one or more of the elements described above, for example the storage device 200 discussed above with respect to FIG. 2A, the ECC decoding circuit 520 discussed above with respect to FIG. 2B, the ECC decoder module 824 discussed above with respect to FIG. 8, or any other element.

Figure 11A:
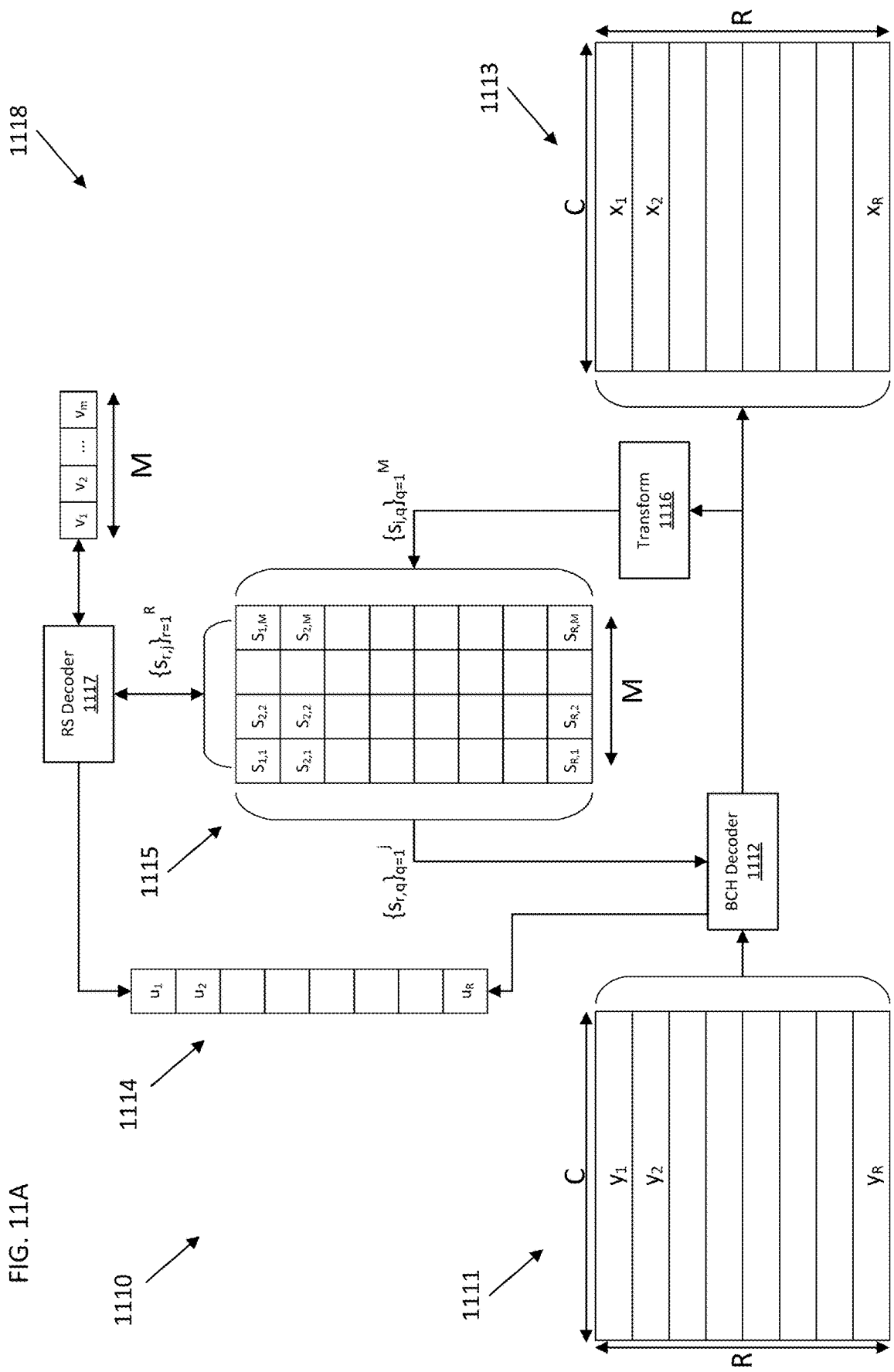
FIG. 11A is a block diagram of a sequential decoder which may be used to perform GCC decoding, according to embodiments.

FIG. 11A shows an example of a sequential decoder system 1110 which may be used to decode GCC codes such as the GCC S-BCH code discussed above. In embodiments, the sequential decoder system 1110 may be included in one or more of the elements discussed above, for example the storage device 200 discussed above with respect to FIG. 2A, the ECC decoding circuit 520 discussed above with respect to FIG. 2B, the ECC decoder module 824 discussed above with respect to FIG. 8. In embodiments, the GCC S-BCH structure may allow a codeword to be decoded using a GCC decoding algorithm that may include sequential activations of coset BCH decoders followed by activation of an RS decoder, until the entire GCC codeword is decoded.

As shown in FIG. 11A, the sequential decoder system 1110 may include a coset BCH decoder 1112, a transform module 1116, and an RS decoder 1117. The sequential decoder system 1110 may receive a noisy codeword 1111, which may be denoted as $\{y_r\}_{r=1}^{R}$ where $y_r$ is a vector of log-likelihood ratios (LLRs) of length C corresponding to a row r. The coset BCH decoder 1112 may be used row-by-row to generate decoded BCH codewords 1113, which may IR, based on be denoted $\{x_r\}_{r=1}^{R}$, and BCH symbol statuses 1114, which may be denoted $\{u_r\}_{r=1}^{R}$, the LLRs and the transform space 1115 (e.g., the cosets of the decoded BCH codewords 1113, which may be denoted $\{s_{r,q}\}_{q=1}^{j}$). A transform module 1116 may generate updated transform space symbols, which may be denoted $\{S_{i,q}\}_{q=1}^{M}$, for example by applying the transform B to the output of the coset BCH decoder 1112. In embodiments, the output of the coset BCH decoder 1112 may be expressed according to Equation 33 below:

$$[u,x_r]=\text{Decoder}_{BCH}(y_r, \{s_{r,j}\}_{j=1}^{q}) \quad \text{(Equation 33)}$$

According to Equation 33, for each row r, the coset BCH decoder 1112 may return a decoding status u, where u=True indicates success, and u=False indicates failure, and a decoded BCH codeword $x_r$, where x, satisfies Equation 34 below:

$$B_j \cdot x_r = s_{r,j} \forall j \in [q] \quad \text{(Equation 34)}$$

Based on the coset BCH decoder 1112 returning a decoding status u=True for a row r, the sequential decoder 1110 may update the corresponding BCH codeword $x_r$ of the decoded BCH codewords 1113 and the corresponding BCH symbol status $u_r$ of the BCH symbol statuses 1114 accordingly.

The RS decoder 1117 may receive RS symbols $\{s_{r,j}\}_{r=1}^{R}$ obtained based on the transform space 1115, as well as the BCH symbol statuses 1114 (e.g., $\{u_r\}_{r=1}^{R}$) and Fj corresponding the RS codes. The RS decoder 1117 may perform RS decoding and may output the corrected symbols $\{s_{r,j}\}_{r=1}^{R}$ and updated BCH symbol statuses $\{u_r\}_{r=1}^{R}$. For example, based on a BCH symbol status being True, but the RS decoder 1117 finding an error, the BCH symbol status may be updated to False. The RS decoder 1117 may also output RS decoding statuses 1118, which may be denoted $\{vj\}_{j=1}^{M}$.

The output of the RS decoder 1117 may be expressed according to Equation 35 below:

$$[vj], [s_{r,j}]_{r=1}^{R}, \{u_r\}_{r=1}^{R}]=\text{Decoder}_{RS}(\{s_{r,j}\}_{r=1}^{R}, Fj) \quad \text{(Equation 35)}$$

FIG. 11B illustrates an example of a sequential decoding algorithm which may be used to perform GCC decoding, presented in pseudo-code as Algorithm 1. In embodiments, Algorithm 1 may be performed by the sequential decoder 1110 discussed above.

Figure 11C:
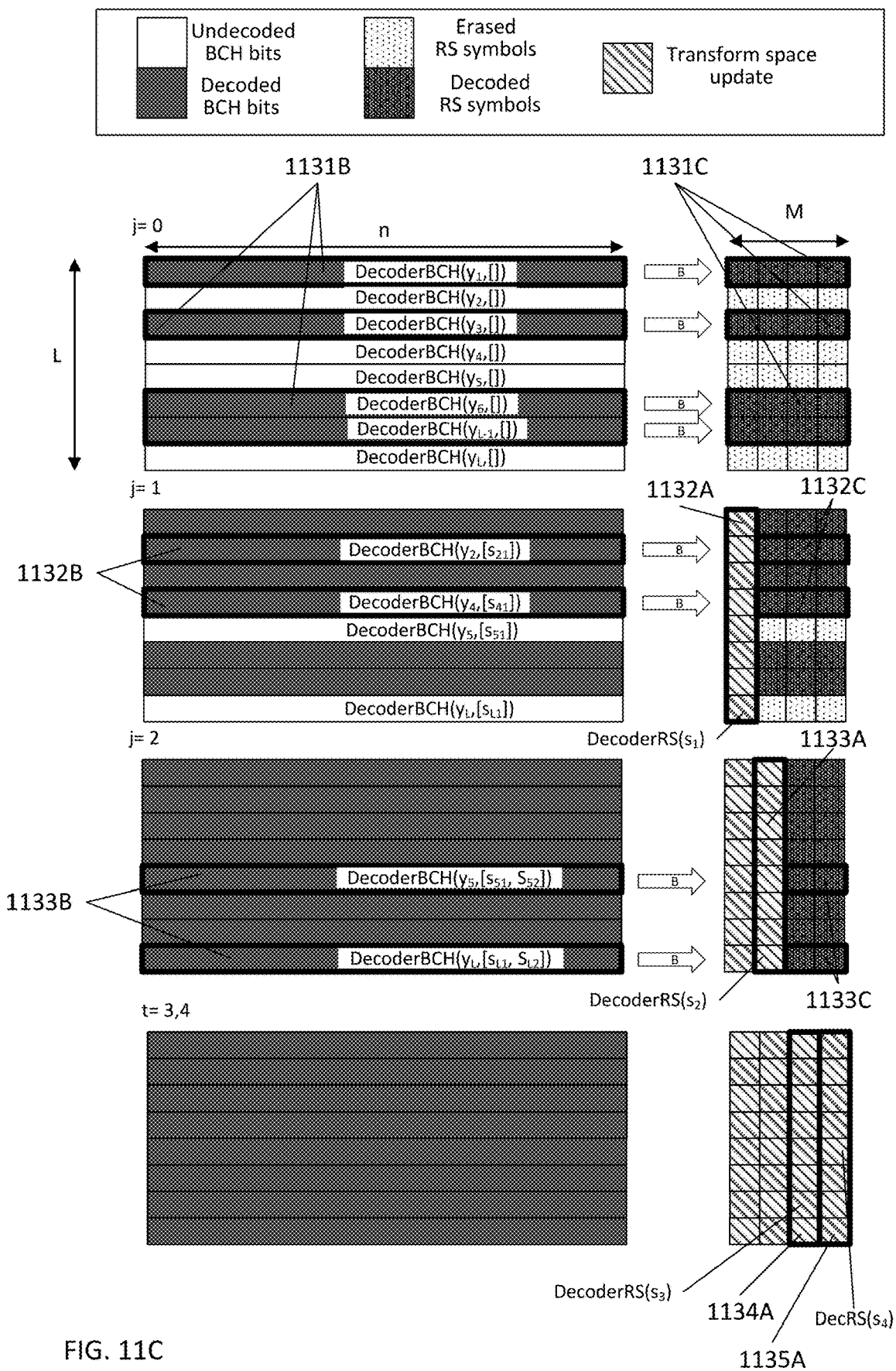
FIG. 11C illustrates an example decoding order, according to embodiments.

FIG. 11C illustrates an example decoding order which may correspond to the GCC decoding algorithm discussed above.

As shown in FIG. 11C, at t=0, the RS decoder 1117 may not be applied, and the coset BCH decoder 1112 may be applied without coset values. In the example shown in FIG. 11C, four rows are decoded successfully at operation 1131B, and the corresponding portions of the transform space 1115 are updated at operation 1131C.

For t=1, the RS decoder 1117 may correct the missing symbols at operation 1132A, and the coset BCH decoder 1112 may be applied on the four remaining rows with one coset symbol at operation 1132B. In the example shown in FIG. 11C, two rows are decoded successfully at operation 1132B, and the corresponding portions of the transform space 1115 are updated at operation 1132C.

For t=2, the RS decoder 1117 may correct the missing symbols at operation 1133A, and the coset BCH decoder 1112 may be applied on the two remaining rows with two coset symbols at operation 1133B. In the example shown in FIG. 11C, the two remaining rows are decoded successfully at operation 1133B, and the corresponding portions of the transform space are updated at operation 1133C.

For t=3, the RS decoder 1117 may correct the missing symbols at operation 1134A. In the example shown in FIG. 11C, this may include simply validating that the symbols are valid, because there are no erased symbols remaining, and therefore no need to apply steps B and C of the GCC decoding algorithm.

For t=4, the RS decoder 1117 may correct the missing symbols at operation 1135A. In the example shown in FIG. 11C, this may include simply validating that the symbols are valid, because there are no erased symbols remaining, and therefore no need to apply steps B and C of the GCC decoding algorithm.

Figure 11D:
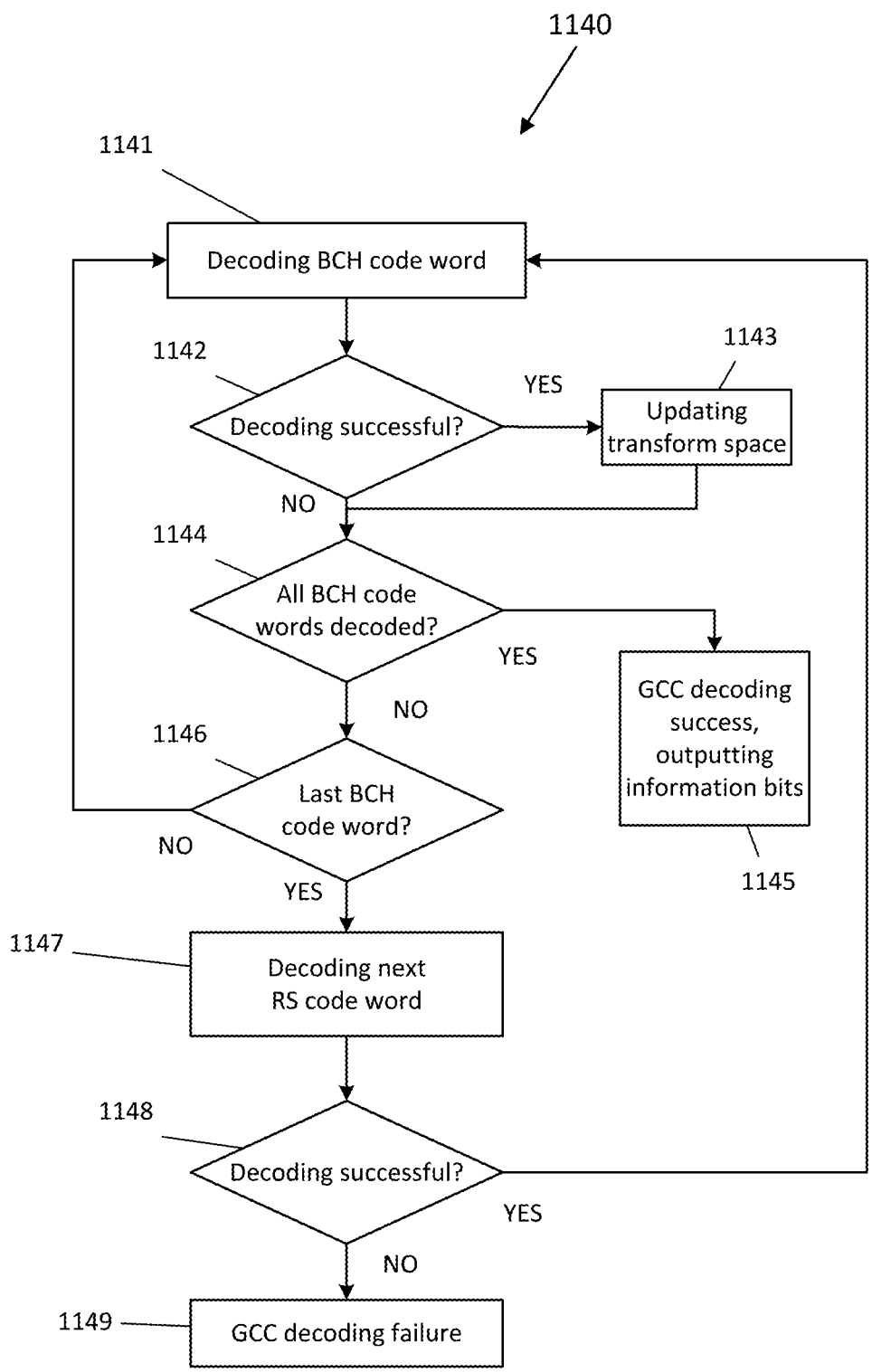
FIG. 11D is a flowchart of a decoding process, according to embodiments.

FIG. 11D is a flowchart of a decoding process, according to embodiments. For example, process 1140 as shown in FIG. 11D may correspond to some or all of Algorithm 1 discussed above. In embodiments, some or all of process 1140 may be performed by the sequential decoder 1110 discussed above. For example, at operation 1141, the process 1140 may include decoding a next BCH codeword (or, for example, a first BCH codeword). At operation 1142, the process 1140 may include determining whether decoding was successful. Based on determining that decoding was successful (YES at operation 1142), the process 1140 may proceed to operation 1143, and update the transform space based on the decoded BCH codeword. Based on determining that decoding was not successful (NO at operation 1142), the process 1140 may proceed to operation 1144, which may include determining whether all BCH codewords have been decoded. Based on determining that all BCH codewords have been decoded (YES at operation 1144), the process 1140 proceed to operation 1145, at which GCC decoding is successful, and the information bits may be output. Based on determining that all BCH codewords have not been decoded (NO at operation 1144), the process 1140 may proceed to operation 1146, which may include determining whether the last BCH codeword has been reached. Based on determining that the last BCH codeword has been reached (YES at operation 1146), the process 1140 may proceed to operation 1147. Based on determining that the last BCH codeword has not been reached (NO at operation 1146), the process 1140 may return to operation 1141, and decode the next BCH codeword.

At operation 1147, the process 1140 may include decoding a next RS codeword (or, for example, a first BCH codeword). At operation 1148, the process 1140 may include determining whether decoding was successful. Based on determining that decoding was successful (YES at operation 1148), the process 1140 may return to operation 1141, and may begin the next round of the decoding algorithm. Based on determining that decoding was not successful (NO at operation 1148), the process 1140 may proceed to operation 1149, at which the GCC decoding may be determined to be a failure.

Figure 12A:
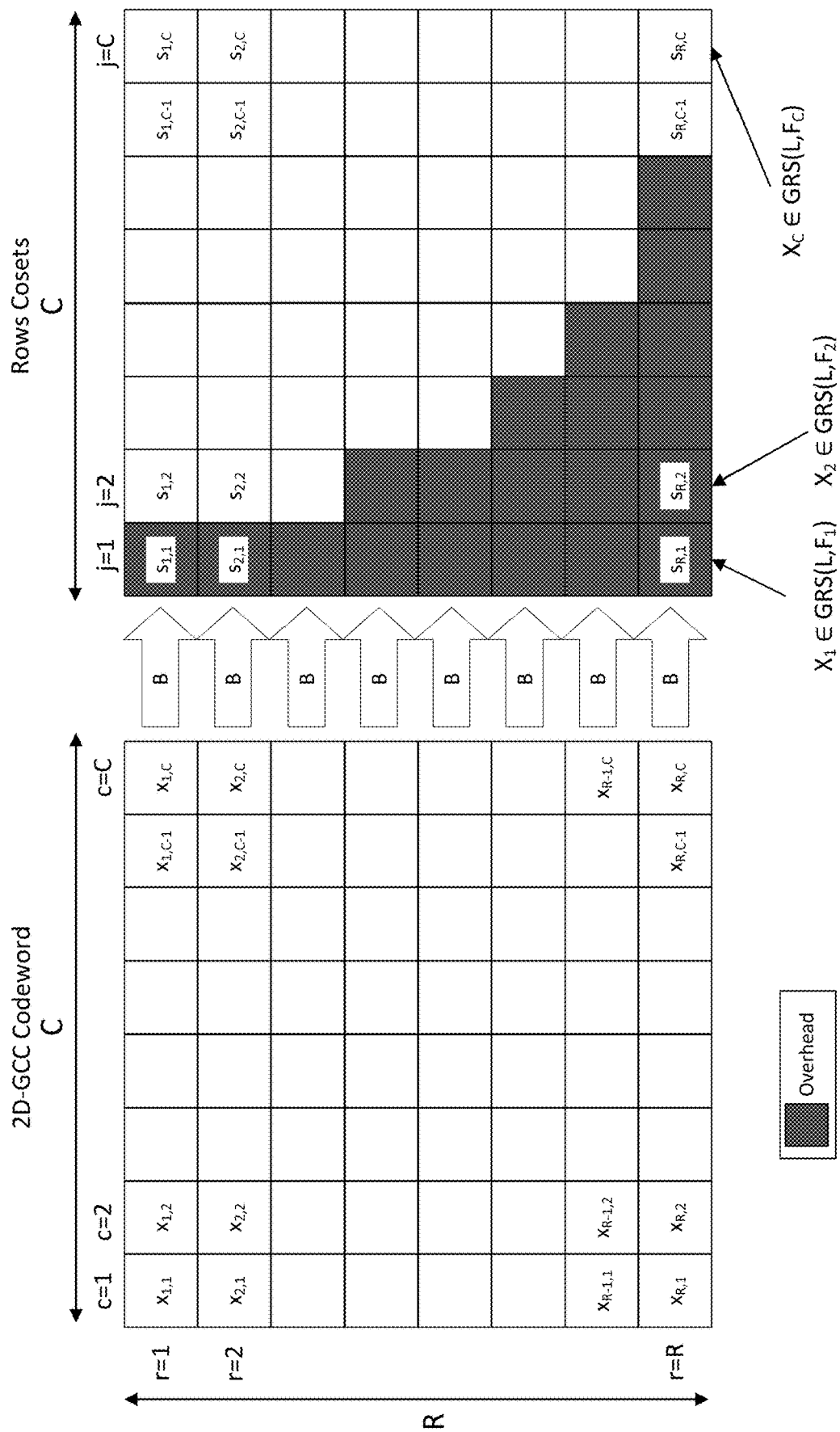
FIGS. 12A-12C illustrate an example of a code structure for a two-dimensional GCC(2D-GCC) code, according to embodiments.
Figure 12B:
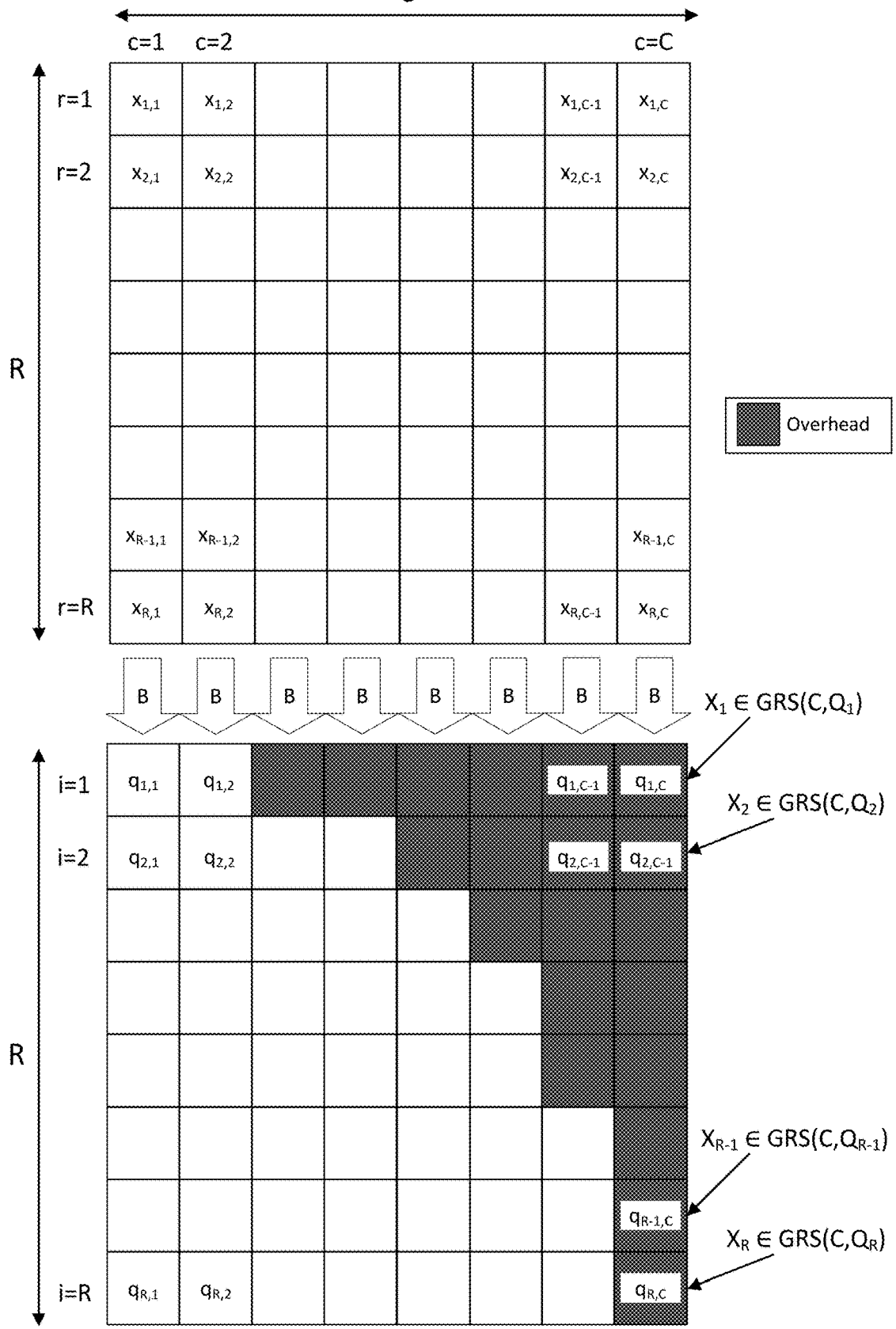
Figure 12C:
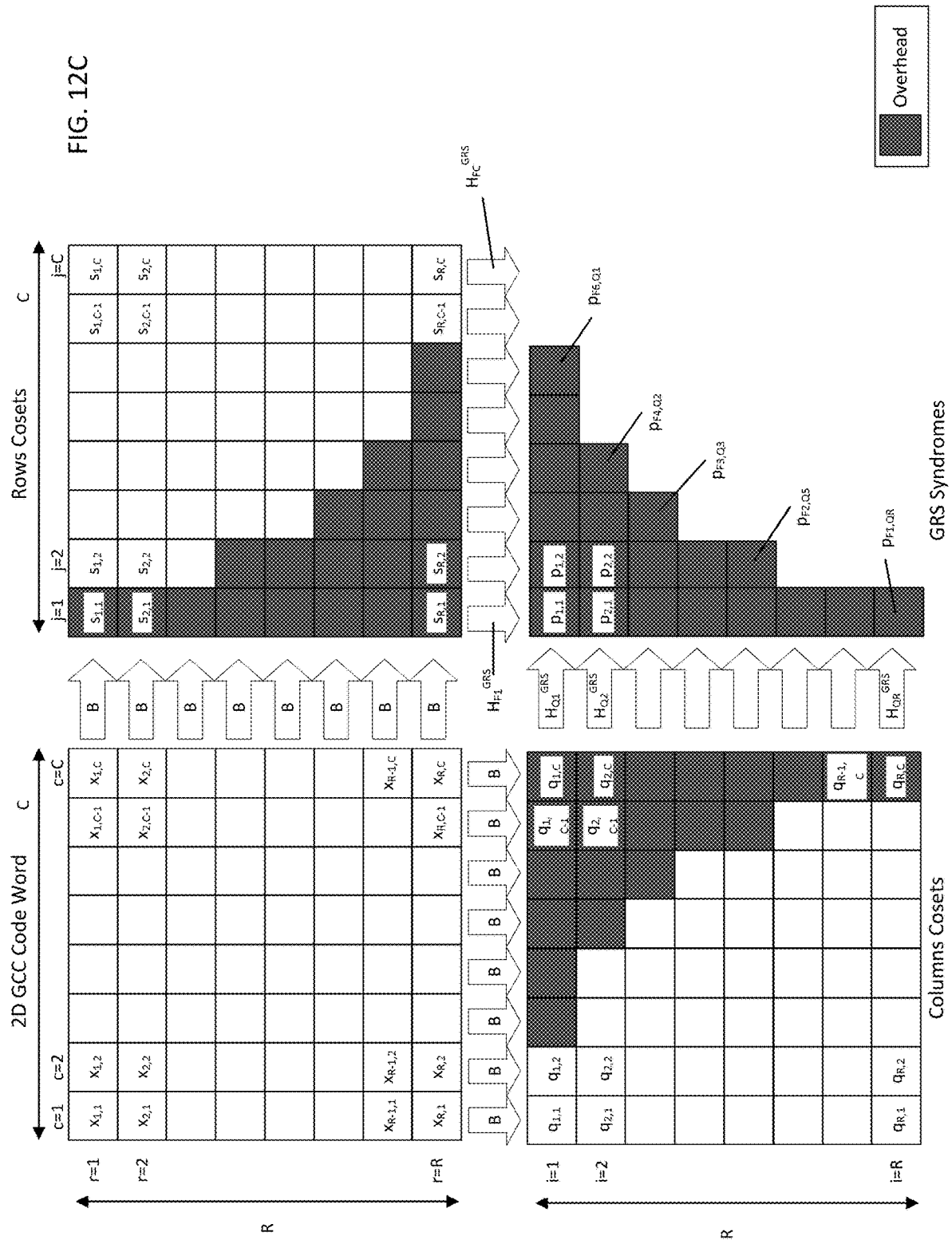

FIGS. 12A-12C show an example code structure of a 2D-GCC code, according to embodiments. As shown in FIGS. 12A-12C, a 2D-GCC code may refer to a concatenation of BCH codes with GRS codes having specially selected parameters. For example, instead of the RS code discussed above with reference to the GCC S-BCH code (e.g., $x \in RS(n, Fj)$), a 2D-GCC code according to embodiments may include a GRS code $GRS(n, F, \{\alpha_i\}_{i=1}^n, \{v_i\}_{i=1}^n)$ with parameters which may be defined according to Equation 36 and Equation 37 below:

$$\alpha_i = \alpha^{2i-2} \quad \text{(Equation 36)}$$

$$v_i = \alpha^{-i+1} \quad \text{(Equation 37)}$$

The corresponding GRS syndrome on word $x=\{x_i\}_{i=1}^n$ and $x_i \in GF(2^m)$, may be expressed according to Equation 38 below:

$$H_j^{GRS} \cdot x = \sum_{i=1}^n x_i \cdot \alpha_i^j \cdot v_i = \quad \text{(Equation 38)}$$

$$\sum_{i=1}^n x_i \cdot \alpha^{(2i-2) \cdot j} \cdot \alpha^{-i+1} = \sum_{i=1}^n c_i \cdot \alpha^{(2j-1)(i-1)}$$

According to embodiments, the usage of those parameters applied on a binary word may result in an effective BCH code. The corresponding GRS syndrome on a binary word $x=\{x_i\}_{i=1}$ and $x_i \in GF(2)$, may be expressed according to Equation 39 below:

$$H_j^{GRS} \cdot x = \sum_{i=1}^n x_i \cdot \alpha^{(2j-1)(i-1)} = H_j^{BCH} \cdot x \quad \text{(Equation 39)}$$

Accordingly, the GRS code $GRS(n, F, \{\alpha_i\}_{i=1}^n, \{v_i\}_{i=1}^n)$, may be viewed as a RS code applied on a $GF(2^m)$ word and $d_{min}=F+1$ (with a correction capability of F erasures), and may also be viewed as as a BCH code applied on a GF(2) word with correction capability of F errors according to Equation 40 below:

$$\frac{\lfloor d_{min} - 1 \rfloor}{2} = t = F \quad \text{(Equation 40)}$$

According to embodiments, a 2D-GCC S-BCH code may be expressed as an R×C binary matrix x, with elements $xxc \in GF(2)$, $r \in [R]$, $c \in [C]$. A row in this matrix may be denoted x, and a column in this matrix may be denoted $x_c^T$. For convenience of description, embodiments are described herein in which R=C=M, however embodiments are not limited thereto. For example, embodiments may also be applied in situations in which R+C. In addition, it may be possible to use degenerated RS codes with $d_{min}=1$ or $d_{min}=R$.

According to embodiments, the 2D-GCC S-BCH code constructed using the GRS codes as discussed above may be viewed as a GCC S-BCH code with respect to the binary matrix x (e.g., from a perspective corresponding to rows of the binary matrix x), and may also be viewed as a G-CC SBCH code with respect to the transposed binary matrix $x^T$ (e.g., from a perspective corresponding to columns of the binary matrix x). For example, FIG. 12A shows an example 2D-GCC codeword construction from a rows perspective, FIG. 12B shows the corresponding 2D-GCC codeword construction from a columns perspective, and FIG. 12C demonstrates that the two perspectives are equivalent.

FIG. 12A shows an example 2D-GCC codeword construction from a rows perspective. In particular, FIG. 12A shows a GCC S-BCH code GCC(R, C, C, $\{F_j\}_{j=1}^c$, B) including a concatenation of BCH codes and GRS codes. The corresponding transform space symbols $S_{r,c}$ may be defined according to Equation 41 below, where $B_c$ is defined according to Equation 9, and $S_{rc} \in GF(2^m)$.

$$S_{r,c} = B_c \cdot x_r, \forall c \in [C] \text{ and } \forall r \in [R] \quad \text{(Equation 41)}$$

Next, for all $c \in [C]$, the vector of symbols $[s_{r=1,c}, s_{r=2,c}, \ldots s_{r=R,c}]$ defined as a GRS codeword $X_j \in GRS(R, F_j, \alpha, v)$ of length R and dimension Kc, where $R \leq K_1 \leq K_2 \ldots \leq K_c \leq 0$, or equivalently with $F_1 \geq F_2 \ldots \geq F_c$, ($F_j = R - K_c \forall j \in [C]$).

FIG. 12B shows the corresponding 2D-GCC codeword construction from a columns perspective. In particular, FIG. 12B shows a GCC S-BCH code GCC(C, R, R, $\{Q_i\}_{i=1}^R$, B, GRS($\alpha$, v)) including a concatenation of BCH codes and GRS codes. The corresponding transform space symbols $q_{r,c}$ may be defined according to Equation 42 below, where $B_r$ is defined in Equation 9, and $q_{rc} \in GF(2^m)$:

$$q_{r,c} = B_r \cdot x_c^T, \forall c \in [C] \text{ and } \forall r \in [R] \quad \text{(Equation 42)}$$

Next, for all $r \in [R]$, the vector of symbols $[q_{r,c=1}, q_{r,c=2}, \ldots q_{r,c=C}]$ may be defined as a GRS codeword $X_i \in GRS(R, Q_i, \alpha, v)$ of length C and dimension $K_i$, where $C \leq K_1 \leq K_2 \ldots \leq K_R \leq 0$, or equivalently with $Q_1 \geq Q_2 \ldots \geq Q_R$, ($Q_i = C - K_i \forall i \in [R]$).

As discussed above, the row construction of the 2D-GCC S-BCH code according to FIG. 12A and the column construction of the 2D-GCC S-BCH code according to FIG. 12B are identical. According to embodiments, this can be seen by comparing the parity check matrix of the GCC codes for both constructions. Below is an example demonstrating that the parity check matrix applied on the codeword x includes all of the GRS syndromes of the transform space.

From the rows perspective, the row transform space (e.g., the cosets of the row BCH codewords) may be defined by the BCH code transform according to Equation 43 below:

$$s_{rj} = \sum_{c=1}^{C} x_{rc} \cdot \alpha^{(c-1)\cdot(2\cdot j-1)}, r \in [R],$$ (Equation 43)

$$j \in [C], x_{rc} \in GF(2), s_{rj} \in GF(2^m)$$

The corresponding GRS column syndromes may be defined according to Equation 44 below:

$$p_{ij} = \sum_{r=1}^{R} s_{rj} \cdot \alpha^{(r-1)(2\cdot i-1)}, j \in [C],$$ (Equation 44)

$$i \in [F_j], p_{ij} \in GF(2^m), s_{rj} \in GF(2^m)$$

From the columns perspective, the column transform space (e.g., the cosets of the column BCH codewords) may be defined by the BCH code transform according to Equation 45 below:

$$q_{ic} = \sum_{r=1}^{R} x_{rc} \cdot \alpha^{(r-1)\cdot(2\cdot i-1)}, r \in [R],$$ (Equation 45)

$$c \in [C], x_{ic} \in GF(2), q_{rc} \in GF(2^m)$$

The corresponding GRS row syndromes may be defined according to Equation 46 below:

$$\hat{p}_{ij} = \sum_{c=1}^{C} q_{ic} \cdot \alpha^{(c-1)\cdot(2\cdot j-1)}, j \in [Q_i],$$ (Equation 46)

$$i \in [R], q_{ic} \in GF(2^m), p_{ij} \in GF(2^m)$$

To show equivalence between the two perspectives, it may be sufficient to show that $p_{ij} = \hat{p}_{ij}$ for all relevant (i, j) pairs: i=1 . . . . R and c= [$F_1$, . . . , $F_R$] or alternatively c=1 . . . . C and r= [$Q_1$, . . . , $Q_c$].

This may be shown by applying Equation 43, Equation 44, Equation 45, and Equation 46, and changing the order of summation as shown below in Equation 47:

$$p_{ij} = \sum_{r=1}^{R} \left( \sum_{c=1}^{C} x_{rc} \cdot \alpha^{(c-1)\cdot(2\cdot j-1)} \right) \cdot \alpha^{(r-1)(2\cdot i-1)} =$$ (Equation 47)

$$\sum_{c=1}^{C} \left( \sum_{r=1}^{R} x_{rc} \cdot \alpha^{(r-1)(2\cdot i-1)} \right) \cdot \alpha^{(c-1)\cdot(2\cdot j-1)} = \hat{p}_{ij}$$

This is shown schematically in FIG. 12C.

According to embodiments, an encoder scheme for the 2D-GCC S-BCH code may be substantially similar to the encoder scheme discussed above with reference to the GCC S-BCH code. In addition, the parity-check matrix Hecc for the 2D-GCC S-BCH code may be similar to the parity check matrix for the GCC S-BCH code, except that instead of the RS syndromes used for the GCC S-BCH code, the parity-check matrix for the 2D-GCC S-BCH code may use GRS syndromes defined according to Equation 44 or Equation 46, such that equation 48 below is satisfied:

$$p_{ij}=0, \forall j, i \text{ s.t.} j \in [C], i \in [F_j]$$ (Equation 48)

The 2D-GCC S-BCH code construction according to embodiments may provide a significant benefit over the GCC S-BCH code discussed above, in that the 2D-GCC S-BCH code may be decoded using a multi-stage iterative decoder that iterates between a GCC decoder from the rows perspective and a GCC decoder from the columns perspective. An example of a modified GCC sequential decoder suitable for use in a 2D-GCC decoder is described below with reference to FIGS. 13A-13C, and two particular examples of 2D-GCC decoders which use the modified GCC sequential decoder as a building block are described below with reference to FIGS. 14A-14B.

Figure 13A:
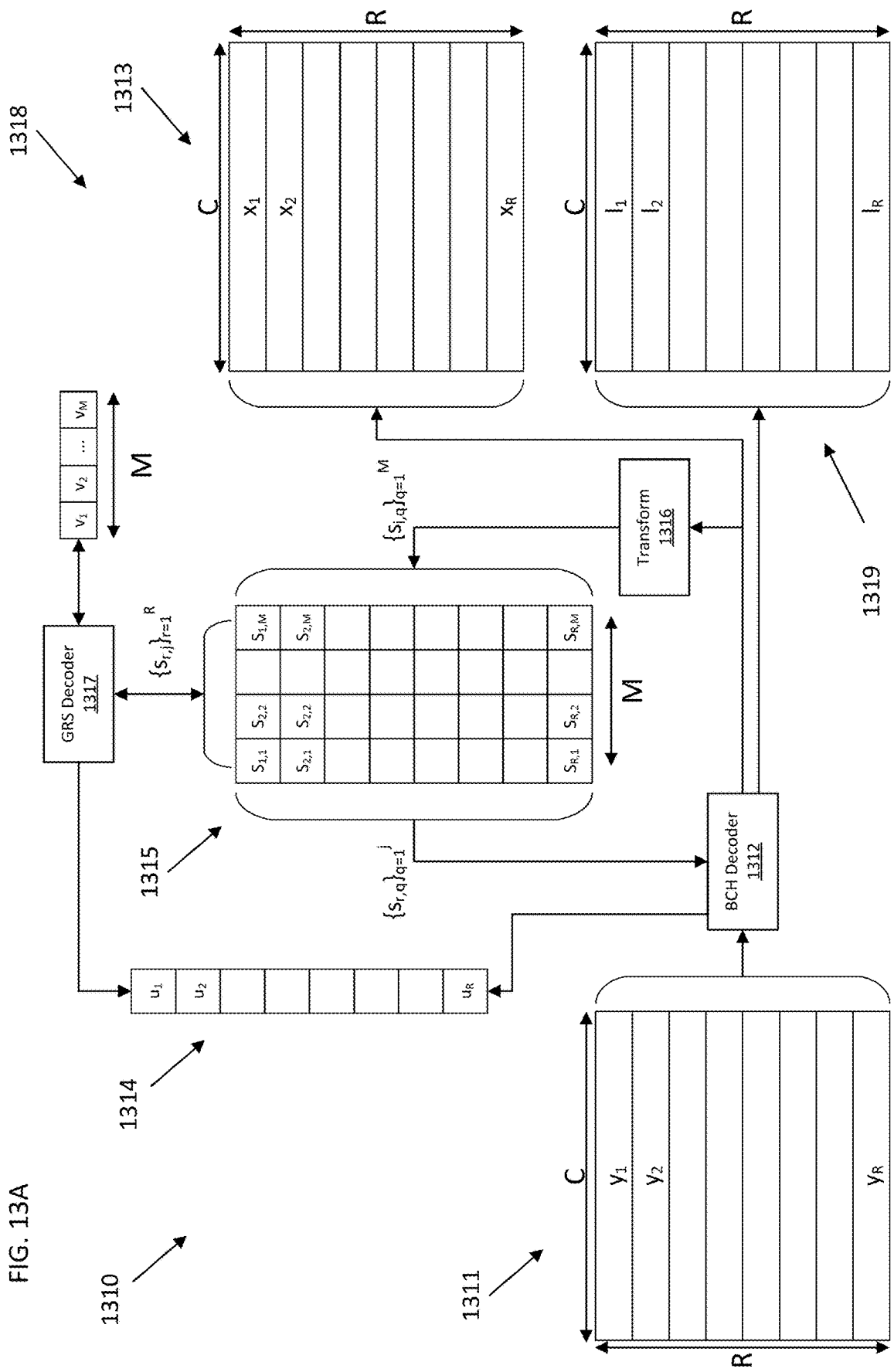
FIG. 13A is a block diagram of a modified sequential decoder which may be used to perform GCC decoding in an iterative 2D-GCC decoder, according to embodiments.
Figure 13C:
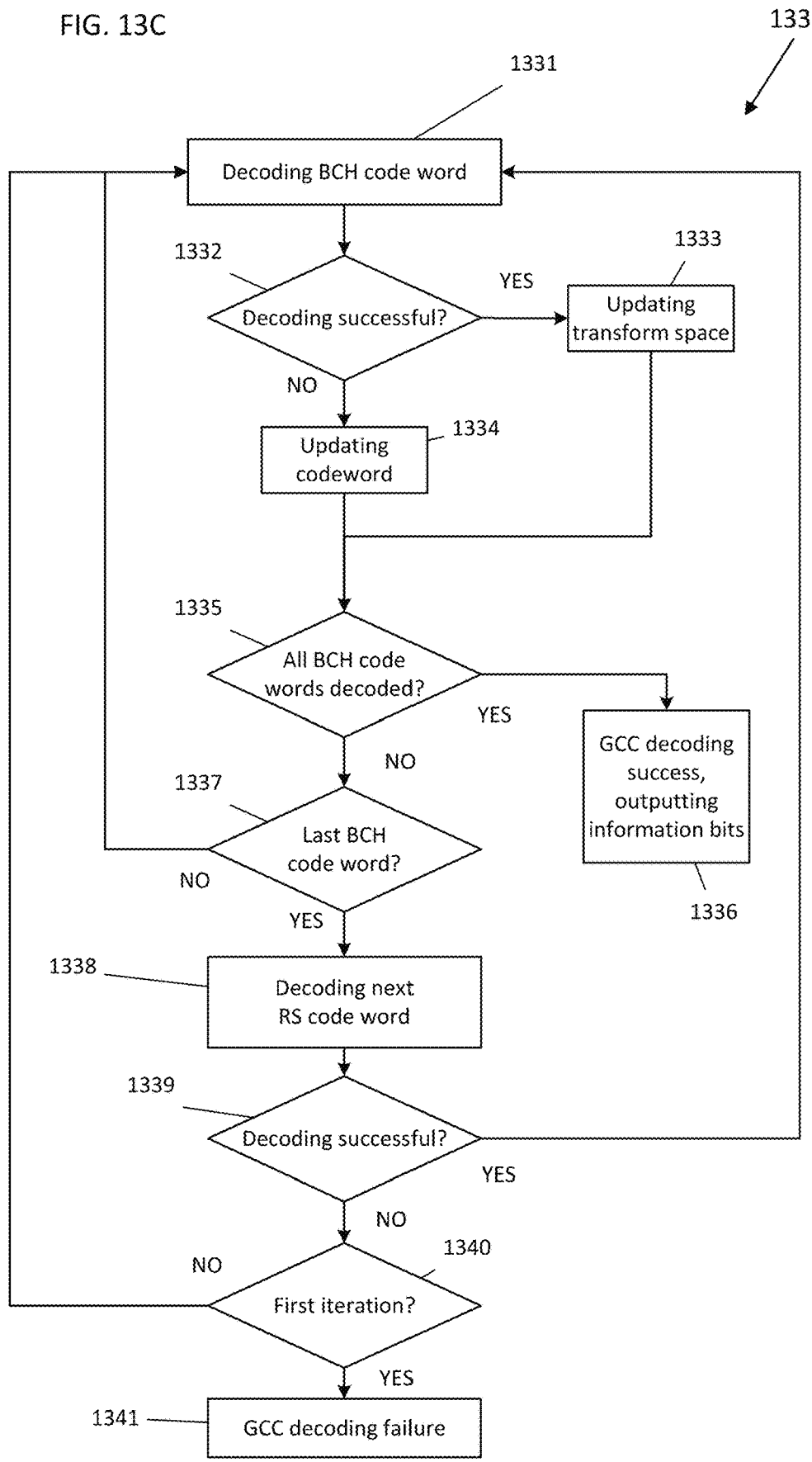
FIG. 13C is a flowchart of a decoding process, according to embodiments.

FIGS. 13A-13C relate to examples of the modified GCC sequential decoder which may be used in a 2D-GCC decoder, according to embodiments. According to embodiments, the GCC decoding processes described below may be performed using one or more of the elements described above, for example the storage device 200 discussed above with respect to FIG. 2A, the ECC decoding circuit 520 discussed above with respect to FIG. 2B, the ECC decoder module 824 discussed above with respect to FIG. 8, or any other element.

FIG. 13A shows an example of a sequential decoder system 1310 which may be used as a building block in a 2D-GCC decoder. In embodiments, the sequential decoder 1310 may be included in one or more of the elements discussed above, for example the storage device 200 discussed above with respect to FIG. 2A, the ECC decoding circuit 520 discussed above with respect to FIG. 2B, the ECC decoder module 824 discussed above with respect to FIG. 8.

In embodiments, the sequential decoder 1310 may be similar to the sequential decoder 1110 discussed above with reference to FIG. 11A. For example, the sequential decoder 1310 may include a coset BCH decoder 1312 which may correspond to the coset BCH decoder 1112, and a transform module 1316 which may correspond to the transform module 1116. In addition, the sequential decoder 1310 may receive a noisy codeword 1311, which may correspond to the noisy codeword 1111, and the coset BCH decoder 1312 may generate decoded BCH codewords 1313, which may correspond to decoded BCH codewords 1113. Further, the sequential decoder 1310 may generate BCH symbol statuses 1314, which may correspond to the BCH symbol statuses 1114, and may obtain a transform space 1315 which may correspond to the transform space 1315. For convenience of description, redundant or duplicative descriptions of these elements may be omitted.

According to embodiments, the sequential decoder 1310 may differ from the sequential decoder 1110 in that, in addition to the outputs specified in Equation 33, the coset BCH decoder 1312 may further output an LLR value l corresponding to each bit after decoding. Accordingly, the output of the coset BCH decoder 1312 may be expressed according to Equation 49 below:

$$[u, x, l] = \text{Decoder}_{BCH}(1_r, \{s_{r,q}\}_{q=1}^{j})$$ (Equation 49)

In embodiments, the LLR values l may be stored as output LLR values 1319, which may be output by the sequential decoder 1310 as $\{l_r^{out}\}_{r=1}^{R}$. In embodiments, the output LLR values 1319 may be useful in turbo decoding, an example of which is described below with reference to FIG. 14B. Accordingly, in some embodiments, the coset BCH decoder 1312 may operate as a SISO decoder, but embodiments are not limited thereto.

In addition, the sequential decoder 1310 may differ from the sequential decoder 1110 in that the BCH row decoding status 1314 (e.g., $\{u_r\}_{r=1}^{R}$) and the GRS column decoding status 1318 (e.g., $\{v_j\}_{j=1}^{C}$) may be output so that they may be used from one iteration of the 2D-GCC decoder to another. For example, a BCH codeword that was already decoded may not be decoded again in a subsequent iteration. Also, the transform space 1315 (e.g., $\{s_{r,j}\}_{r=1,R,j=1,M}$' may be updated during each iteration, and the decoded BCH codewords 1313 (e.g., $\{x_r\}_{r=1}^R$) may be inputted and outputted by the sequential decoder 1310 so that they may be used as information in subsequent iterations. For example, if a BCH codeword is decoded by a row iteration, it may be used to perform further decoding in a subsequent column iteration.

Further, the sequential decoder 1310 may differ from the sequential decoder 1110 in that, instead of the RS decoder 1117, the sequential decoder 1310 may include a GRS decoder 1317. The GRS decoder 1317 may receive GRS symbols $\{s_{r,j}\}_{r=1}^R$ obtained based on the transform space 1315, as well as the BCH symbol statuses 1314 (e.g., $\{u_r\}_{r=1}^R$) and $F_j$ corresponding the GRS codes. The GRS decoder 1317 may output the corrected symbols $\{s_{r,j}\}_{r=1}^R$ and updated BCH symbol statuses $\{u_r\}$r=1. For example, based on a BCH symbol status being True, but the GRS decoder 1317 finding an error, the BCH symbol status may be updated to False. The GRS decoder 1317 may also output GRS symbols statuses 1318, which may be denoted $\{v_j\}_{j=1}^C$.

The output of the GRS decoder 1317 may be expressed according to Equation 50 below:

$$[v_j], \{s_{r,j}\}_{r=1}^R \{u_r\}_{r=Decoder_{RS}(\{s_{r,j}\}, \{u_r\}_{r=1}^R, F_j)} \quad \text{(Equation 50)}$$

According to embodiments, when used in a 2D-GCC decoder, the sequential decoder 1310 may be applied in rows iterations with the parameters GCC(R, C, C, $\{F_j\}_{j=1}^C$, B, GRS(α, v)) and in columns iterations with the parameters GCC(C, R, R, $\{Q_i\}_{i=1}^R$, B, GRS(α, v)).

FIG. 13B illustrates an example of a sequential decoding algorithm which may be used to perform GCC decoding, presented in pseudo-code as Algorithm 2. In embodiments, Algorithm 2 may be performed by the sequential decoder 1310 discussed above. Algorithm 2 may be similar to Algorithm 1, except that Algorithm 2 may include a variable is_first_time, which may be used to ensure that the coset BCH decoder 1312 is applied at least once. In addition, if some of the codeword is known (e.g., Xrc # NAN) (where NAN denotes "not a number"), the absolute value of the corresponding likelihood ratio l may be set to maximum (e.g., MAX) and the sign may be set according to the bit xrc.

FIG. 13C is a flowchart of a decoding process, according to embodiments. For example, process 1330 as shown in FIG. 13C may correspond to some or all of Algorithm 2 discussed above. In embodiments, some or all of process 1330 may be performed by the sequential decoder 1310 discussed above. For example, at operation 1331, the process 1330 may include decoding a next BCH codeword. At operation 1332, the process 1330 may include determining whether decoding was successful. Based on determining that decoding was successful (YES at operation 1332), the process 1330 may proceed to operation 1333, and update the transform space based on the decoded BCH codeword. Based on determining that decoding was not successful (NO at operation 1332), the process 1330 may proceed to operation 1334, which may include updating the BCH codeword based on the result of the decoding, and then to operation 1335, which may include determining whether all BCH codewords have been decoded. Based on determining that all BCH codewords have been decoded (YES at operation 1335), the process 1330 proceed to operation 1336, at which GCC decoding is successful, and the information bits may be output. Based on determining that all BCH codewords have not been decoded (NO at operation 1335), the process 1330 may proceed to operation 1337, which may include determining whether the last BCH codeword has been reached. Based on determining that the last BCH codeword has been reached (YES at operation 1337), the process 1330 may proceed to operation 1338. Based on determining that the last BCH codeword has not been reached (NO at operation 1337), the process 1330 may return to operation 1331, and decode the next BCH codeword.

At operation 1338, the process 1330 may include decoding a next RS codeword. At operation 1339, the process 1330 may include determining whether decoding was successful. Based on determining that decoding was successful (YES at operation 1339), the process 1330 may return to operation 1331, and begin the next round of the decoding algorithm. Based on determining that decoding was not successful (NO at operation 1339), the process 1330 may proceed to operation 1340, which may include determining whether the process 1330 is on the first iteration. Based on determining that the process 1330 is on the first iteration (YES at operation 1340), the process 1330 may return to operation 1331, and begin the next round of the decoding algorithm. Based on determining that that the process 1330 is not on the first iteration (NO at operation 1340), the process 1330 may proceed to operation 1341 at which the GCC decoding may be determined to be a failure.

Figure 14A:
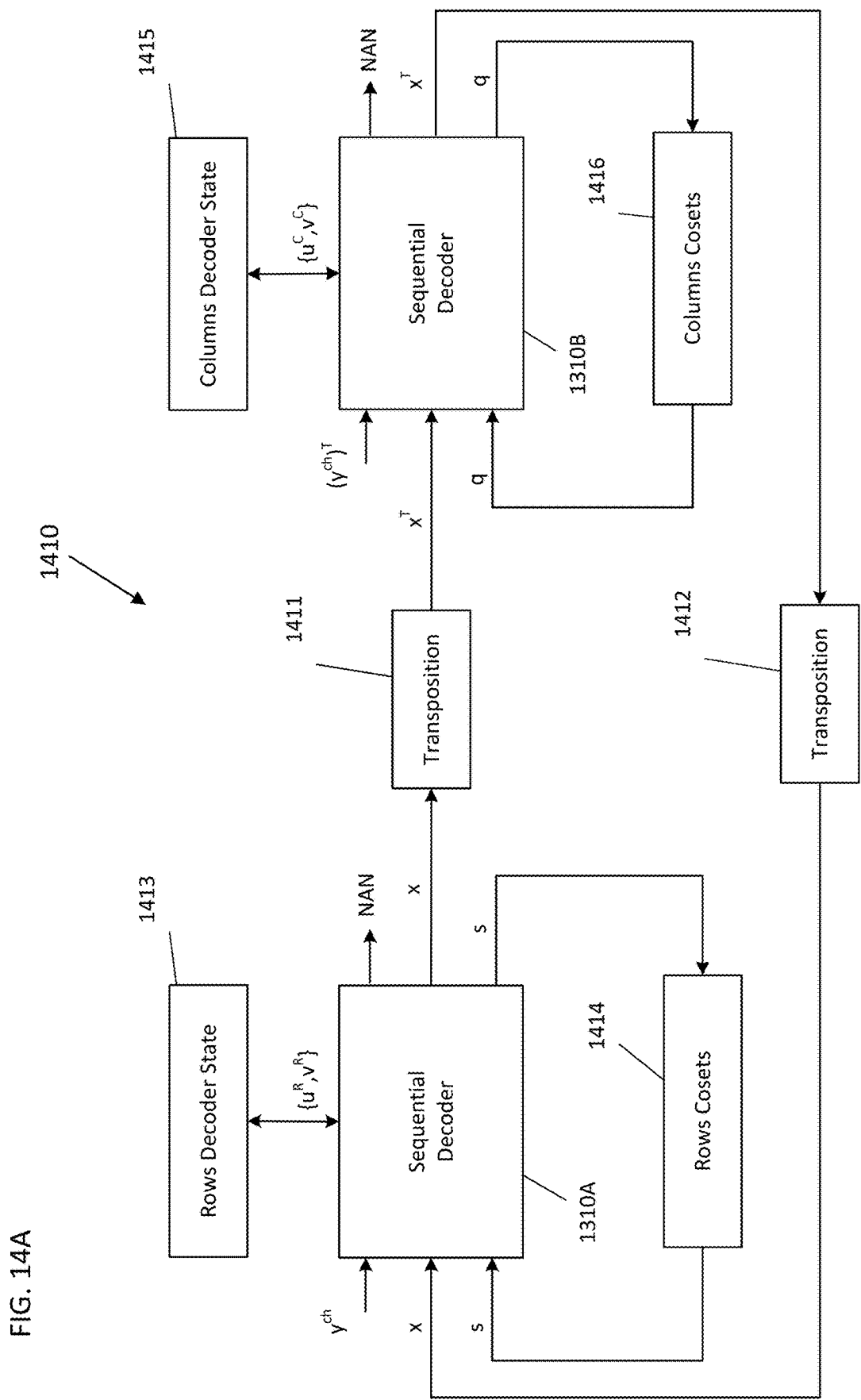
FIGS. 14A-14B are block diagrams of iterative 2D-GCC decoders, according to embodiments.
Figure 14B:
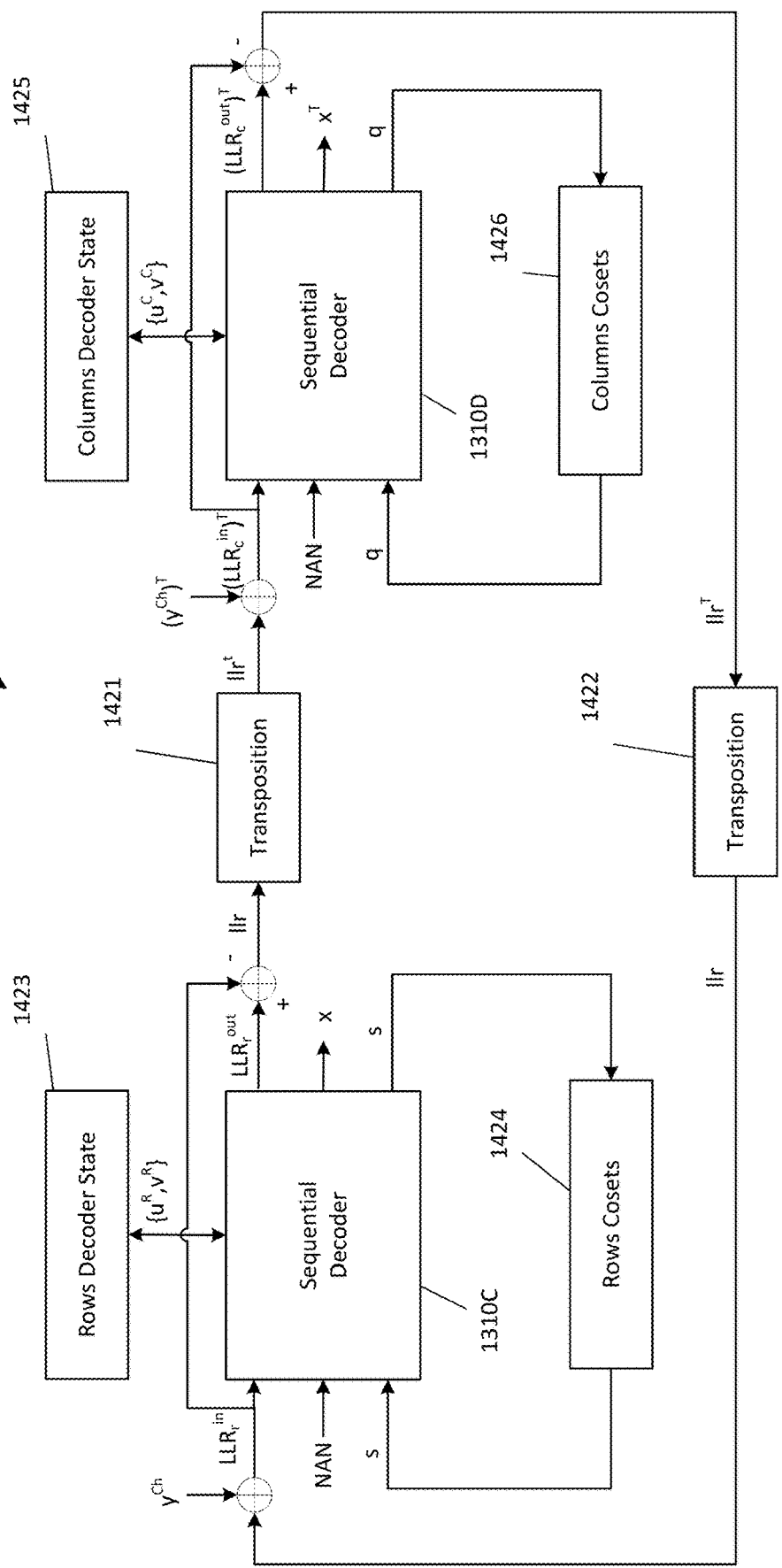

FIG. 14A illustrates an example of a 2D-GCC iterative decoder which uses the modified GCC sequential decoder to perform soft-in hard-out (SIHO) decoding, and FIG. 14B illustrates an example of a 2D-GCC iterative decoder which uses the modified GCC sequential decoder to perform soft-in soft-out (SISO) decoding.

As shown in FIG. 14A, an iterative decoder 1410 may include a sequential decoder 1310A, a sequential decoder 1310B, a transposition module 1411, and a transposition module 1412.

In embodiments, each of the sequential decoder 1310A and the sequential decoder 1310B may correspond to the sequential decoder 1310 discussed above. For example, the sequential decoder 1310A may be an example of the sequential decoder 1310 applied according to a rows perspective of the 2D-GCC code, and the sequential decoder 1310B may be an example of the sequential decoder 1310 applied according to a columns perspective of the 2D-GCC code. The sequential decoder 1310A may generate and update a row decoder state 1413 (which may be denoted {uR, vR}) and rows cosets 1414, and the sequential decoder 1310A may generate and update a column decoder state 1415 (which may be denoted {uc, vc}) and columns cosets 1416.

In embodiments, the input to the iterative decoder 1410 may be the channel LLR $y^{Ch}$, which may be a R×C real matrix, and the output of the iterative decoder 1410 may be the code word x, which may be an R×C binary matrix. Accordingly, the iterative decoder 1410 may be a SIHO decoder. Therefore, the coset BCH encoder 1312 included in each of the sequential decoder 1310A and the sequential decoder 1310B may be a SIHO BCH encoder.

In embodiments, the sequential decoder 1310A and the sequential decoder 1310B may operate on the rows and columns iteratively, and may pass their intermediate information, for example the current partly decoded codeword x (e.g., the decoded BCH codewords 1313) and the transform space (e.g., the transform space 1315) to each other after each iteration. In embodiments, the transposition modules 1411 and 1412 may be used to transpose the current partly decoded codeword x so that it may be processed appropriately. For example, the sequential decoder 1310A may be configured to perform sequential decoding on a codeword x, and the sequential decoder 1310B may be configured to perform sequential decoding on a transposed codeword $x^T$.

For example, the iterative decoder 1410 may begin a first iteration of the 2D-GCC decoding by providing the input noisy codeword to the sequential decoder 1310A, which may perform GCC decoding from the rows perspective according to process 1330 until the GCC decoding fails. Then the intermediate information generated by the sequential decoder 1310A may be passed to the sequential decoder 1310B, which may begin another iteration by perform GCC decoding from the columns perspective (e.g., on the transposed codeword x") according to process 1330 until the GCC decoding fails, in which case the intermediate information generated by the sequential decoder 1310B may be passed to the sequential decoder 1310A to begin another iteration. This may continue until the 2D-GCC codeword is fully decoded, or until the 2D-GCC decoding fails.

In some embodiments, the sequential decoders 1310A and 1310B may be implemented as a single sequential decoder 1310, and the transposition modules 1411 and 1412 may be implemented as a single transposition module, but embodiments are not limited thereto.

As shown in FIG. 14B, an iterative decoder 1420 may include a sequential decoder 1310C, a sequential decoder 1310D, a transposition module 1421, and a transposition module 1422.

In embodiments, each of the sequential decoder 1310C and the sequential decoder 1310D may correspond to the sequential decoder 1310 discussed above. For example, the sequential decoder 1310C may be an example of the sequential decoder 1310 applied according to a rows perspective of the 2D-GCC code, and the sequential decoder 1310D may be an example of the sequential decoder 1310 applied according to a columns perspective of the 2D-GCC code. The sequential decoder 1310C may generate and update a row decoder state 1423 (which may be denoted $\{u^R, v^R\}$) and rows cosets 1424, and the sequential decoder 1310C may generate and update a column decoder state 1425 (which may be denoted $\{u^c, v^c\}$) and column cosets 1426.

In embodiments, the input to the iterative decoder 1420 may be the channel LLR $y^{Ch}$, which may be a R×C real matrix, and the output of the iterative decoder 1420 may be the codeword x, an R×C binary matrix. However, the decoded codeword x (or the transposed codeword $x^T$) may not be passed between the sequential decoder 1310C and the sequential decoder 1310D. Instead, the sequential decoder 1310C and the sequential decoder 1310D may use a turbo message passing scheme to pass LLR values llr and $llr^T$ between each other. Accordingly, the iterative decoder 1420 may be a SISO decoder. Therefore, the coset BCH encoder 1312 included in each of the sequential decoder 1310C and the sequential decoder 1310D may be a SISO BCH encoder.

In embodiments, the LLR values 11r may be determined based on the row input LLRs $LLR_r^{in}$ provided to the sequential decoder 1310C and the output row LLRs $LLR_r^{out}$ generated by the sequential decoder 1310C as shown in FIG. 14B. In embodiments, the LLR values $llr^T$ may be determined based on the input column LLRs $LLR_c^{in}$ provided to the sequential decoder 1310D and the output column LLRs $LLR_c^{out}$ generated by the sequential decoder 1310D as shown in FIG. 14B.

In embodiments, the sequential decoder 1310C and the sequential decoder 1310D may operate on the rows and columns iteratively, and may pass their intermediate information, for example the LLR values llr and $llr^T$ and the transform space (e.g., the transform space 1315) to each other after each iteration. In embodiments, the transposition modules 1421 and 1422 may be used to transpose the LLR values llr and $llr^T$ so that they may be processed appropriately. For example, the sequential decoder 1310C may be configured to perform sequential decoding on the LLR values llr, and the sequential decoder 1310D may be configured to perform sequential decoding on the transposed LLR values $llr^T$.

For example, the iterative decoder 1420 may begin a first iteration of the 2D-GCC decoding by providing the input noisy codeword to the sequential decoder 1310C, which may perform GCC decoding from the rows perspective according to process 1330 until the GCC decoding fails. Then the intermediate information generated by the sequential decoder 1310C may be passed to the sequential decoder 1310D, which may begin another iteration by perform GCC decoding from the columns perspective according to process 1330 until the GCC decoding fails, in which case the intermediate information generated by the sequential decoder 1310D may be passed to the sequential decoder 1310C to begin another iteration. This may continue until the 2D-GCC codeword is fully decoded, or until the 2D-GCC decoding fails.

In some embodiments, the sequential decoders 1310C and 1310D may be implemented as a single sequential decoder 1310, and the transposition modules 1421 and 1422 may be implemented as a single transposition module, but embodiments are not limited thereto.

Figure 15A:
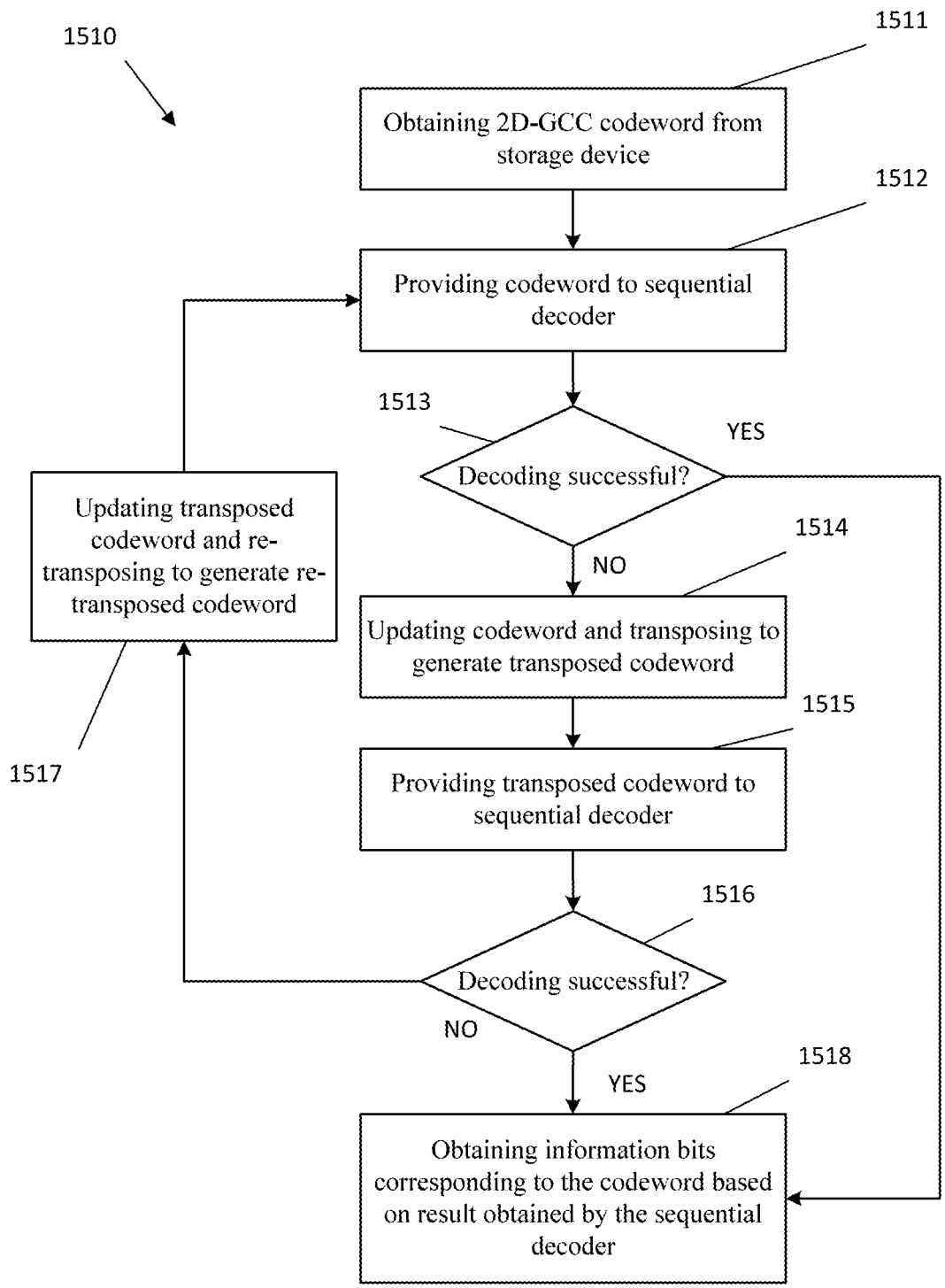
FIGS. 15A-15B are a flowcharts of processes for controlling a storage system, according to embodiments.

FIG. 15A is a flowchart of a process for controlling a storage system, according to embodiments. According to embodiments, the process 1510 may be performed using one or more of the elements described above, for example the storage device 200 discussed above with respect to FIG. 2A, the ECC encoding circuit 510 discussed above with respect to FIG. 2B, the ECC encoder module 822 discussed above with respect to FIG. 8, the sequential decoder 1310 discussed above with respect to FIG. 13A, the iterative decoders 1410 and 1420 discussed above with respect to FIGS. 14A-14B, or any other element.

As shown in FIG. 15A, at operation 1511, the process 1510 may include obtaining a 2D-GCC codeword from the storage device.

As further shown in FIG. 15A, at operation 1512, the process 1510 may include providing the codeword to a sequential decoder. In some embodiments, the transposed codeword may be provided to a first sequential decoder included in the sequential decoder, and the first sequential decoder may correspond to one or more of the sequential decoders 1310, 1310A, and 1310C discussed above.

As further shown in FIG. 15A, at operation 1513, the process 1510 may include determining whether the sequential decoder has succeeded. Based on determining that the sequential decoder has not succeeded (NO at operation 1513), for example based on detecting a failure by the sequential decoder, the process 1510 may proceed to operation 1514, which may include updating the codeword and transposing the updated codeword to obtain a transposed codeword. Based on determining that the sequential decoder has succeeded (YES at operation 1513), the process 1510 may proceed to operation 1518, at which the information bits corresponding to the codeword may be obtained.

As further shown in FIG. 15A, at operation 1515, the process 1510 may include providing the transposed codeword to the sequential decoder. In some embodiments, the transposed codeword may be provided to a second sequential decoder included in the sequential decoder, and the second sequential decoder may correspond to one or more of the sequential decoders 1310, 1310B, and 1310D discussed above.

As further shown in FIG. 15A, at operation 1516, the process 1510 may include determining whether the sequential decoder has succeeded. Based on determining that the sequential decoder has not succeeded (NO at operation 1516), for example based on detecting a failure by the sequential decoder, the process 1510 may proceed to operation 1517, which may include updating the transposed codeword, and re-transposing the updated transposed codeword to obtain a re-transposed codeword. Then, the process 1510 may return to operation 1512, to begin another iteration of the 2D-GCC decoding. Based on determining that the sequential decoder has succeeded (YES at operation 1516), the process 1510 may proceed to operation 1518, at which the information bits corresponding to the codeword may be obtained.

In embodiments, the 2D-GCC codeword may be encoded based on a 2D-GCC code, which may be based on a BCH code and a GRS code.

In embodiments, first GRS syndromes generated by the first sequential decoder based on the codeword may be equal to second GRS syndromes generated by the second sequential decoder based on the transposed codeword.

In embodiments, the process 1510 may further include decoding, using the first sequential decoder, one or more rows of a plurality of rows included in the codeword based on a first code; transforming each row of the plurality of rows included in the codeword to obtain a transformed codeword; and decoding, using the first sequential decoder, one or more columns of a plurality of columns included in the transformed codeword based on a second code. In embodiments, this may correspond to one or more operations of the process 1330 applied from a rows perspective.

In embodiments, the process 1510 may further include decoding, using the second sequential decoder, one or more rows of a plurality of rows included in the transposed codeword based on a first code; transforming each row of the plurality of rows to obtain a transformed transposed codeword; and decoding, using the second sequential decoder, one or more columns of a plurality of columns included in the transformed transposed codeword based on a second code. In embodiments, this may correspond to one or more operations of the process 1330 applied from a columns perspective.

In embodiments, at least one of the sequential decoder, the first sequential decoder, and the second sequential decoder may include SIHO decoder or a SISO decoder.

Figure 15B:
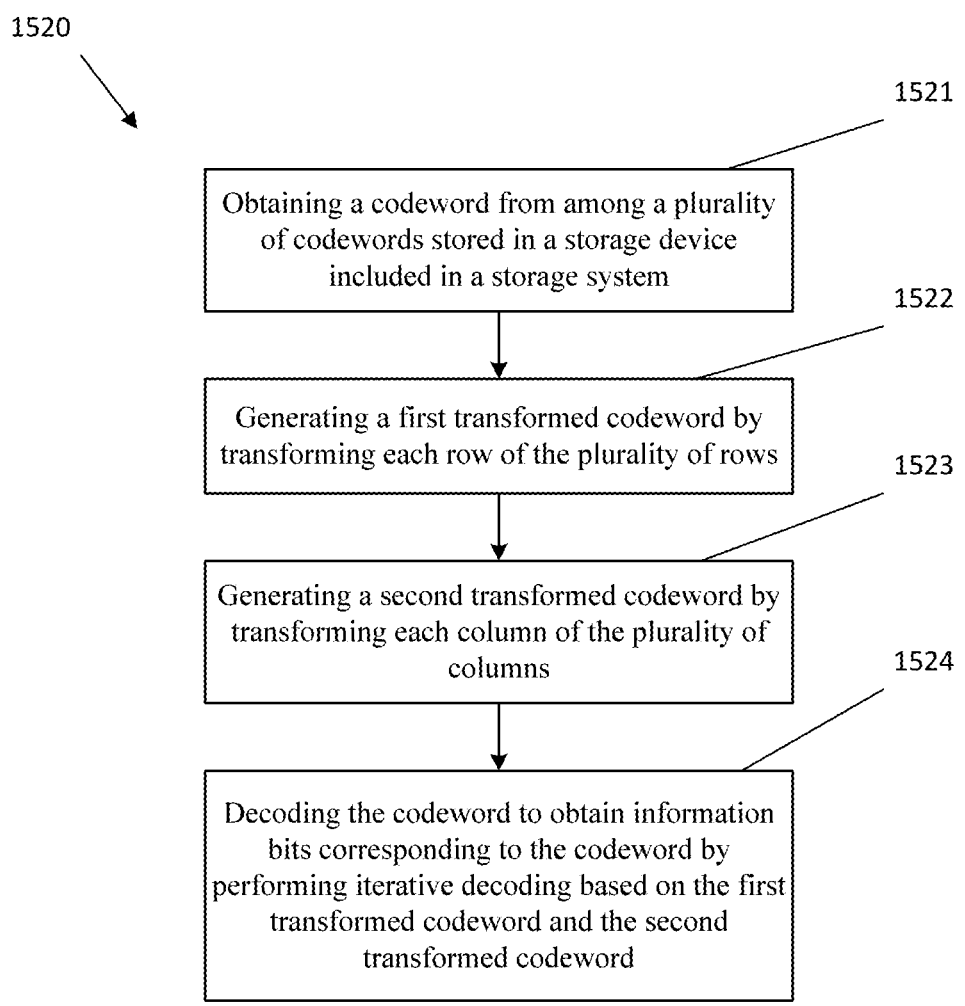

FIG. 15B is a flowchart of a process for controlling a storage system, according to embodiments. According to embodiments, the process 1520 may be performed using one or more of the elements described above, for example the storage device 200 discussed above with respect to FIG. 2A, the ECC encoding circuit 510 discussed above with respect to FIG. 2B, the ECC encoder module 822 discussed above with respect to FIG. 8, the sequential decoder 1310 discussed above with respect to FIG. 13A, the iterative decoders 1410 and 1420 discussed above with respect to FIGS. 14A-14B, or any other element.

As shown in FIG. 15B, at operation 1521, the process 1520 may include obtaining a codeword from among a plurality of codewords stored in a storage device included in the storage system. In embodiments, the codeword may include a plurality of rows and a plurality of columns.

As further shown in FIG. 15B, at operation 1522, the process 1520 may include generating a first transformed codeword by transforming each row of the plurality of rows. In embodiments, the first transformed codeword may include a plurality of first transformed rows and a plurality of first transformed columns. In embodiments, the first transformed codeword may correspond to the rows cosets illustrated in FIG. 12A.

As further shown in FIG. 15B, at operation 1523, the process 1520 may include generating a second transformed codeword by transforming each column of the plurality of columns. In embodiments, the second transformed codeword may include a plurality of second transformed rows and a plurality of second transformed columns. In embodiments, the second transformed codeword may correspond to the columns cosets illustrated in FIG. 12B.

As further shown in FIG. 15B, at operation 1524, the process 1520 may include decoding the codeword to obtain information bits corresponding to the codeword by performing iterative decoding on the first transformed codeword and the second transformed codeword.

In embodiments, the iterative decoding may include performing a first decoding operation on one or more rows of the plurality of rows, and update the first transformed codeword based on a result of the first decoding operation; and performing a second decoding operation on one or more first transformed columns of the plurality of first transformed columns.

In embodiments, the iterative decoding may further include performing a third decoding operation on one or more columns of the plurality of columns, and update the second transformed codeword based on a result of the third decoding operation; and performing a fourth decoding operation on one or more second transformed rows of the plurality of second transformed rows.

In embodiments, the codeword may be encoded based on a 2D-GCC code which may be based on a BCH code and a GRS code.

In embodiments, the plurality of rows may correspond to a plurality of first BCH codewords, and the plurality of columns may correspond to a plurality of second BCH codewords. The plurality of first transformed columns may correspond to a plurality of first GRS codewords, the plurality of second transformed rows correspond to a plurality of second GRS codewords. The plurality of first GRS codewords may be used to calculate the first plurality of syndromes, and wherein the plurality of second GRS codewords may be used to calculate the second plurality of syndromes. In embodiments, this may correspond to the arrangement shown in FIG. 12C.

Figure 16:
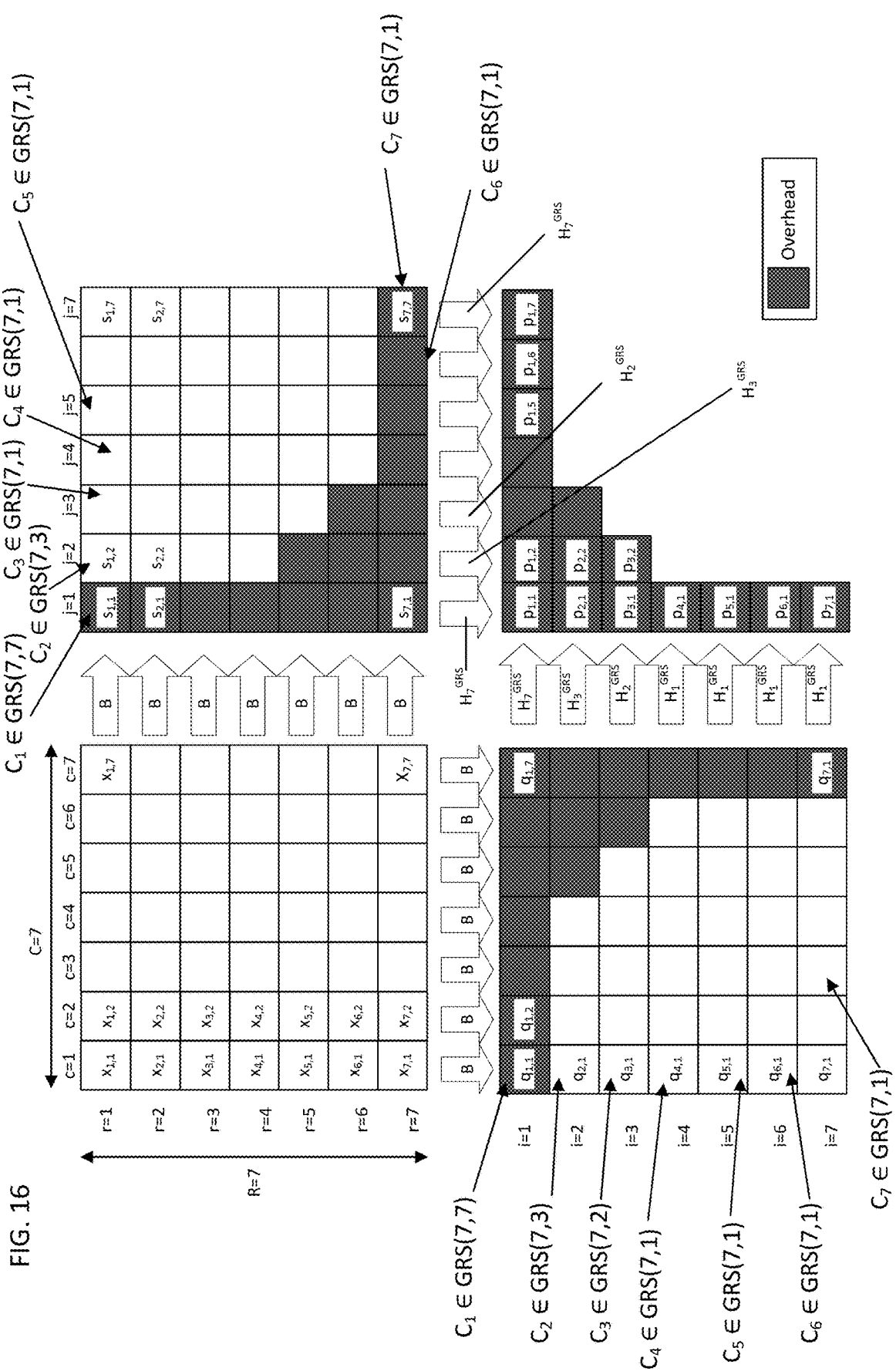
FIG. 16 illustrates an example of 2D-GCC code structure corresponding to an example decoding process, according to embodiments.

FIG. 16 shows an example code structure of a 2D-GCC S-BCH code, according to embodiments. The code structure shown in FIG. 16 may be used to illustrate an example 2D-GCC decoding process as discussed below.

In embodiments, the 2D-GCC S-BCH code structure illustrated in FIG. 16 may have a row code which may be defined as GCC(R=7, M=7, C=7, $\{F_j\}_{j=1}^{7}$, B, GRS($\alpha$, v)), where F=[7,3,2,1,1,1,1]. The equivalent column code may be defined as GCC(R=7, M=7, C=7, {Q,17=1, B, GRS(a, v)), where Q= [7,3,2,1,1,1,1].

According to a 2D-GCC S-BCH decoding example, a binary input vector according to Equation 51 below may be provided to the iterative decoder 1410 illustrated in FIG. 14A.

$$y = x \oplus e \qquad \text{(Equation 51)}$$

In Equation 51, e may represent a 7×7 error matrix indiciating errors corresponding to the 2D-GCC S-BCH decoding example. At the beginning of the 2D-GCC S-BCH decoding example, the matrix e may be expressed according to Equation 52 below.

$$e = \begin{bmatrix} 0 & 0 & 0 & 0 & 0 & 0 & 1 \\ 0 & 0 & 1 & 0 & 0 & 0 & 0 \\ 0 & 1 & 0 & 0 & 0 & 0 & 0 \\ 0 & 0 & 0 & 1 & 1 & 0 & 0 \\ 1 & 1 & 1 & 1 & 0 & 0 & 0 \\ 1 & 1 & 1 & 0 & 0 & 1 & 0 \\ 1 & 0 & 0 & 0 & 0 & 1 & 0 \end{bmatrix} \quad \text{(Equation 52)}$$

The BCH decoding status $u^R$ from the rows perspective, the RS decoding status $v^R$ from the rows perspective, the BCH decoding status $u^c$ from the columns perspective, and the RS decoding status vc from the columns perspective may be initialized according to Equations 53 through 56 below:

$$u^R = [0000000] \quad \text{(Equation 53)}$$

$$v^R = [0000000] \quad \text{(Equation 54)}$$

$$u^c = [0000000] \quad \text{(Equation 55)}$$

$$v^c = [0000000] \quad \text{(Equation 56)}$$

The transform space symbols $s_{r,j}$ from the rows perspective and the transform space symbols $q_{i,c}$ from the columns perspective may be initialized according to Equations 57 and 58 below:

$$s_{r,j} = E, r \in [7], j \in [7] \quad \text{(Equation 57)}$$

$$q_{i,c} = E, i \in [7], c \in [7] \quad \text{(Equation 58)}$$

The iterative decoder 1410 may begin the 2D-GCC S-BCH decoding process at iteration 0, which may be a row-type iteration. This may be a degenerated iteration because F1=R.

At j=0, the BCH decoder included in the sequential decoder 1310A are degenerated and all successful. Accordingly, $\{s_{r,1}\}_{r=1}^{7}$ and $v_1^R = 1$.

At j=1, the BCH decoder included in the sequential decoder 1310A may be applied to rows r=[1,2,3,4,5,6,7] with t=1 as $[u, x_r] = \text{Dec}_{BCH}(y_r, [s_{r,1}])$. Rows 1, 2, 3 may be decoded successfully because they include one error. As a result, for r=1,2,3: u?=1 and $\{s_{r,j}\}_{j=1}^{7} = B \cdot x_r$.

At j=2, the RS decoder included in the sequential decoder 1310A may fail, because there are four erasures and $F_2 = 3$.

Therefore, the resulting error matrix e may be expressed according to Equation 59 below:

$$e = \begin{bmatrix} \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ 0 & 0 & 0 & 1 & 1 & 0 & 0 \\ 1 & 1 & 1 & 1 & 0 & 0 & 0 \\ 1 & 1 & 1 & 0 & 0 & 1 & 0 \\ 1 & 0 & 0 & 0 & 0 & 1 & 0 \end{bmatrix} \quad \text{(Equation 59)}$$

In Equation 59 and the following Equations, the symbol "$\phi$" is used to indicate rows and columns that have been successfully decoded. The iterative decoder 1410 may then proceed to iteration 1, which may be a column-type iteration. This may be a degenerated iteration because $Q_1 = C$. At j=0 the BCH decoders included in the sequential decoder 1310B are all successful. As a result, $\{q_{1,c}\}_{c=1}^{7} = 0$, $v_1^c = 1$.

At j=1, the BCH decoder included in the sequential decoder 1310B may be applied to columns c=[1,2,3,4,5,6,7] with t=1, as $[u, x^7] = \text{Dec}_{BCH}(y_c^T, [q_{1,c}])$. Columns 5 and 7 may be decoded successfully because they include one error and zero errors, respectively. As a result, for c=5,7: $u_c^C = 1$ and $\{q_{i,c}\} = 1 = B \cdot x\}$.

At j=2 the RS decoder included in the sequential decoder 1310B may fail, because there are five erasures and $Q_2 = 3$ Therefore, the resulting error matrix e may be expressed according to Equation 60 below:

$$e = \begin{bmatrix} \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ 0 & 0 & 0 & 1 & \phi & 0 & \phi \\ 1 & 1 & 1 & 1 & \phi & 0 & \phi \\ 1 & 1 & 1 & 0 & \phi & 1 & \phi \\ 1 & 0 & 0 & 0 & \phi & 1 & \phi \end{bmatrix} \quad \text{(Equation 60)}$$

The iterative decoder 1410 may then proceed to iteration 2, which may be a row-type iteration. At j=1, the BCH decoder included in the sequential decoder 1310A may be applied to rows r=[4,5,6,7] with t=1, as $[u,x] = \text{Dec}_{BCH}(y_r, [s_{r,1}])$. Row 4 may be decoded successfully, because it includes one error. As a result, $u_4^R = 1$ and $\{s_{r=4,j}\} = B$.

Therefore, the resulting error matrix e may be expressed according to Equation 61 below:

$$e = \begin{bmatrix} \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ 1 & 1 & 1 & 1 & \phi & 0 & \phi \\ 1 & 1 & 1 & 0 & \phi & 1 & \phi \\ 1 & 0 & 0 & 0 & \phi & 1 & \phi \end{bmatrix} \quad \text{(Equation 61)}$$

At j=2, the RS decoder included in the sequential decoder 1310A may be applied as $[v_2, \{s_{r,2}\}_{r=1}^{7}, \{u_r^R\}_{r=1}^{7}] = \text{Dec}_{RS}(\{s_{r,2}\}_{r=1}^{7}, F_2=3)$. Notice $\{s_{r,2}\}_{r=1}^{7} = [s_{1,2}\ s_{2,2}s_{3,2}s_{4,2}\text{E E E}]$. Because $F_2 = 3$, the RS decoder included in the sequential decoder 1310A may be successful, and $v_2^R = 1$, $\{s_{r,2}\}_{r=1}^{7}$ may be reproduced (and not change in $u^R$).

The BCH decoder included in the sequential decoder 1310A may be applied to rows r=[5,6,7] with t=2 as $[u, x] = \text{Dec}_{BCH}(y_r, [s_{r,1}, s_{r,2}])$. Row 7 may be decoded successfully because it include 2 errors. As a result, $u_7^R = 1$ and $\{s_{7,j}\}_{j=1}^{7} = B \cdot x_7$.

Therefore, the resulting error matrix e may be expressed according to Equation 62 below:

$$e = \begin{bmatrix} \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ 1 & 1 & 1 & 1 & 0 & 0 & 0 \\ 1 & 1 & 1 & 0 & 0 & 1 & 0 \\ \phi & \phi & \phi & \phi & \phi & \phi & \phi \end{bmatrix} \quad \text{(Equation 62)}$$

At j=3, RS decoder included in the sequential decoder 1310A may be applied as $[v_3, \{s_{r,3}\}_{r=1}^{7}, \{u_r^R\}_{r=1}^{7}] = \text{DecRs}(\{s_{r,3}\}_{3=1}^{7}, F_3=2)$. Notice $\{s_{r,3}\}_{r=1} = [s_{1,3}\ s_{2,3}\ s_{3,3}\ s_{4,3}\ \text{E E}\ s_{7,3}]$. Because $F_3 = 2$, the RS decoder included in the sequential decoder 1310A may be successful, and $v_3^R=1$, $\{s_{r,3}\}_{3=1}^7$ may be reproduced (and not change in $u^R$).

The BCH decoder included in the sequential decoder 1310A BCH decoder may be applied to rows r=[5,6] with t=3 as [u, x]=$\text{Dec}_{BCH}(y_r, [s_{r,1}, s_{r,2}, s_{r,3}])$. The BCH decoding may fail because the number of errors may be greater than 3.

The iterative decoder 1410 may then proceed to iteration 3, which may be a column-type iteration.

At j=1, the BCH decoder included in the sequential decoder 1310B may be applied to columns c= [1,2,3,4,6] with t=1, as [u, $x_c^T$]=$\text{Dec}_{BCH}(y_c^T, [q_{1c}])$. Columns 4,6 are decoded successfully. As a result, c=4,6: $u_c^C=1$ and $\{q_{i,c}\}_{i=1}^7 = B \cdot x_c^T$.

Therefore, the resulting error matrix e may be expressed according to Equation 63 below:

$$E = \begin{bmatrix} \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ 1 & 1 & 1 & \phi & \phi & \phi & \phi \\ 1 & 1 & 1 & \phi & \phi & \phi & \phi \\ \phi & \phi & \phi & \phi & \phi & \phi & \phi \end{bmatrix}$$ (Equation 63)

At j=2, the RS decoder included in the sequential decoder 1310B may be applied as $[v_2, \{q_{2,c}\}_{c=1}^7, \{u_c^C\}_{c=1}^7]=\text{Dec}_{RS}\{q_{2,c}\}_{c=1}^7, F_2=3)$. Notice $\{q_{2,c}\}_{c=1}^7=[E\ E\ E\ q_{2,4}\ q_{2,5}\ q_{2,6}\ q_{2,7}]$.

Because $F_2=3$, RS decoder may be successful, and $v_2^c=1$, $\{q_{2,c}\}_{c=1}^7$ may be reproduced (and not change in $u^c$).

The BCH decoder included in the sequential decoder 1310B may be applied to columns c=[1,2,3] with t=2, as [u, $x_c^T$]=$\text{Dec}_{BCH}(y_c^T, [q_{1,c}, q_{2,c}])$. The BCH decoding may succeed for all columns c=1,2,3, because there are two errors in each. As a result, for c=1,2,3: $u_c^C=1$, which may indicate that the included in the sequential decoder 1310B is successful.

Therefore, the resulting error matrix e may be clean as shown in Equation 64 below, and the iterative decoder 1410 may successfully complete the 2D-GCC S-BCH decoding.

$$e = \begin{bmatrix} \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ \phi & \phi & \phi & \phi & \phi & \phi & \phi \\ \phi & \phi & \phi & \phi & \phi & \phi & \phi \end{bmatrix}$$ (Equation 64)

Figure 17:
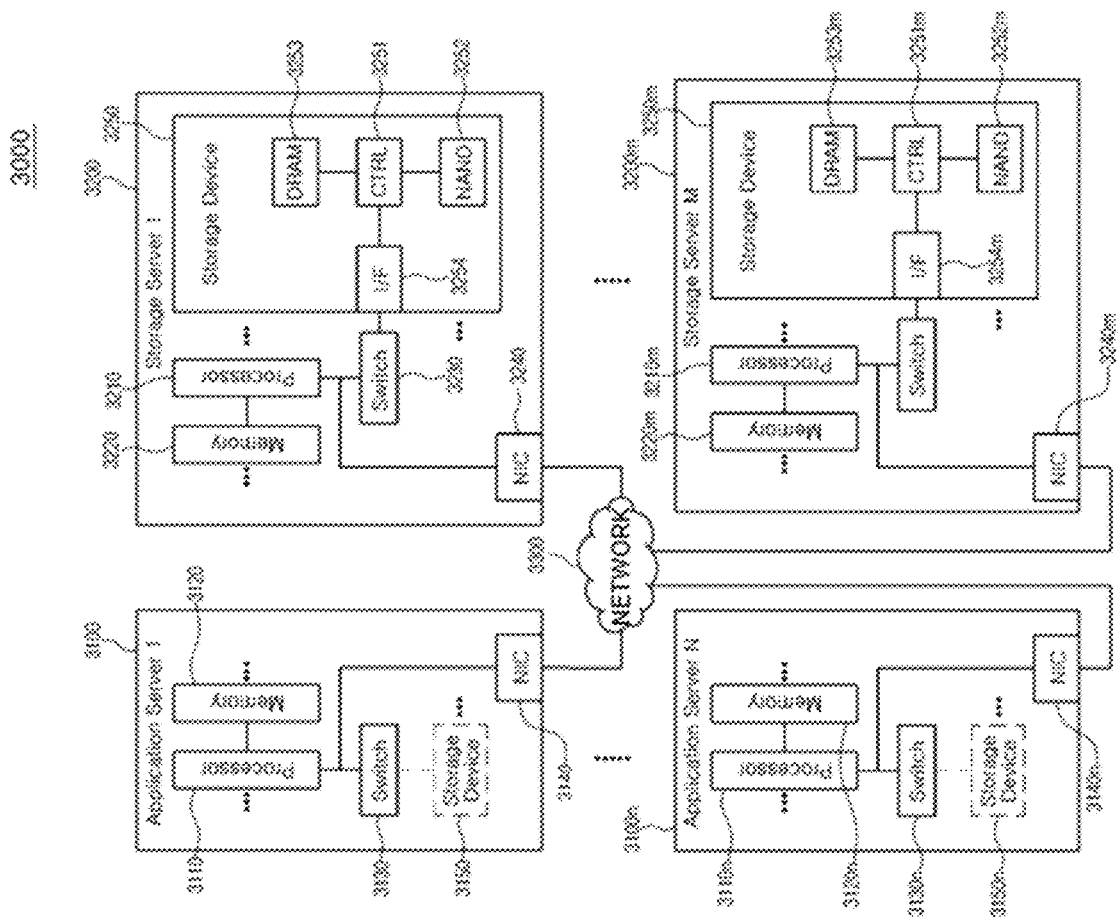
FIG. 17 is a block diagram of data center, according to embodiments.

FIG. 17 is a diagram of a data center 3000 to which a memory device is applied, according to embodiments.

Referring to FIG. 17, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100*n* and storage servers 3200 to 3200*m*. The number of application servers 3100 to 3100*n* and the number of storage servers 3200 to 3200*m* may be variously selected according to embodiments. The number of application servers 3100 to 3100*n* may be different from the number of storage servers 3200 to 3200*m*.

The application server 3100 or the storage server 3200 may include at least one of processors 3110 and 3210 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In embodiments, the processor 3210 and the memory 3220 may provide a processor-memory pair. In embodiments, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include a storage device 3150. The storage server 3200 may include at least one storage device 3250. The number of storage devices 3250 included in the storage server 3200 may be variously selected according to embodiments.

The application servers 3100 to 3100*n* may communicate with the storage servers 3200 to 3200*m* through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200*m* may be provided as file storages, block storages, or object storages according to an access method of the network 3300.

In embodiments, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCOE), network attached storage (NAS), and NVMe over Fabrics (NVMe-oF).

Hereinafter, the application server 3100 and the storage server 3200 will mainly be described. A description of the application server 3100 may be applied to another application server 3100*n*, and a description of the storage server 3200 may be applied to another storage server 3200*m*.

The application server 3100 may store data, which is requested by a user or a client to be stored, in one of the storage servers 3200 to 3200*m* through the network 3300. Also, the application server 3100 may obtain data, which is requested by the user or the client to be read, from one of the storage servers 3200 to 3200*m* through the network 3300. For example, the application server 3100 may be implemented as a web server or a database management system (DBMS).

The application server 3100 may access a memory 3120*n* or a storage device 3150*n*, which is included in another application server 3100*n*, through the network 3300. Alternatively, the application server 3100 may access memories 3220 to 3220*m* or storage devices 3250 to 3250*m*, which are included in the storage servers 3200 to 3200*m*, through the network 3300. Thus, the application server 3100 may perform various operations on data stored in application servers 3100 to 3100n and/or the storage servers 3200 to 3200m. For example, the application server 3100 may execute an instruction for moving or copying data between the application servers 3100 to 3100n and/or the storage servers 3200 to 3200m. In this case, the data may be moved from the storage devices 3250 to 3250m of the storage servers 3200 to 3200m to the memories 3120 to 3120n of the application servers 3100 to 3100n directly or through the memories 3220 to 3220m of the storage servers 3200 to 3200m. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC(Network InterConnect) 3240. The switch 3230 may selectively connect the processor 3210 to the storage device 3250 or selectively connect the NIC 3240 to the storage device 3250 via the control of the processor 3210.

In embodiments, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In embodiments, the NIC 3240 may be integrated with at least one of the processor 3210, the switch 3230, and the storage device 3250.

In the storage servers 3200 to 3200m or the application servers 3100 to 3100n, a processor may transmit a command to storage devices 3150 to 3150n and 3250 to 3250m or the memories 3120 to 3120n and 3220 to 3220m and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150n and 3250 to 3250m may transmit a control signal and a command/address signal to NAND flash memory devices 3252 to 3252m in response to a read command received from the processor. Thus, when data is read from the NAND flash memory devices 3252 to 3252m, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In embodiments, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210m of another storage server 3200m, or the processors 3110 and 3110n of the application servers 3100 and 3100n. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of example embodiments and is not to be construed as limiting thereof. Although a few example embodiments have been described, those skilled in the art will readily appreciate that many modifications are possible in the embodiments without materially departing from the present scope.

What is claimed is:

1. A storage system, comprising:
a storage device configured to store a plurality of codewords;
a sequential decoder; and
at least one processor configured to:
obtain a two-dimensional (2D) generalized concatenated code (GCC) codeword from the storage device,
provide the codeword to the sequential decoder,
based on detecting a first failure by the sequential decoder, update the codeword and transpose the updated codeword to obtain a transposed codeword,
provide the transposed codeword to the sequential decoder, and
obtain information bits corresponding to the codeword based on a result obtained by the sequential decoder.

2. The storage system of claim 1, wherein the 2D-GCC codeword is encoded based on a 2D-GCC code, and
wherein the 2D-GCC code comprises a Bose-Chaudhuri-Hocquenghem (BCH) code and a generalized Reed-Solomon (GRS) code.

3. The storage system of claim 2, wherein first GRS syndromes generated by the sequential decoder based on the codeword are equal to second GRS syndromes generated by the sequential decoder based on the transposed codeword.

4. The storage system of claim 1, wherein the sequential decoder comprises a first sequential decoder and a second sequential decoder, and
wherein to decode the codeword, the first sequential decoder is configured to:
decode one or more rows of a plurality of rows included in the codeword based on a first code;
transform each row of the plurality of rows included in the codeword to obtain a transformed codeword; and
decode one or more columns of a plurality of columns included in the transformed codeword based on a second code.

5. The storage system of claim 1, wherein the sequential decoder comprises a first sequential decoder and a second sequential decoder, and
wherein to decode the transposed codeword, the second sequential decoder is configured to:
decode one or more rows of a plurality of rows included in the transposed codeword based on a first code;
transform each row of the plurality of rows to obtain a transformed transposed codeword; and
decode one or more columns of a plurality of columns included in the transformed transposed codeword based on a second code.

6. The storage system of claim 1, wherein the at least one processor is further configured to:
based on detecting a second failure by the sequential decoder, update the transposed codeword, and transpose the updated transposed codeword to obtain a re-transposed codeword;
provide the re-transposed codeword to the sequential decoder; and
obtain the information bits based on a new result obtained by the sequential decoder.

7. The storage system of claim 1, wherein the sequential decoder comprises a soft-in, hard-out (SIHO) decoder.

8. The storage system of claim 1, wherein the sequential decoder comprises a soft-in, soft-out (SISO) decoder.

9. A device for managing data stored in a storage device, the device comprising:
a memory interface configured to communicate with the storage device; and
at least one processor configured to:
obtain a codeword from among a plurality of codewords stored in the storage device, wherein the codeword comprises a plurality of rows and a plurality of columns,
generate a first transformed codeword by transforming each row of the plurality of rows, wherein the first transformed codeword comprises a plurality of first transformed rows and a plurality of first transformed columns,
generate a second transformed codeword by transforming each column of the plurality of columns, wherein the second transformed codeword comprises a plurality of second transformed rows and a plurality of second transformed columns, and
decode the codeword to obtain information bits corresponding to the codeword, by performing iterative decoding based on the first transformed codeword and the second transformed codeword,
wherein after the codeword is decoded, a first plurality of syndromes calculated based on the plurality of first transformed columns is equal to a second plurality of syndromes calculated based on the plurality of second transformed rows.

10. The device of claim 9, wherein to perform the iterative decoding, the at least one processor is further configured to:
perform a first decoding operation on one or more rows of the plurality of rows, and update the first transformed codeword based on a result of the first decoding operation; and
perform a second decoding operation on one or more first transformed columns of the plurality of first transformed columns.

11. The device of claim 10, wherein to perform the iterative decoding, the at least one processor is further configured to:
perform a third decoding operation on one or more columns of the plurality of columns, and update the second transformed codeword based on a result of the third decoding operation; and
perform a fourth decoding operation on one or more second transformed rows of the plurality of second transformed rows.

12. The device of claim 9, wherein the codeword is encoded based on a two-dimensional (2D) generalized concatenated code (GCC) code, and
wherein the 2D-GCC code comprises a Bose-Chaudhuri-Hocquenghem (BCH) code and a generalized Reed-Solomon (GRS) code.

13. The device of claim 12, wherein the plurality of rows correspond to a plurality of first BCH codewords, and
wherein the plurality of columns correspond to a plurality of second BCH codewords.

14. The device of claim 13, wherein the plurality of first transformed columns correspond to a plurality of first GRS codewords, and
wherein the plurality of second transformed rows correspond to a plurality of second GRS codewords.

15. The device of claim 14, wherein the plurality of first GRS codewords are used to calculate the first plurality of syndromes, and wherein the plurality of second GRS codewords are used to calculate the second plurality of syndromes.

16. A method of managing data stored in a storage device, the method comprising:
   obtaining a two-dimensional (2D) generalized concatenated code (GCC) codeword from the storage device;
   providing the codeword to a sequential decoder;
   based on detecting a first failure by the sequential decoder, updating the codeword and transposing the updated codeword to obtain a transposed codeword;
   providing the transposed codeword to the sequential decoder; and
   obtaining information bits corresponding to the codeword based on a result obtained by the sequential decoder.

17. The method of claim 16, wherein the 2D-GCC codeword is encoded based on a 2D-GCC code, and
   wherein the 2D-GCC code comprises a Bose-Chaudhuri-Hocquenghem (BCH) code and a generalized Reed-Solomon (GRS) code.

18. The method of claim 17, wherein first GRS syndromes generated by the sequential decoder based on the codeword are equal to second GRS syndromes generated by the sequential decoder based on the transposed codeword.

19. The method of claim 16, wherein the sequential decoder comprises a first sequential decoder and a second sequential decoder, and
   wherein the method further comprises:
      decoding, using the first sequential decoder, one or more rows of a plurality of rows included in the codeword based on a first code;
      transforming each row of the plurality of rows included in the codeword to obtain a transformed codeword; and
      decoding, using the first sequential decoder, one or more columns of a plurality of columns included in the transformed codeword based on a second code.

20. The method of claim 16, further comprising:
   based on detecting a second failure by the sequential decoder, updating the transposed codeword and transposing the updated transposed codeword to obtain a re-transposed codeword;
   providing the re-transposed codeword to the sequential decoder; and
   decoding the codeword based on a new result obtained by the sequential decoder.

* * * * *